(12) United States Patent
Hansen

(10) Patent No.: US 11,894,253 B2
(45) Date of Patent: Feb. 6, 2024

(54) METHOD AND APPARATUS FOR SUBSTRATE ALIGNMENT

(71) Applicant: BROOKS AUTOMATION US, LLC, Chelmsford, MA (US)

(72) Inventor: Caspar Hansen, Mountain View, CA (US)

(73) Assignee: Brooks Automation US, LLC, Chelmsford, MA (US)

( * ) Notice: Subject to any disclaimer, the term of this patent is extended or adjusted under 35 U.S.C. 154(b) by 109 days.

(21) Appl. No.: 17/658,060

(22) Filed: Apr. 5, 2022

(65) Prior Publication Data

US 2022/0336247 A1  Oct. 20, 2022

Related U.S. Application Data

(63) Continuation of application No. 16/570,453, filed on Sep. 13, 2019, now Pat. No. 11,295,975.

(51) Int. Cl.

| | |
|---|---|
| *H01L 21/68* | (2006.01) |
| *B25J 9/16* | (2006.01) |
| *H01L 21/687* | (2006.01) |

(52) U.S. Cl.
CPC ......... *H01L 21/681* (2013.01); *B25J 9/1694* (2013.01); *H01L 21/68707* (2013.01)

(58) Field of Classification Search
CPC ............. H01L 21/681; H01L 21/68707; H01L 21/67259; H01L 21/68–682; H01L 21/673–67396; B25J 9/1694
See application file for complete search history.

(56) References Cited

U.S. PATENT DOCUMENTS

| 5,825,913 | A | 10/1998 | Rostami et al. |
| 6,002,840 | A * | 12/1999 | Hofmeister ....... H01L 21/67265 700/245 |
| 6,195,619 | B1 * | 2/2001 | Ren ..................... G03F 7/70791 702/155 |
| 6,244,121 | B1 * | 6/2001 | Hunter .................... G03F 7/707 73/865.9 |
| 7,639,861 | B2 | 12/2009 | Michael et al. |
| 8,162,584 | B2 | 4/2012 | Michael et al. |
| 9,831,110 | B2 | 11/2017 | Francken et al. |

(Continued)

FOREIGN PATENT DOCUMENTS

TW       201714145       4/2017

*Primary Examiner* — Jarrett J Stark
(74) *Attorney, Agent, or Firm* — Perman & Green, LLP

(57) ABSTRACT

A semiconductor wafer transport apparatus having a transport arm and at least one end effector. An optical edge detection sensor is coupled to the transport arm and is configured so as to register and effect edge detection of a wafer supported by the end effector. An illumination source illuminates a surface of the wafer and is disposed with respect to the optical edge detection sensor so that the surface directs reflected surface illumination, from the illumination source, toward the optical edge detection sensor, and optically blanks, at the peripheral edge of the wafer, background reflection light of a background, viewed by the optical edge detection sensor coincident with linear traverse of the wafer supported by the at least one end effector. The peripheral edge of the wafer is defined in relief in image contrast to effect edge detection coincident with traverse of the wafer supported by the end effector.

40 Claims, 36 Drawing Sheets

(56) References Cited

U.S. PATENT DOCUMENTS

| | | | |
|---|---|---|---|
| 2003/0111912 A1* | 6/2003 | Binnard | H01L 21/682 310/12.01 |
| 2004/0091343 A1* | 5/2004 | Astegno | H01L 21/6835 414/416.08 |
| 2009/0142163 A1* | 6/2009 | Genetti | H01L 21/67703 414/217 |
| 2012/0022827 A1* | 1/2012 | Hertgens | H01L 21/67259 702/150 |
| 2012/0038898 A1* | 2/2012 | Klaassen | G03F 7/70133 355/71 |
| 2014/0023776 A1* | 1/2014 | Kuwahara | B05C 13/00 427/8 |
| 2016/0126128 A1* | 5/2016 | Bonora | H01L 21/67173 414/222.02 |
| 2017/0018446 A1* | 1/2017 | Yin | H01L 21/68 |
| 2018/0240695 A1* | 8/2018 | Hayashi | H01L 21/681 |
| 2019/0043750 A1* | 2/2019 | Yoshida | H01L 21/681 |
| 2019/0115245 A1* | 4/2019 | Oh | H01L 21/67248 |
| 2019/0325601 A1* | 10/2019 | Chen | G06T 7/80 |
| 2021/0098274 A1* | 4/2021 | Kim | H01L 21/68707 |

* cited by examiner

| CONVENTIONAL TRANSFER TIMES |
|---|
| PICK MOLDED SUBSTRATE FROM CASSETTE |
| TRANSFER MOLDED SUBSTRATE FROM CASSETTE TO FIXED ALIGNER |
| PLACE MOLDED SUBSTRATE AT FIXED ALIGNER |
| ALIGN / READ MOLDED SUBSTRATE |
| PICK MOLDED SUBSTRATE FROM FIXED ALIGNER |
| TRANSFER MOLDED SUBSTRATE FROM FIXED ALIGNER TO HOLDING LOCATION |
| PLACE MOLDED SUBSTRATE AT HOLDING LOCATION |

| TRANSFER TIMES |
|---|
| PICK MOLDED SUBSTRATE FROM CASSETTE |
| TRANSFER MOLDED SUBSTRATE FROM CASSETTE TO HOLDING LOCATION WITH ON-THE-FLY ALIGN/READ |
| PLACE MOLDED SUBSTRATE AT HOLDING LOCATION** |

** THE HOLDING LOCATION IS ONE OR MORE OF THE CASSETTE AT THE LOAD PORT FROM WHICH THE SUBSTRATE WAS REMOVED, A DIFFERENT CASSETTE AT A DIFFERENT LOAD PORT, A LOAD LOCK, AND A PROCESS MODULE OF A BACK END OF LINE PROCESS

FIG. 11

METHOD AND APPARATUS FOR SUBSTRATE ALIGNMENT

BACKGROUND

1. Field

This application is a continuation of U.S. application Ser. No. 16/570,453, filed on Sep. 13, 2019, (Now U.S. patent application Ser. No. 11,295,975, issued on Apr. 5, 2022), the disclosure of which is incorporated herein by reference in its entirety. The exemplary embodiments generally relate to semiconductor processing apparatus, and more particularly, to semiconductor substrate alignment.

2. Brief Description of Related Developments

In semiconductor fabrication, substrates such as semiconductor wafers need to be aligned to specific orientations prior to many operations, including processing and identification tracking. Generally, substrates are aligned with rotary aligners or by imaging a backlit substrate. The rotary aligners rotate an edge of the substrate where the edge is viewed by an imaging system for identifying an outline of a notch on the substrate. Imaging of the backlit substrate also includes identifying the outline of the notch with an imaging system; however the substrate need not be rotated, as with the rotary aligner. These alignment processes work well for front end of line substrate processing but can be problematic for back end substrate processing.

In back end substrate processing, a substrate can be in the form of a molded substrate. A molded substrate is, for example, a standard substrate that has had a top or frontside of the substrate covered in epoxy in a molding process, leaving only the bottom side of the substrate visible. The molding process also fills the notch in the substrate with epoxy which prevents the rotary alignment and backlight alignment methods noted above from identifying an outline of the notch (i.e., an outline of the notch is no longer visible or can be difficult to detect).

BRIEF DESCRIPTION OF THE DRAWINGS

The foregoing aspects and other features of the disclosed embodiment are explained in the following description, taken in connection with the accompanying drawings, wherein:

FIG. 11 is a chart comparing transfer times of the processing systems of FIGS. 10A and 10B in accordance with aspects of the present disclosure;

DETAILED DESCRIPTION

Figure 1A:
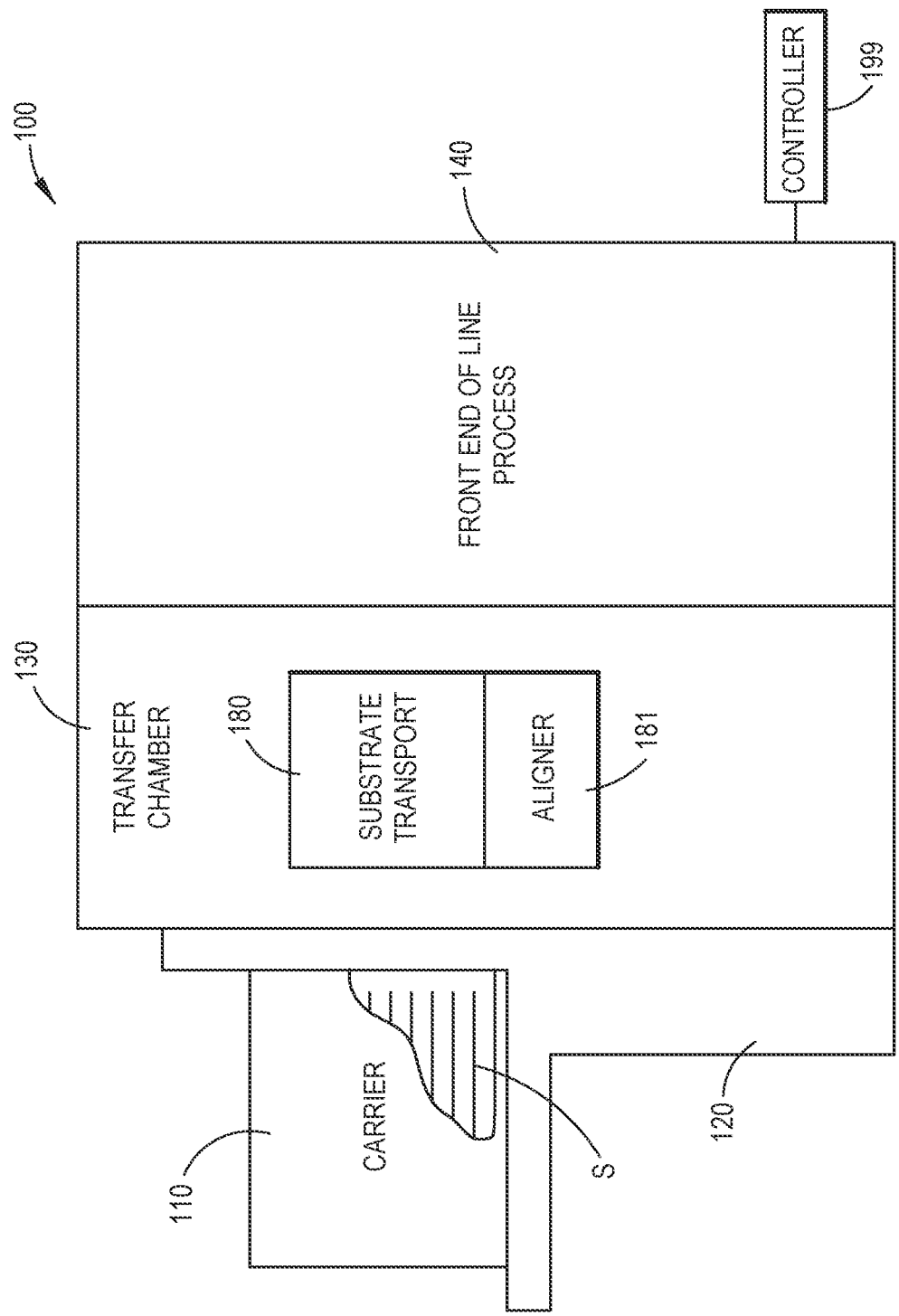
FIGS. 1A, 1B, and 1C are exemplary substrate processing systems incorporating aspects of the present disclosure.
Figure 1B:
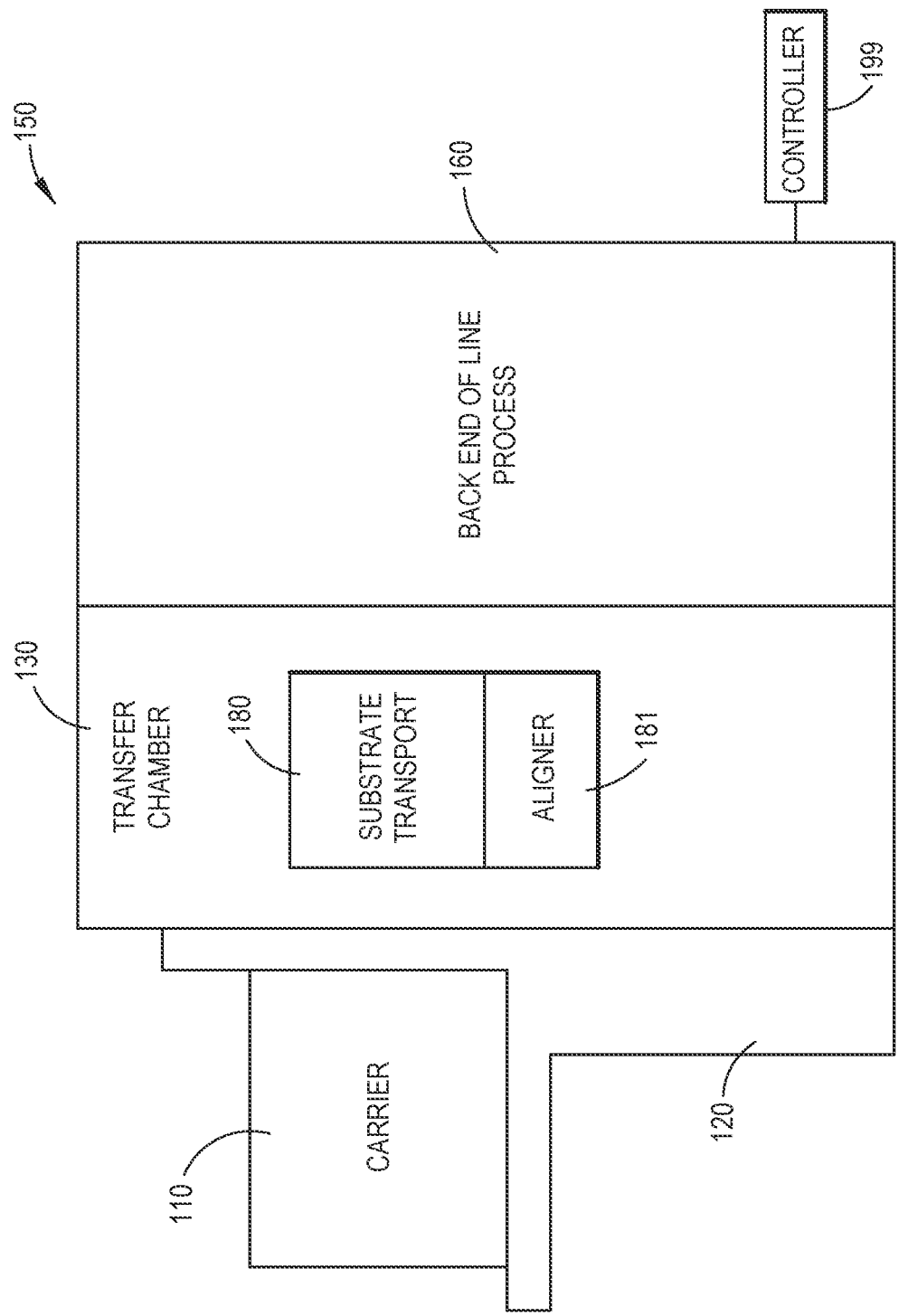
Figure 1C:
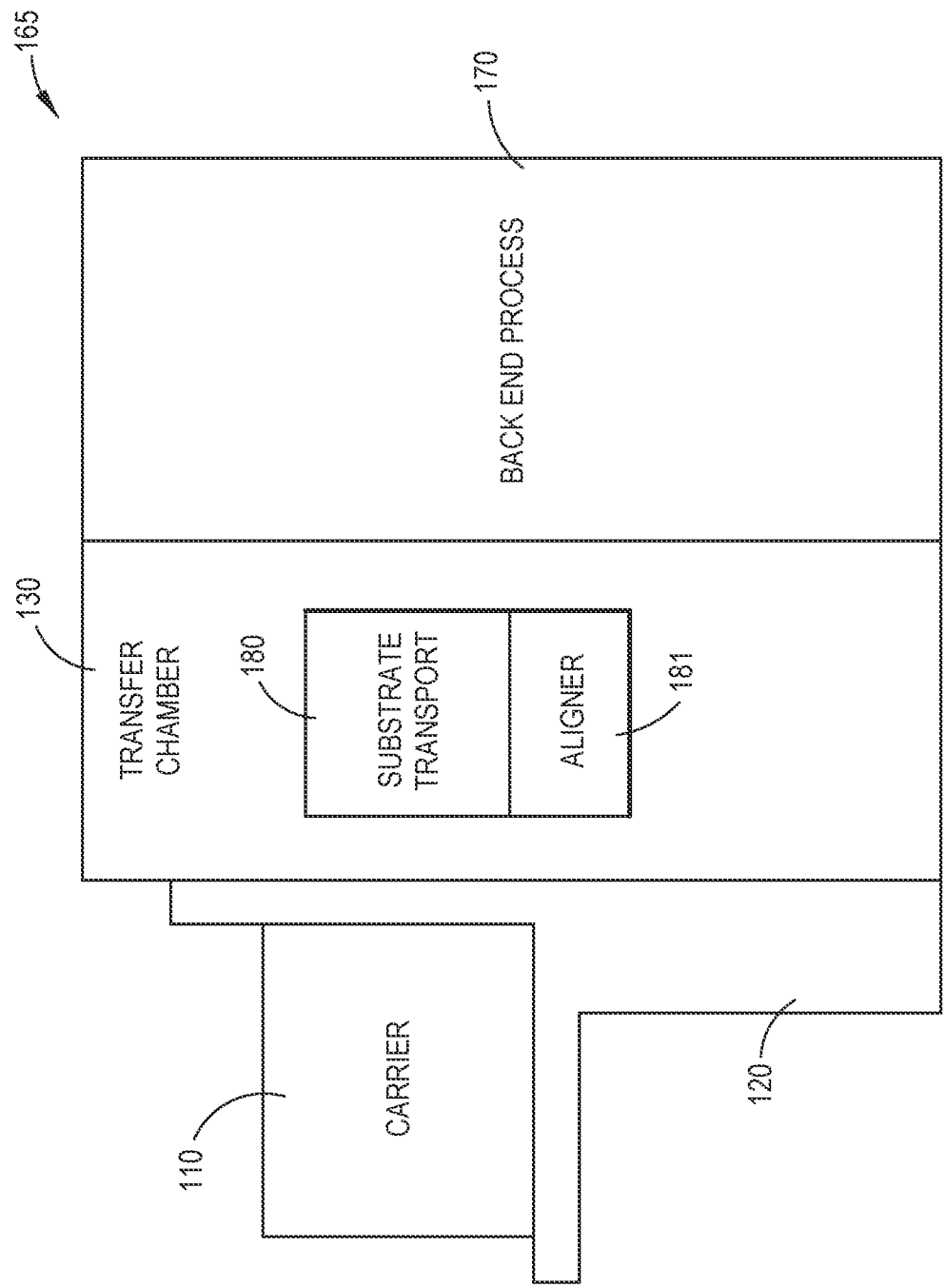

FIGS. 1A, 1B, and 1C illustrate exemplary substrate processing apparatus 100, 150, 165 in accordance with aspects of the present disclosure. Although the aspects of the present disclosure will be described with reference to the drawings, it should be understood that the aspects of the present disclosure can be embodied in many forms. In addition, any suitable size, shape or type of elements or materials could be used.

The aspects of the present disclosure provide for an apparatus and method for alignment of substrates S. The substrates S may be any suitable substrates including, but not limited to semiconductor wafers, flat panel displays, or any other suitable semiconductor substrate. The aspects of the present disclosure may also be employed in one or more semiconductor processes. For example, the aspects of the present disclosure may be employed in a front end of line process 140 (e.g., generally including thin film processes that use vacuum such as etching, chemical vapor deposition, plasma vapor deposition, implantation, metrology, rapid thermal processing, dry strip atomic layer, oxidation/diffusion, forming of nitrides, lithography, epitaxy, or other thin film processes for fabrication of individual semiconductor structures patterned in the semiconductor up to, but not including, the deposition of metal interconnect layers). The aspects of the present disclosure may be employed in a back end of line process 160 (e.g., generally associated with fabrication of metal interconnect layers of the semiconductor structures formed by the front end of line process 140 and includes any suitable processing steps after the front end of line process up to and including final passivation layer fabrication). The aspects of the present disclosure may be employed in back end process 170 (e.g., generally including substrate test, substrate backgrinding, die separation, die tests, IC (integrated circuit) packaging, and final test).

In one aspect, the present disclosure provide for an in-situ aligner on the substrate transport 180 for onboard alignment of substrates S during transport/coincident with linear traverse and/or arcuate traverse of the substrate S (i.e., on-the-fly while being carried/held by a substrate holder of a substrate transport 180), held by the substrate transport 180, from one substrate holding location to another substrate holding location. Other aspects of the present disclosure provide for a stationary substrate alignment station to which the substrate transport 180 transports substrates S for alignment.

The aspects of the present disclosure include a machine vision system that provides controlled high contrast images of at least a portion of the substrate S so as to identify a notch 350 (FIG. 3A) and/or other suitable features in the substrate regardless of whether an outline of the notch and/or other features is/are obstructed/filled by epoxy (such as a molding material 370 (FIG. 3A) used in the back end process 170) that covers a frontside surface TS of the substrate S (i.e., regardless of whether the substrate is a molded substrate). The machine vision system includes elements, such as the contrast faces described herein, that provide for a controlled (e.g., devoid of features that would otherwise obfuscate the notch 350 and/or other features) contrast image of a highly reflective surface (e.g., a bottom surface BS in the case of back end process 170 or, in the case of front end of line process 150 and back end of line process 160, e.g., either the frontside surface TS or bottom surface BS) of the substrate S so that an image of the portion of the substrate S is captured and analyzed in any suitable manner to identify a location of the notch 350 and/or other features of the substrate S. A misalignment angle and the registration shift of a center SC of the substrate S as well as the edge shape of the substrate S (e.g., including a diameter of the substrate S) may be determined in any suitable manner from the image of the portion of the substrate S and the location of the notch 350.

Referring to FIG. 1A, the substrate processing apparatus 100 includes a load port 120, a transport chamber 130, and any suitable front end of line process 140 as described above. The load port 120 is coupled to a transport chamber 130 and is configured to interface any suitable substrate carrier 110 to the transport chamber 130. The transport chamber 130 is coupled to the front end of line process 140 and includes any suitable opening and/or valves through which substrates are passed between the transport chamber 130 and the front end of line process 140. The transport chamber 130 includes substrate transport 180 configured to transfer substrates between the carrier 110 and the front end of line process 140. The carrier 110 may be any suitable carrier 110 such as a front opening carrier (illustrated in FIGS. 1A and 1B—a suitable example of which is a front opening unified pod (FOUP)) or bottom opening carrier (a suitable example of which is a standard mechanical interface (SMIF) pod). In one aspect, the carrier 110 may be substantially similar to those described in U.S. Pat. No. 9,105,673 issued on Aug. 11, 2015 (entitled "Side Opening Unified Pod"), the disclosure of which is incorporated herein by reference in its entirety. In one aspect, the transport chamber 130 has the same atmosphere (e.g., a vacuum atmosphere) as that of the front end of line process 140; while in other aspects the transport chamber has an atmospheric environment and the front end of line process 140 includes any suitable load lock for transferring substrates S between the front end of line process 140 and the transport chamber 130 without degradation of a processing atmosphere of the front end of line process 140.

Referring to FIG. 1B, the substrate processing apparatus 150 includes the load port 120, the transport chamber 130, and any suitable back end of line process 160 as described above. The load port 120 is coupled to a transport chamber 130 and is configured to interface any suitable substrate carrier 110 to the transport chamber 130. The transport chamber 130 is coupled to the back end of line process 160 and includes any suitable opening and/or valves through which substrates are passed between the transport chamber 130 and the back end of line process 160. The transport chamber 130 includes substrate transport 180 configured to transfer substrates between the carrier 110 and the back end of line process 160. The carrier 110 may be any suitable carrier 110 such as a front opening carrier (illustrated in FIGS. 1A and 1B—a suitable example of which is a front opening unified pod (FOUP)) or bottom opening carrier (a suitable example of which is a standard mechanical interface (SMIF) pod). In one aspect, the carrier 110 may be substantially similar to those described in U.S. Pat. No. 9,105,673 issued on Aug. 11, 2015 (entitled "Side Opening Unified Pod"), the disclosure of which was incorporated herein by reference in its entirety. In one aspect, the transport chamber 130 has the same atmosphere (e.g., a vacuum atmosphere) as that of the back end of line process 160; while in other aspects the transport chamber has an atmospheric environment and the back end of line process 160 includes any suitable load lock for transferring substrates S between the back end of line process 160 and the transport chamber 130 without degradation of a processing atmosphere of the back end of line process 160.

Referring to FIG. 1C, the substrate processing apparatus 165 includes the load port 120, the transport chamber 130, and any suitable back end process 170 as described above. The load port 120 is coupled to a transport chamber 130 and is configured to interface any suitable substrate carrier 110 to the transport chamber 130. The transport chamber 130 is coupled to the back end process 170 and includes any suitable opening and/or valves through which substrates are passed between the transport chamber 130 and the back end process 170. The transport chamber 130 includes substrate transport 180 configured to transfer substrates between the carrier 110 and the back end process 170. The carrier 110 may be any suitable carrier 110 such as a front opening carrier (illustrated in FIGS. 1A and 1B—a suitable example of which is a front opening unified pod (FOUP)) or bottom opening carrier (a suitable example of which is a standard mechanical interface (SMIF) pod) as noted above. In one aspect, the carrier 110 may be substantially similar to those described in U.S. Pat. No. 9,105,673 issued on Aug. 11, 2015 (entitled "Side Opening Unified Pod"), the disclosure of which was incorporated herein by reference in its entirety.

Figure 2A:
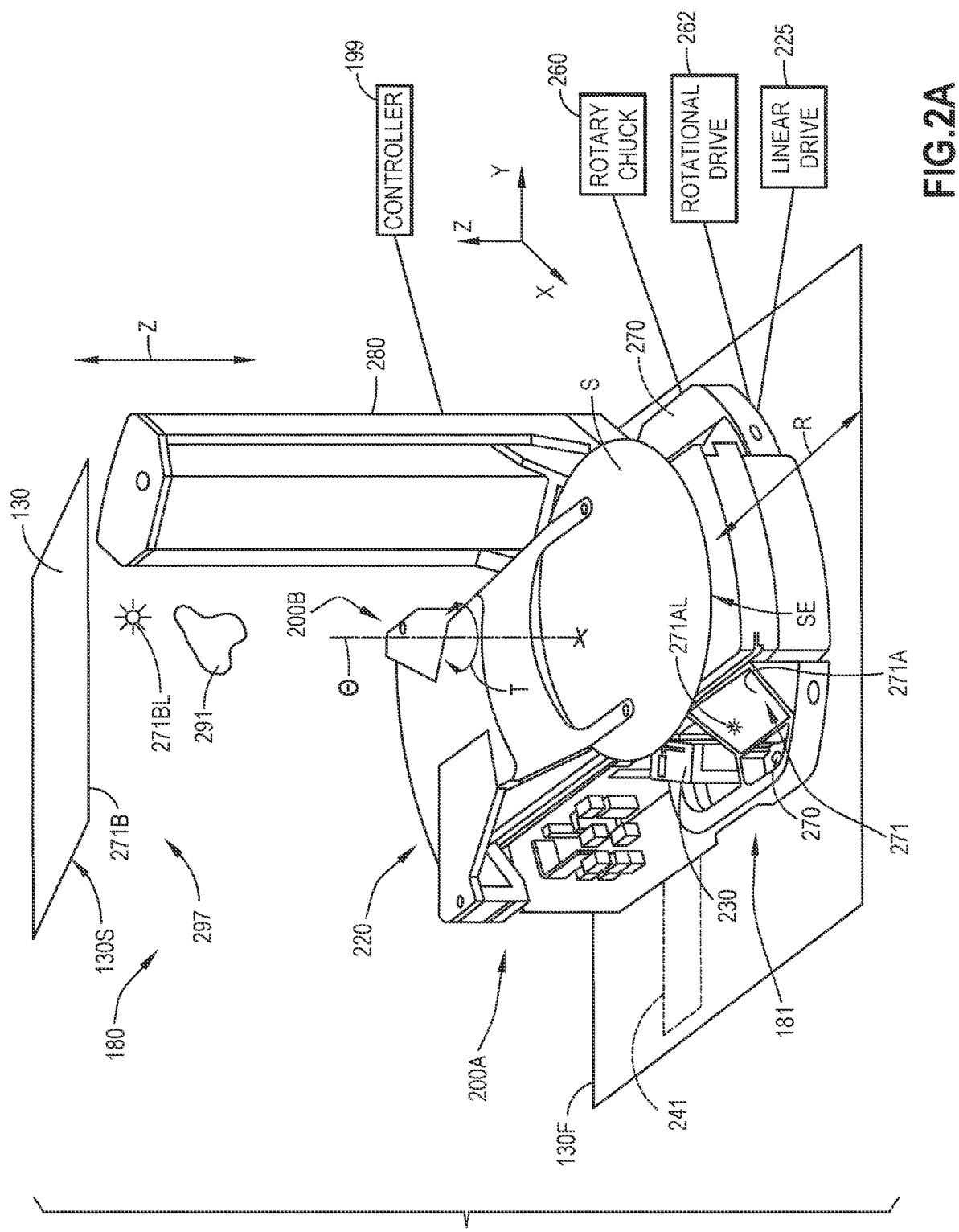
FIG. 2A is a schematic perspective illustration of a portion of a substrate transport of FIGS. 1A-1C incorporating aspects of the present disclosure.
Figure 2B:
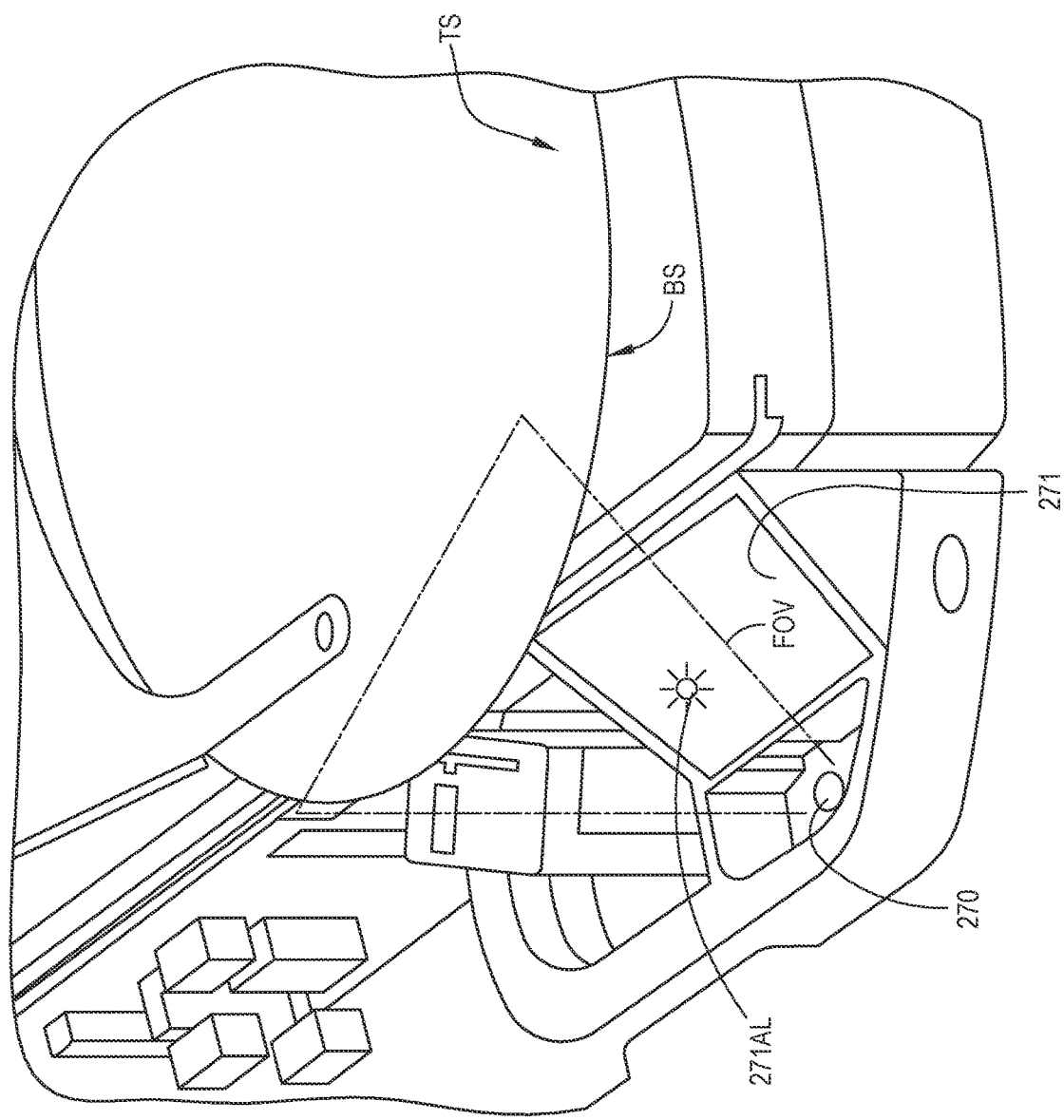
FIG. 2B is a schematic perspective illustration of a portion of the substrate transport of FIG. 2A incorporating aspects of the present disclosure.
Figure 2C:
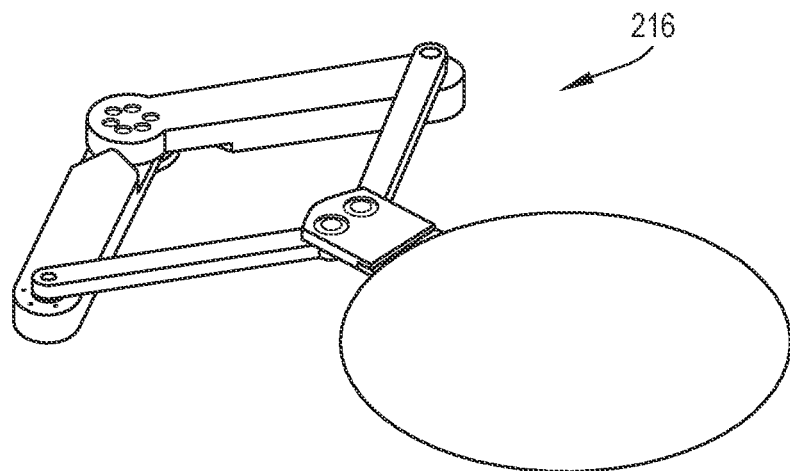
FIGS. 2C-2G are schematic illustrations of substrate transport arms in accordance with aspects of the present disclosure.
Figure 2D:
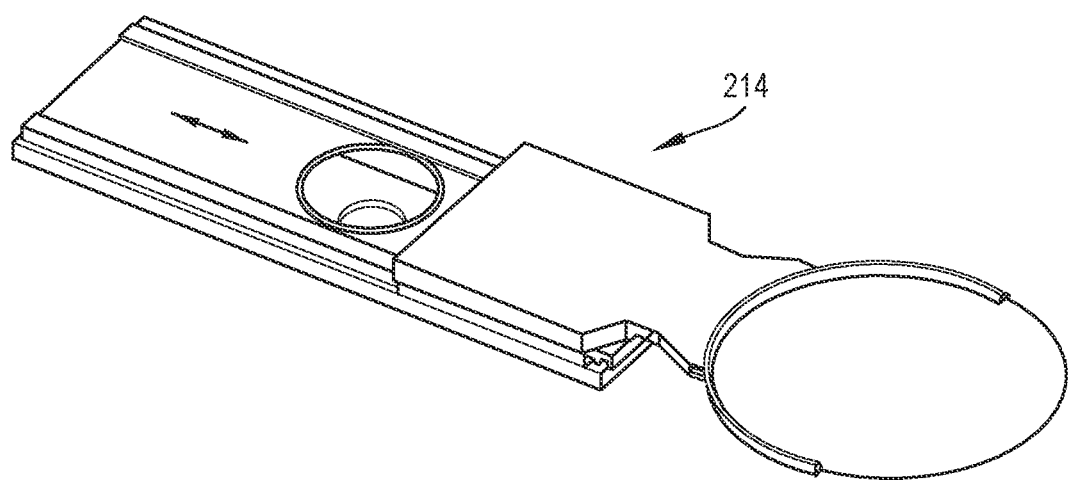
Figure 2E:
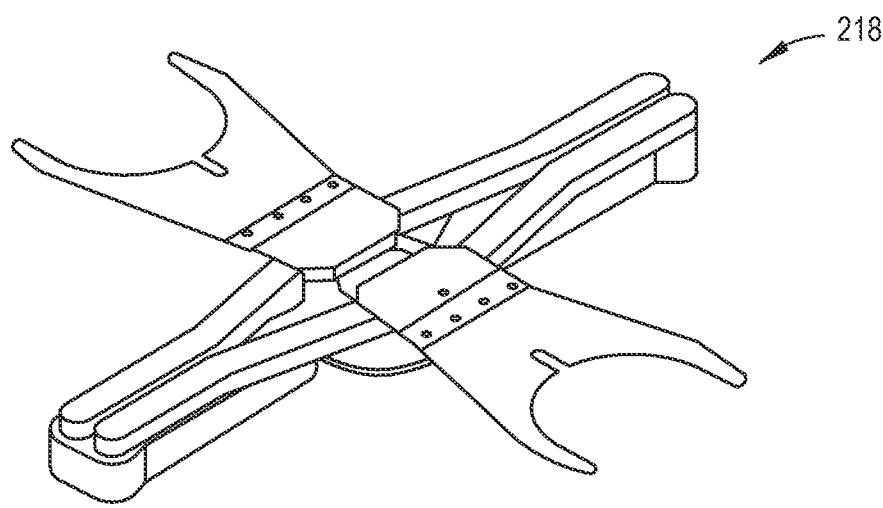
Figure 2F:
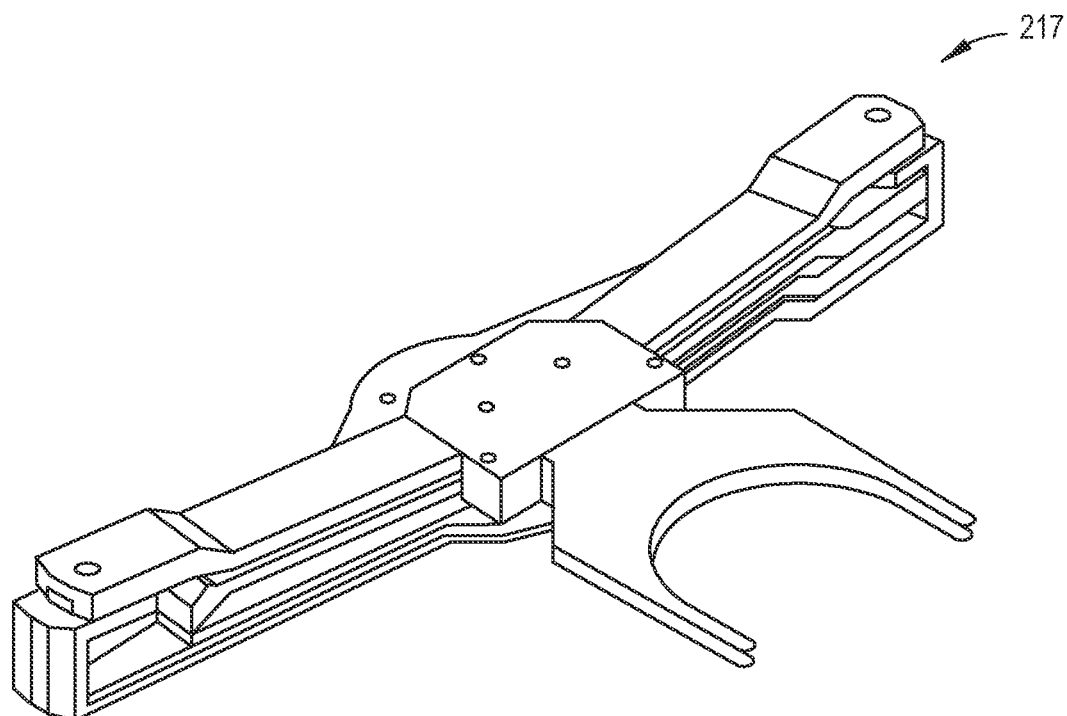
Figure 2G:
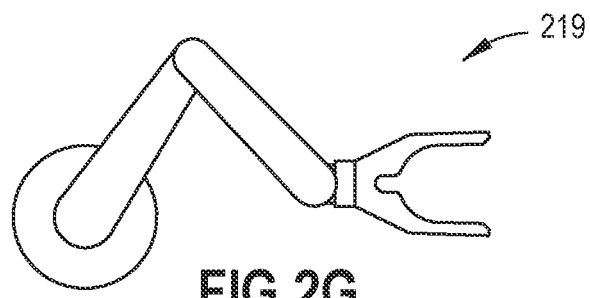
Figure 2H:
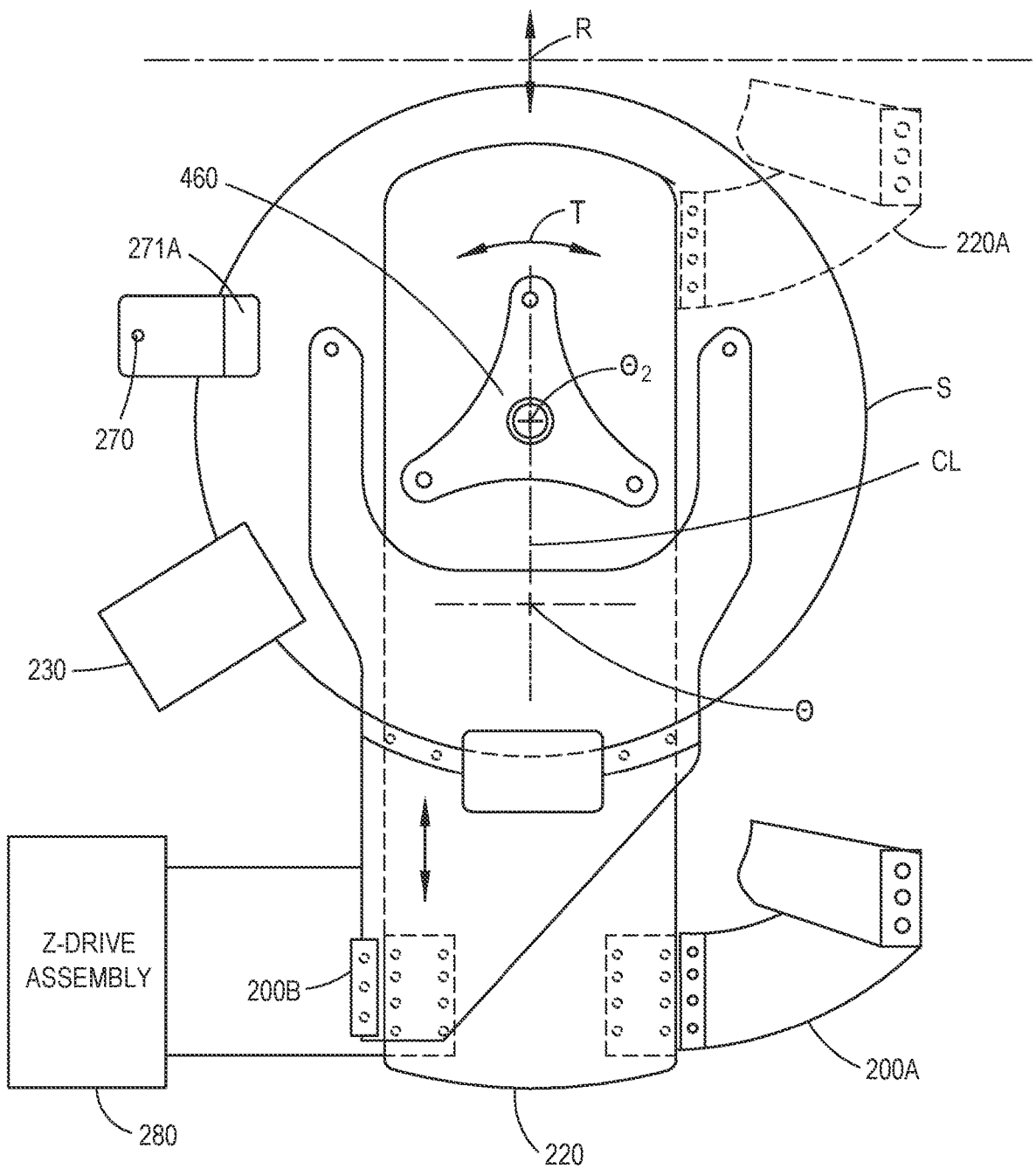
FIGS. 2H and 2I are schematic illustrations of portions of the substrate transport of FIGS. 1A-1C in accordance with aspects of the present disclosure.
Figure 2I:
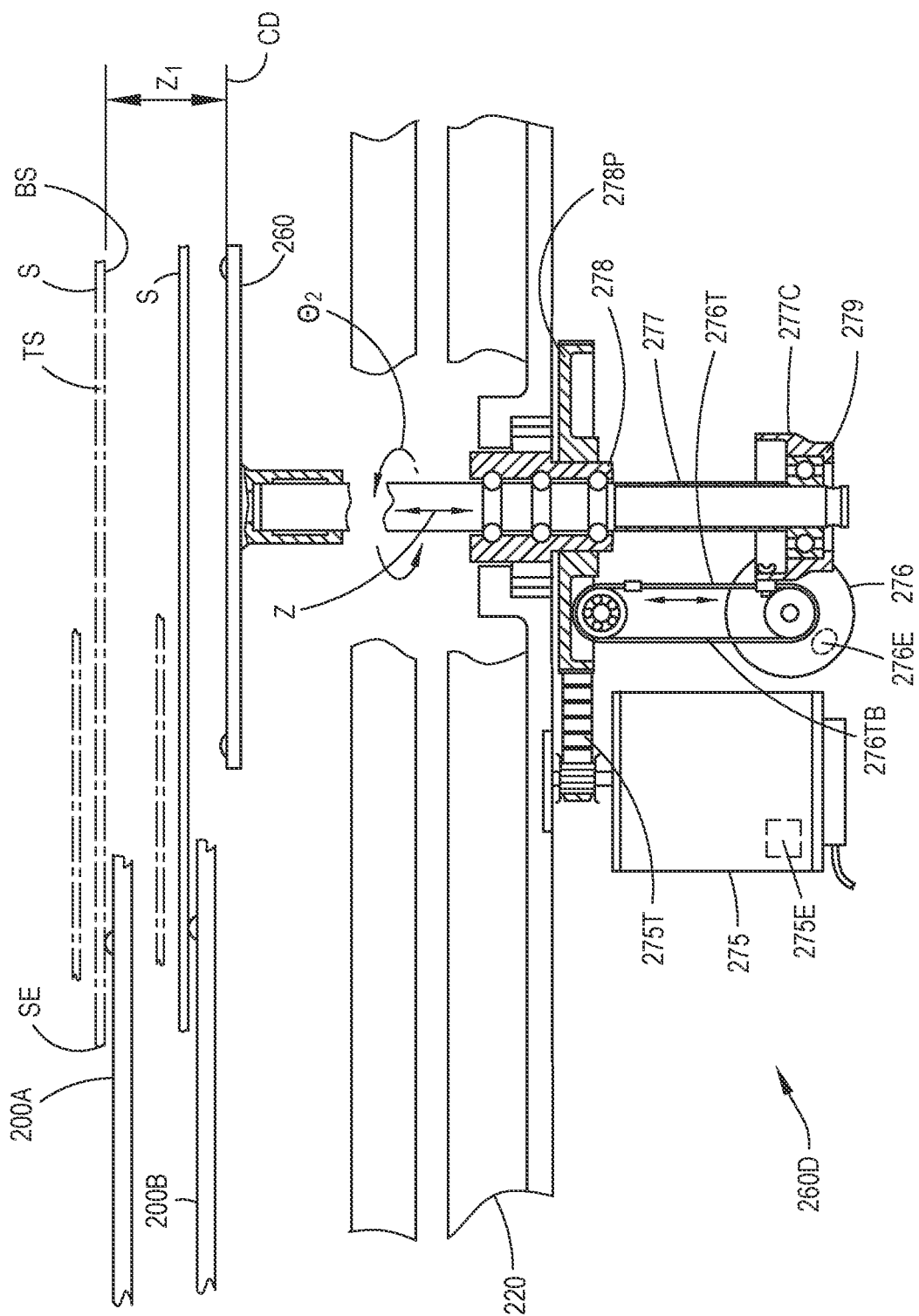
Figure 2J:
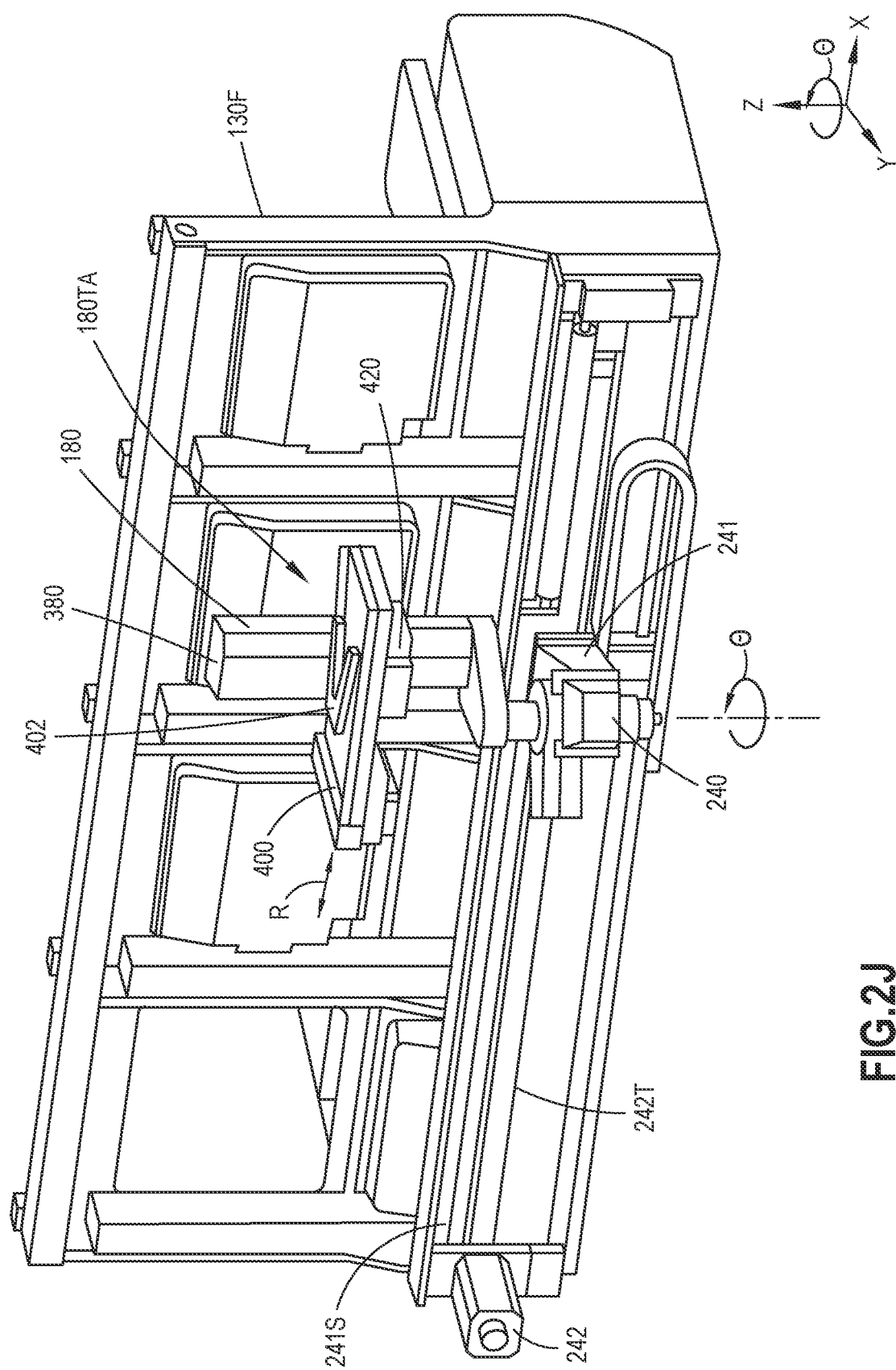
FIG. 2J is a schematic illustration of the substrate transport of FIGS. 1A-1C in accordance with aspects of the present disclosure.

Referring now to FIG. 2J the aspects of the present disclosure will be described with respect to an atmospheric transport robot 180 (referred to herein as a substrate transport) but it should be understood that the aspects of the disclosed embodiment are equally applicable to vacuum transport robots. As may be realized, the substrate transport 180 is mounted to a linear slide (as will be described in greater detail below) or a boom arm (as described in U.S. patent application Ser. No. 14/377,987 filed on Aug. 11, 2014 entitled "Substrate Processing Apparatus", the disclosure of which is incorporated herein by reference in its entirety) so as to be movable in at least the X and/or Y directions; while in other aspects the substrate transport 180 is mounted so that a base 240 of the substrate transport 180 is fixed from movement in the X and/or Y directions. The configuration shown is representative for description purposes only and the arrangement, shapes and placement of the illustrated components may be varied as desired without deviating from the scope of the invention.

As can be seen in FIG. 2J, in one aspect, the substrate transport 180 is movably mounted to a frame 130F of the transport chamber 130 or in other aspects to a frame of any suitable module of a substrate processing tool, such as a frame of a front end of line process module or a frame of a back end of line process module. In this aspect, the substrate transport 180 includes any suitable number of drive axes to move a substrate along one or more of the X, Y, Z, θ and R (substrate holder or end effector extension) axes. For example, the substrate transport 180 includes a transport arm 180TA that, in one aspect, is mounted to a carriage 241 so that the transport arm 180TA is movably mounted to the frame 130F. The carriage 241 is, in one aspect, mounted to a slide 241S so as to be movable in the X direction; while in other aspects the carriage 241 is mounted to the frame 130F so as to be fixed in the X (and/or Y direction). In one aspect any suitable drive 242 is mounted to the frame 130F and drivingly connected to the carriage 241 by any suitable transmission 242T for moving the base 240 in the X direction. In this aspect the transmission 242T is a belt and pulley transmission and the drive 242 is a rotary drive but in other aspects the drive 242 is a linear actuator that is drivingly connected to the carriage 241 with any suitable transmission or without a transmission (e.g. such as where the carriage includes a drive portion of the linear actuator).

Referring also to FIG. 2A, the substrate transport 180 is illustrated in accordance with aspects of the present disclosure. The substrate transport 180 includes any suitable transport arm(s) 180TA, such as for example, a linear slide transport arm 214 as shown in FIG. 2D or any other suitable arm having any suitable arm linkage mechanisms (such as those illustrated in FIGS. 2C-2F). Suitable examples of arm linkage mechanisms can be found in, for example, U.S. Pat. No. 7,578,649 issued Aug. 25, 2009; U.S. Pat. No. 5,794,487 issued Aug. 18, 1998; U.S. Pat. No. 7,946,800 issued May 24, 2011; U.S. Pat. No. 6,485,250 issued Nov. 26, 2002; U.S. Pat. No. 7,891,935 issued Feb. 22, 2011; U.S. Pat. No. 8,419,341 issued Apr. 16, 2013; and U.S. patent application Ser. No. 13/293,717 entitled "Dual Arm Robot" and filed on Nov. 10, 2011; U.S. patent application Ser. No. 13/861,693 entitled "Linear Vacuum Robot with Z Motion and Articulated Arm" and filed on Sep. 5, 2013; U.S. Pat. No. 7,648,327 issued on Jan. 19, 2010 (entitled "Wafer Engine"); U.S. patent application Ser. No. 16/257,595 filed on Jan. 25, 2019 (entitled "Automatic Wafer Centering Method and Apparatus"); and U.S. patent application Ser. No. 14/928,352 filed on Oct. 30, 2015 (entitled "Wafer Aligner"), the disclosures of which are all incorporated by reference herein in their entireties.

In aspects of the disclosed embodiment, the at least one transfer arm 180TA may be or be derived from a conventional SCARA (selective compliant articulated robot arm) type design (see SCARA arm 219 in FIG. 2G), which includes an upper arm, a band-driven forearm and a band-constrained end-effector, or from a telescoping arm or any other suitable arm design, such as a Cartesian linearly sliding arm (see, e.g., FIG. 2A), wherein any such design configuration also includes a slide body 220, aligner 181 and substrate holder(s) 200A, 200B as described further herein. For example in one aspect the slide body 220 is mounted to an arm link of any suitable articulated transport arm. Suitable examples of transport arms can be found in, for example, U.S. patent application Ser. No. 12/117,415 entitled "Substrate Transport Apparatus with Multiple Movable Arms Utilizing a Mechanical Switch Mechanism" filed on May 8, 2008 and U.S. Pat. No. 7,648,327 issued on Jan. 19, 2010, the disclosures of which are incorporated by reference herein in their entireties. The operation of the transfer arms may be independent from each other (e.g. the extension/retraction of each arm is independent from other arms), may be operated through a lost motion switch or may be operably linked in any suitable way such that the arms share at least one common drive axis. In still other aspects the transport arms may have any other desired arrangement such as a frog-leg arm 216 (FIG. 2C) configuration, a leap frog arm 217 (FIG. 2F) configuration, a bi-symmetric arm 218 (FIG. 2E) configuration, etc. Suitable examples of transport arms can be found in U.S. Pat. No. 6,231,297 issued May 15, 2001; U.S. Pat. No. 5,180,276 issued Jan. 19, 1993; U.S. Pat. No. 6,464,448 issued Oct. 15, 2002; U.S. Pat. No. 6,224,319 issued May 1, 2001; U.S. Pat. No. 5,447,409 issued Sep. 5, 1995; U.S. Pat. No. 7,578,649 issued Aug. 25, 2009; U.S. Pat. No. 5,794,487 issued Aug. 18, 1998; U.S. Pat. No. 7,946,800 issued May 24, 2011; U.S. Pat. No. 6,485,250 issued Nov. 26, 2002; U.S. Pat. No. 7,891,935 issued Feb. 22, 2011; U.S. patent application Ser. No. 16/257,595 filed on Jan. 25, 2019 (entitled "Automatic Wafer Centering Method and Apparatus"); U.S. patent application Ser. No. 13/293,717 filed on Nov. 10, 2011 (entitled "Dual Arm Robot"); and U.S. patent application Ser. No. 13/270,844 filed on Oct. 11, 2011 (entitled "Coaxial Drive Vacuum Robot"), the disclosures of which are all incorporated by reference herein in their entireties.

Referring still to FIG. 2A, the substrate transport 180 includes a rotational drive 262, a Z-drive column 280, a slide body 220 and one or more substrate holders 200A, 200B (also referred to as end effectors). The rotational drive 262 is any suitable rotational drive mounted to a frame 130F of the transport chamber 130 or a sliding carriage 241 of the transport chamber 130, where the sliding carriage 241 is configured to linearly move the substrate transport 180 along a length of the transport chamber 130. The substrate transport may include a Z drive column 280 that is mounted to an output of the rotational drive 262 so as to rotate in the direction of arrow T about the θ axis (e.g. the θ direction—see also FIG. 2H). The slide body 220 is movably mounted to the Z drive column 280 where the Z-drive column 280 includes any suitable drive motor and/or transmission for moving the slide body 220 in the Z direction. As may be realized, the relative position of the Z-drive column 280 with respect to the slide body 220 provides sufficient clearance for adequate traverse of the substrate holders 200A, 200B and substrates S to effect substrate detection by the aligner 181 as described further below.

One or more (at least one) substrate holders 200A, 200B are movably mounted to the slide body 220 in any suitable manner so as to extend and retract in the R direction. While two substrate holders 200A, 200B are illustrated for exemplary purposes only it should be understood that any suitable number of substrate holders may be mounted to the slide body 220 (i.e., coupled to the slide body 220 so as to depend from and move/slide along the slide body 220). For example, in one aspect there is a single substrate holder mounted to the slide body 220 for effecting the transport and alignment of a substrate(s) in the manner described herein. In other aspects there are more than two substrate holders mounted to the slide body 220 for effecting the transport and alignment of a substrate(s) in the manner described herein.

As may be realized, the one or more substrate holders 200A, 200B traverse, with the transport arm 180TA as a unit, in a first direction (e.g. one or more of the X, Y and Z directions) relative to the frame 130F and traverses linearly, relative to the transport arm 180TA, in a second direction (e.g. the R direction) that is different from the first direction. The slide body 220 includes one or more linear drives 225 configured to independently move each substrate holder 200A, 200B in the R direction. The one or more linear drives 225 are any suitable drive(s) having any suitable transmissions which in one aspect are substantially similar to those described in, for example, U.S. Pat. No. 10,134,621 issued on Nov. 20, 2018 (entitled "Substrate Transport Apparatus"), the disclosure of which is incorporated by reference herein in its entirety. The substrate holders 200A, 200B are arranged on the slide body 220 so that they are stacked one over the other so as to have a common axis of extension and retraction R.

In accordance with the aspects of the present disclosure the substrate processing apparatus 100, 150, 165 includes an aligner 181 for aligning substrate as will be described herein. In one aspect, the aligner 181 may be in-situ on the substrate transport 180; while in other aspects, at least a portion of the aligner 181 may be disposed off-board the substrate transport 180, or the aligner 181 may be a stationary substrate alignment station. It is noted that while the substrate transport 180 and aligner 181 are illustrated as being located within the transport chamber 130, in other aspects the substrate transport 180 and aligner 181 may be located in any suitable portion of the substrate processing apparatus 100, 150, 165 including, but not limited to processing modules of the front end of line process 140, processing modules of the back end of line process 160, and/or processing modules of the back end process 170.

The aligner 181 is an alignment/machine vision system that includes one or more image sensors 270 and one or more controlled surfaces 271 (also referred to herein as contrast faces). In one aspect, referring to FIGS. 2A and 2B, the aligner 181 includes one or more image sensors 270 mounted to the transport arm 180TA (such as on slide body 220) and one or more controlled surfaces 271. In one aspect, the image sensor 270 is mounted to the transport arm 180TA so that the one or more image sensor 270 moves with the transport arm 180TA as a unit relative to the frame 130F; while in other aspects the one or more image sensor 270 is fixed to the frame 130F so that the transport arm 180TA moves independent of the image sensor 270. It is noted that the one or more image sensors 270 may be calibrated differently (e.g., calibrated in a reference frame of the substrate transport or calibrated in a global reference frame) depending on whether the one or more image sensors 270 are mounted to the transport arm 180TA or fixed to the frame 130F as will be described herein.

The one or more image sensors 270 (also referred to herein as optical edge detection sensors) may be any suitable imaging sensor/camera. For example, the imaging sensor/camera may be an analog or digital device having an interlaced or progressive scanning configuration that employs area or line scanning. The imaging sensor/camera may be configured to capture monochrome or color images. The imaging sensor/camera may be configured with a global shutter (e.g., for use with high speed movement) or a rolling shutter. The imaging sensor/camera may have any suitable frame rate and resolution for capturing the features of the substrates S described herein. Suitable examples of imaging sensors/cameras include, but are not limited to, CCD (charged coupled device) sensors/imagers, CMOS (complementary metal oxide semiconductor) sensors/imagers, or any other suitable imaging sensor.

Still referring to FIGS. 2A and 2B, in one aspect, the one or more image sensors 270 are coupled to the transport arm 180TA and configured so as to register and effect edge detection of a substrate S supported by the at least one substrate holder 200A, 200B. The one or more image sensors 270 are arranged to measure/detect an edge SE of the substrate S to determine one or more predetermined characteristics of the substrate S such as wafer diameter, a position of an alignment fiducial FID (e.g. notch/flat, mark or other feature) location, location of the wafer centerline, location of wafer center SC, or any other suitable information pertaining to the wafer(s) carried by the substrate holders 200A, 200B. As may be realized, in this aspect, the one or more image sensors 270 are mounted to the transport arm 180TA so that the one or more image sensors 270 move with the transport arm 180 as a unit relative to the frame 130F, where, the one or more image sensors 270 are a common sensor (e.g. common to each substrate holder 200A, 20B and substrate S carried thereon) effecting on-the-fly edge detection/alignment of each substrate of more than one wafers S simultaneously supported by the one or more substrate holders 200A, 200B.

As will be described in greater detail below, the one or more image sensors 270 are configured so that the on-the-fly edge detection of each substrate is effected by and coincident with the linear traverse in the second direction of each substrate holder 200A, 200B of the more than one substrate holder 200A, 200B on the substrate transport 180. For example, the traverse of each substrate holder 200A, 200B in the second direction (e.g., along the axis of extension and retraction R) linearly transports a corresponding substrate S, seated on the substrate holder 200A, 200B, of the more than one substrates S simultaneously supported by the substrate holder(s) 200A, 200B, relative to the one or more image sensors 270 effecting at least edge SE detection of the substrate S.

As described above, the one or more image sensors 270 are imaging devices configured to measure/detect wafer edge positions and/or the wafer fiducial (e.g., notch) as will be described in greater detail below. In one aspect the image sensor(s) 270 is configured to detect any suitable portion of the edge SE (such as a leading and trailing edge) of the substrate S and identify therefrom a substrate location and misalignment with respect to a predetermined reference frame, such as a reference frame of the substrate transport

180, a global reference frame of the substrate processing apparatus 100, 150, 165, and/or a reference frame of any suitable substrate holding station. As an example, the image sensor(s) 270 are configured to detect an arc (see, e.g., FIGS. 3B and 6A) of the substrate S edge SE (e.g. effected through detection of multiple points defining the arc of the substrate S edge SE, or a continuous or a substantially continuous scan of the substrate S edge SE). In another aspect the image sensor(s) 270 may also be configured to read, for example, substrate identification marking features such as, for example, alphanumeric identifiers, two dimensional codes or other suitable identifying indicia located on the substrate S; while in other aspects an identification reader 230 (separate and distinct from the one or more image sensors 270) may be provided on the substrate transport 180 for reading the substrate identification marking features.

In some aspects, as the frontside surface TS of the substrate S may be covered in epoxy, the one or more image sensors 270 are, in one aspect, configured to scan/image a bottom surface BS (e.g. the highly reflective side of the substrate S facing the substrate holder 200A, 200B on which the substrate S is located) and a peripheral edge SE of the substrate S so that substrate alignment may be effected in each of the back end process 170, the back end of line process 150, and the front end of line process 140; while in other aspects, where artifacts 222, 223 indicative of the peripheral edge SE and/or notch 350 of the substrate S are present in the molding material 370 (see FIG. 2X and as described in further detail herein) of the back end process 170 the one or more image sensors 270 may be configured to scan/image a frontside surface TS (e.g. the side of the substrate S facing away from/opposite the substrate holder 200A, 200B on which the substrate S is located) to identify the peripheral edge SE and/or the notch 350 for determining the predetermined characteristics of the substrate S described herein. In still other aspects, the one or more image sensors 270 may be configured to scan/image a frontside surface TS (e.g., which in the case of the front end of line process 140 and the back end of line process 160 may be a highly reflective surface) and a peripheral edge SE of the substrate S (in a manner substantially similar to that described herein) so that substrate alignment may be effected in the front end of line process 140 and the back end of line process 160.

In one aspect, referring also to FIGS. 2H and 2I, the aligner 181 includes any suitable rotary chuck 260 (e.g., also referred to as a spinner) is connected to the slide body 220 so as to move as a unit with the slide body 220. The rotary chuck 260 is disposed on the substrate transport 180 to cooperate with each substrate holder 200A, 200B and effect rotation of the corresponding wafer seated on the substrate holder 200A, 200B. The rotary chuck 260 may be employed to rotate the substrate S such as for finding and reading optical character recognition marks on the substrate S (e.g., substrate identification) and rotationally positioning the wafer in a predetermined orientation (such as to effect repositioning for wafer alignment in response to notch detection by the one or more image sensors 270). The rotary chuck 260 is rotatably mounted to the slide body 220 so that a center of rotation θ2 of the chuck is substantially coincident with a centerline CL of the substrate holders 200A, 200B while in other aspects the rotary chuck 260 has any suitable spatial relationship with the substrate holders 200A, 200B that allows for a transfer of substrate(s) S between each substrate holder 200A, 200B and the rotary chuck 260.

In one aspect, the rotary chuck 260 is an active edge gripping chuck (the chuck includes movable grippers that grip the edge of the wafer), a passive gripping chuck (e.g. the wafer rests on passive support pads of the chuck) or a vacuum gripping chuck. In one aspect the rotary chuck 260 includes at least two degrees of freedom. For example, the rotary chuck 260 is rotatable about the axis θ2 and is linearly movable in the Z direction along the axis θ2. The rotary chuck 260 includes a chuck drive 260D that includes a rotation drive 275 and a Z axis drive 276 that drive a drive shaft 277 in rotation and linear movement respectively. For example, chuck drive 260D includes a rotating spline bearing 278 in which the drive shaft 277 is located. The drive shaft 277 includes splines that interface with splines of the rotating spline bearing 278 so that as the rotating spline bearing 278 rotates the drive shaft 277 rotates with it. A pulley 278P is fixed to the rotating spline bearing 278 and is driven by the rotation drive 275 through transmission 275T. As may be realized, as the pulley 278P rotates the rotating spline bearing 278 rotates with it. The drive shaft 277 is supported in the Z direction within the rotating spline bearing 278 by, for example, a carriage 277C that is fixed to a belt 276TB of vertical drive transmission 276T so that as the belt 276TB moves in the Z direction the carriage 277C moves with it. The belt 276TB is driven by the Z axis drive 276 with pulleys or in any other suitable manner. The carriage 277C includes any suitable bearing 279 (e.g., such as, a thrust bearing) configured to support the drive shaft 277 within the carriage 277C. In other aspects the transmissions 276T, 275T and drives 275, 276 have any suitable configuration for moving the drive shaft 277, and the rotary chuck 260 mounted thereto, in the θ2 and Z axes. It should be understood that while the chuck drive 260D is illustrated as being underneath the slide body 220 in other aspects at least a portion of the chuck drive 260D is located to a side of the slide body 220.

In other aspects, the substrate transport 180 may not include the rotary chuck 260. For example, any suitable rotary chuck (i.e., an off-board chuck) may be located in the transport chamber 130 or in a module of the front end of line process 140 or a module of the back end of line process 160. The substrate transport 180 may be configured to communicate a position/orientation of a substrate S notch to a controller 199 of the substrate processing apparatus 100, 150, 165 so that the controller 199 may command the off-board chuck to rotate the substrate S to a desired orientation based on the position/orientation of the substrate S notch determined by the one or more image sensors 270 of the substrate transport 180.

Figure 12A:
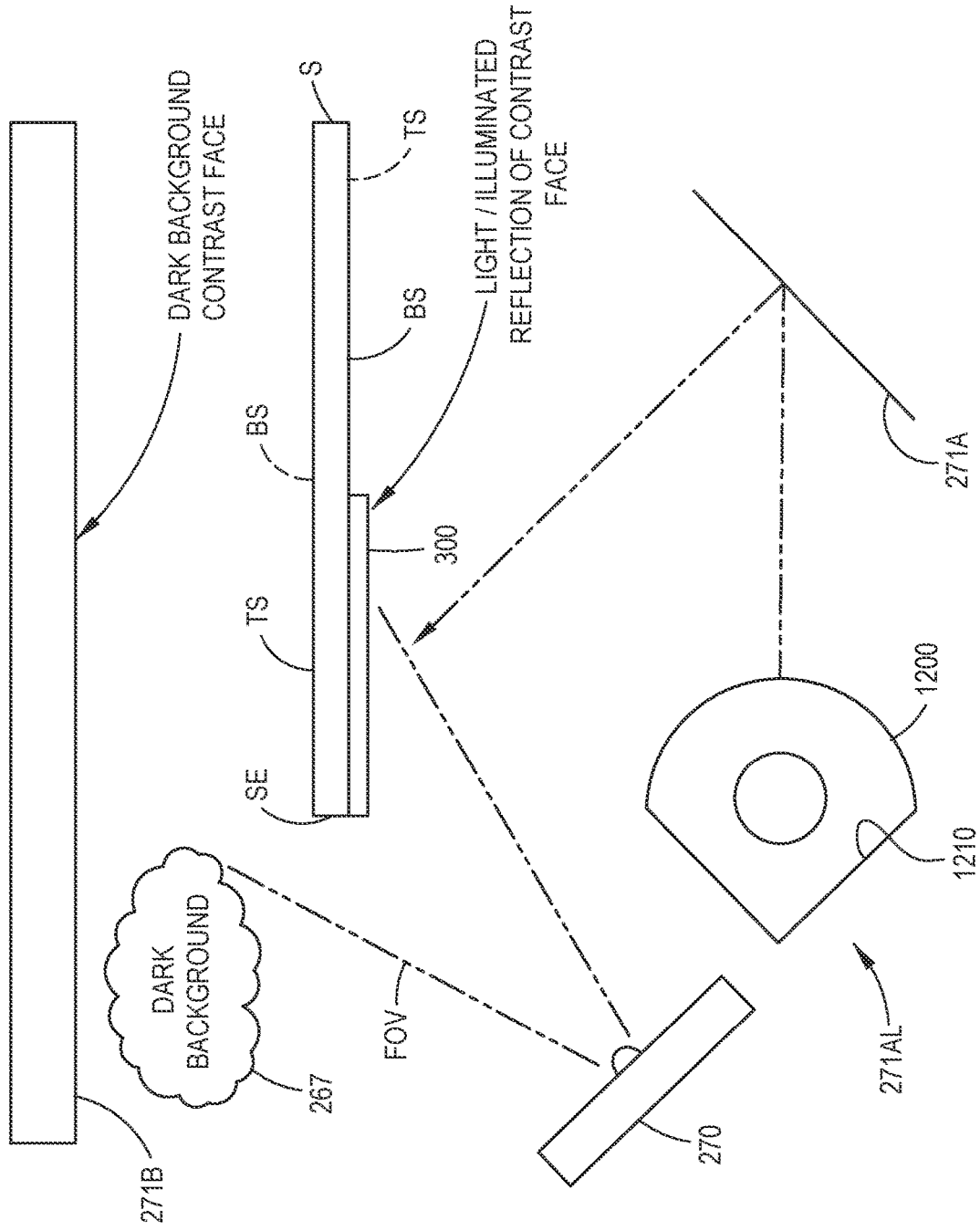
FIGS. 12A-12D are schematic illustrations of a portion of a machine vision system in accordance with aspects of the present disclosure.
Figure 12B:
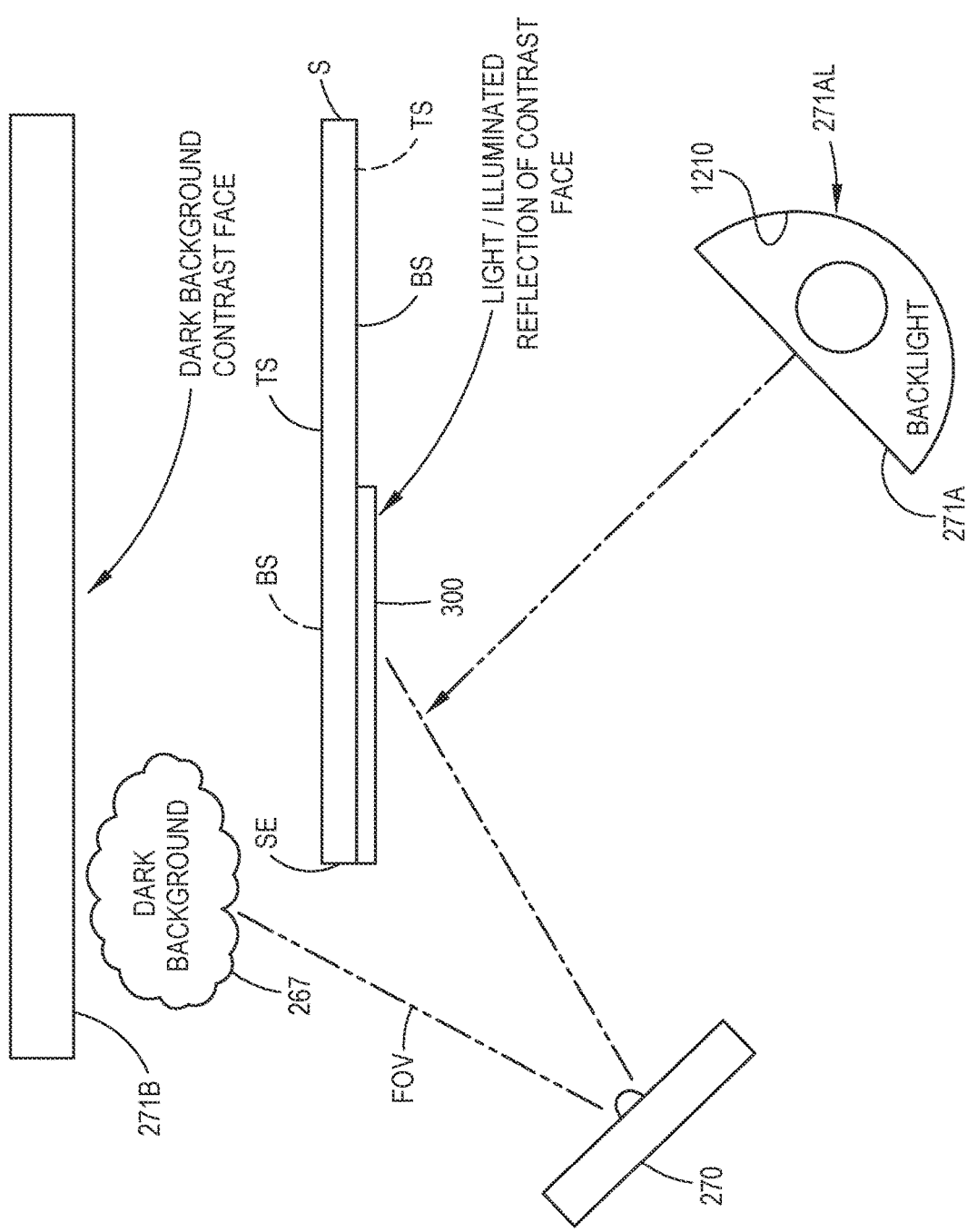
Figure 12C:
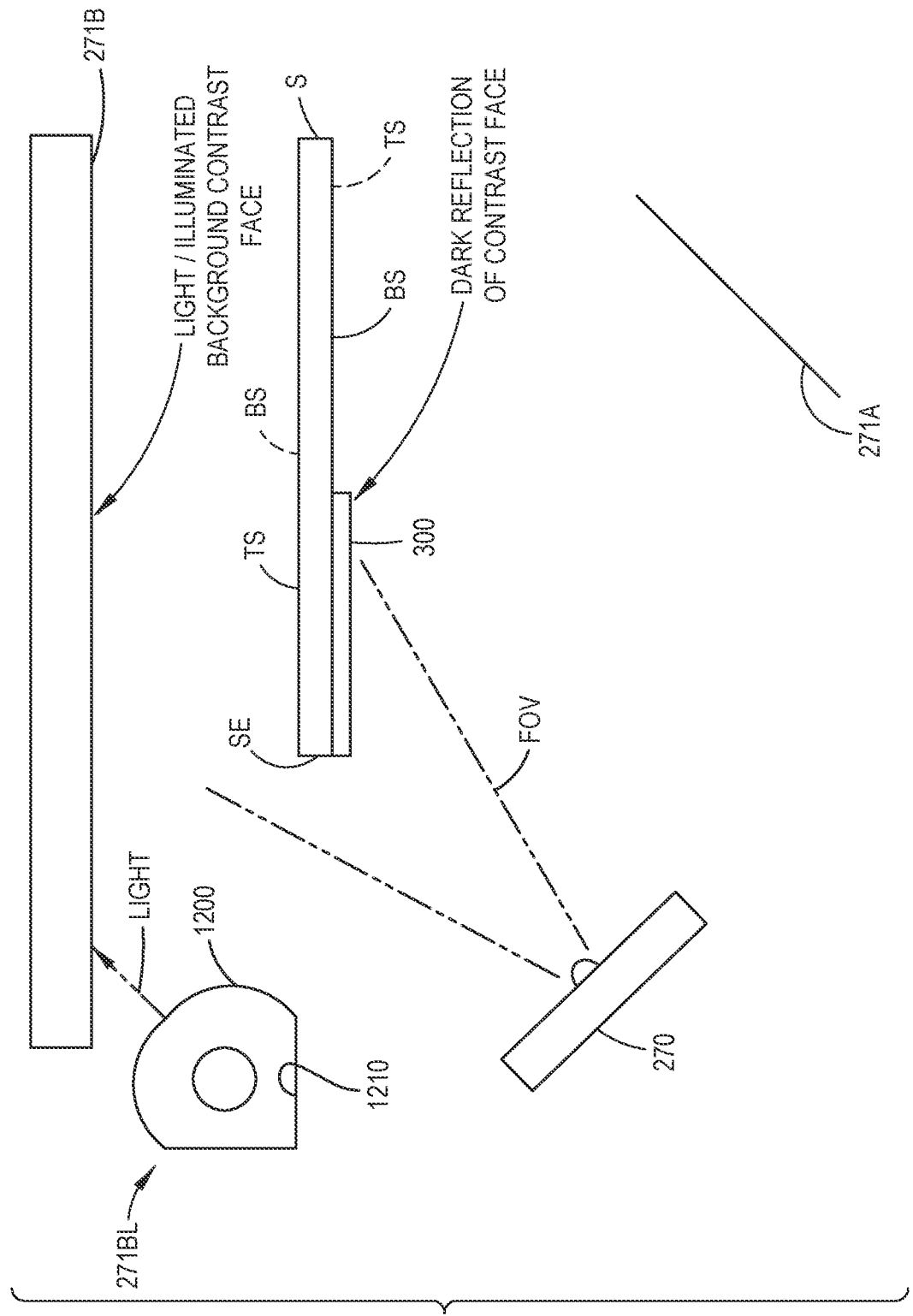
Figure 12D:
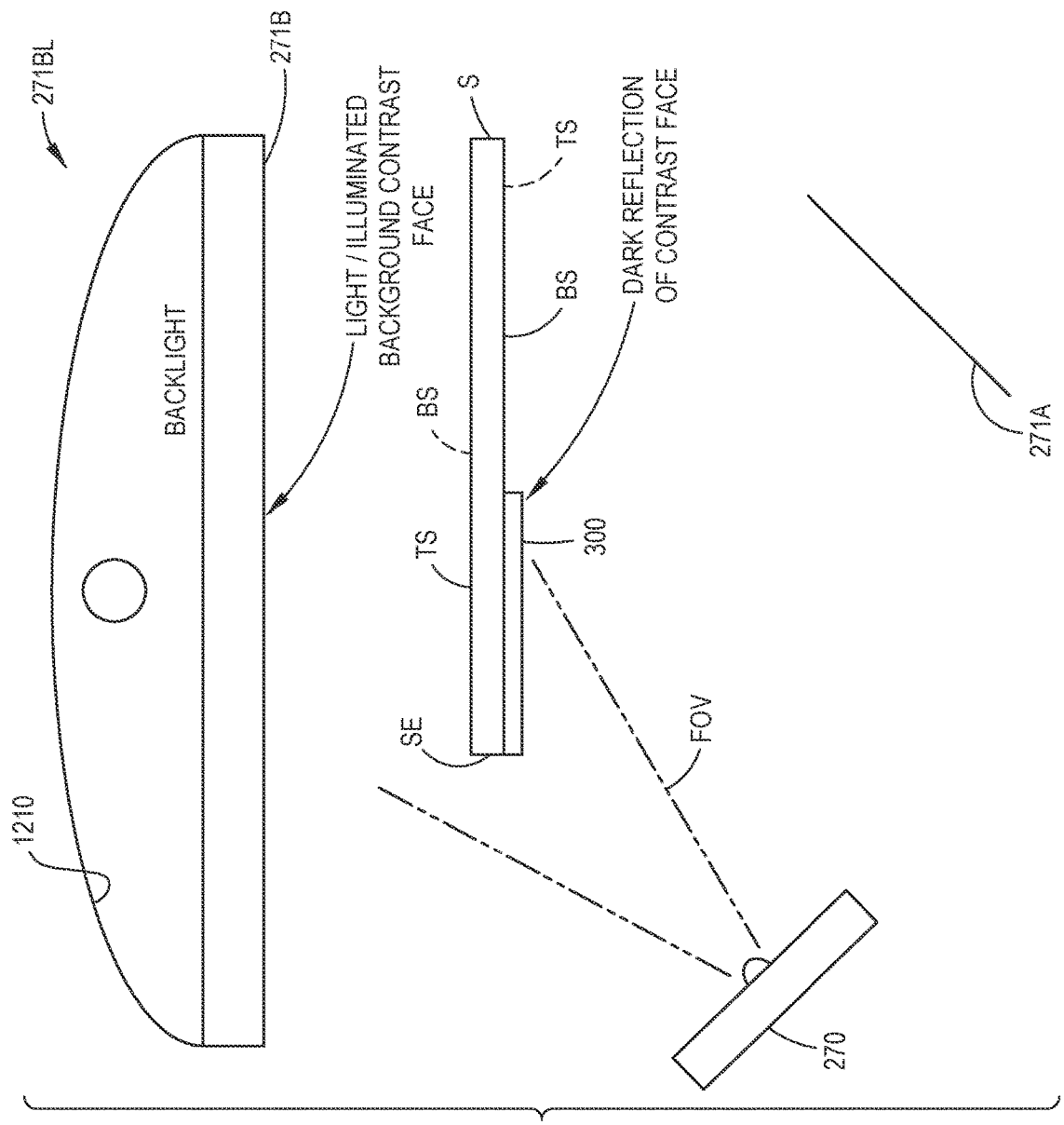
Figure 13A:
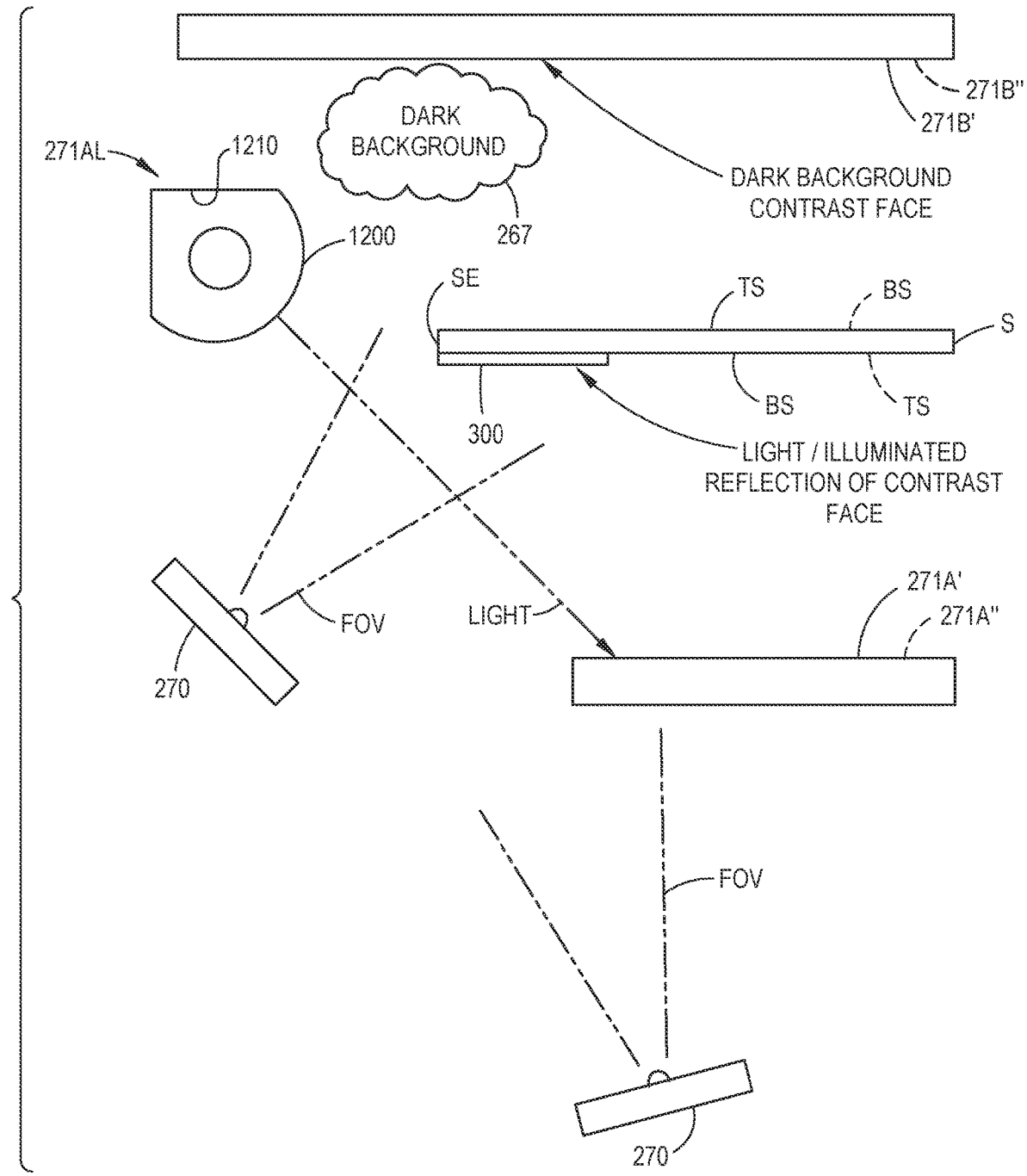
FIGS. 13A-13D are schematic illustrations of a portion of a machine vision system in accordance with aspects of the present disclosure.
Figure 13B:
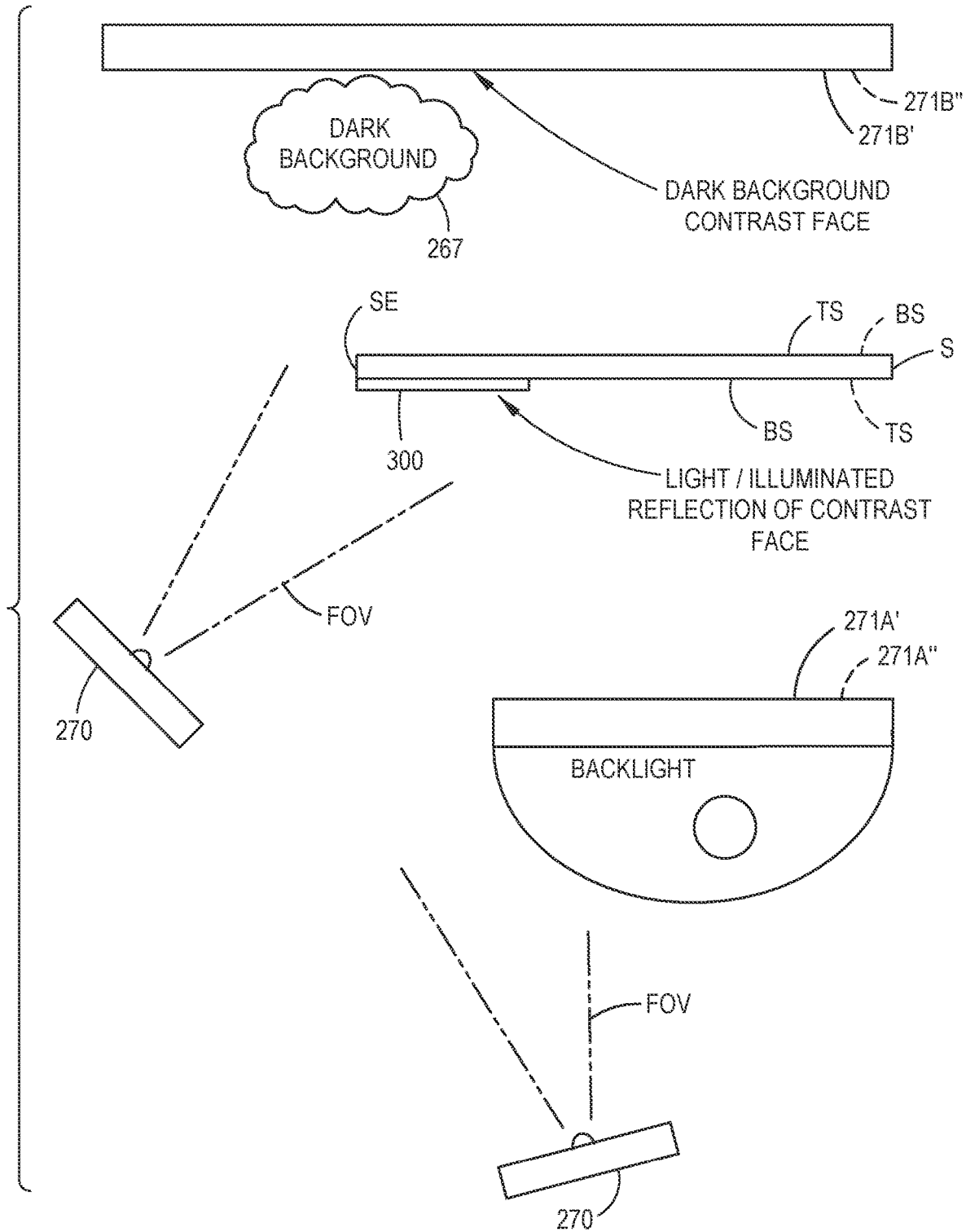
Figure 13C:
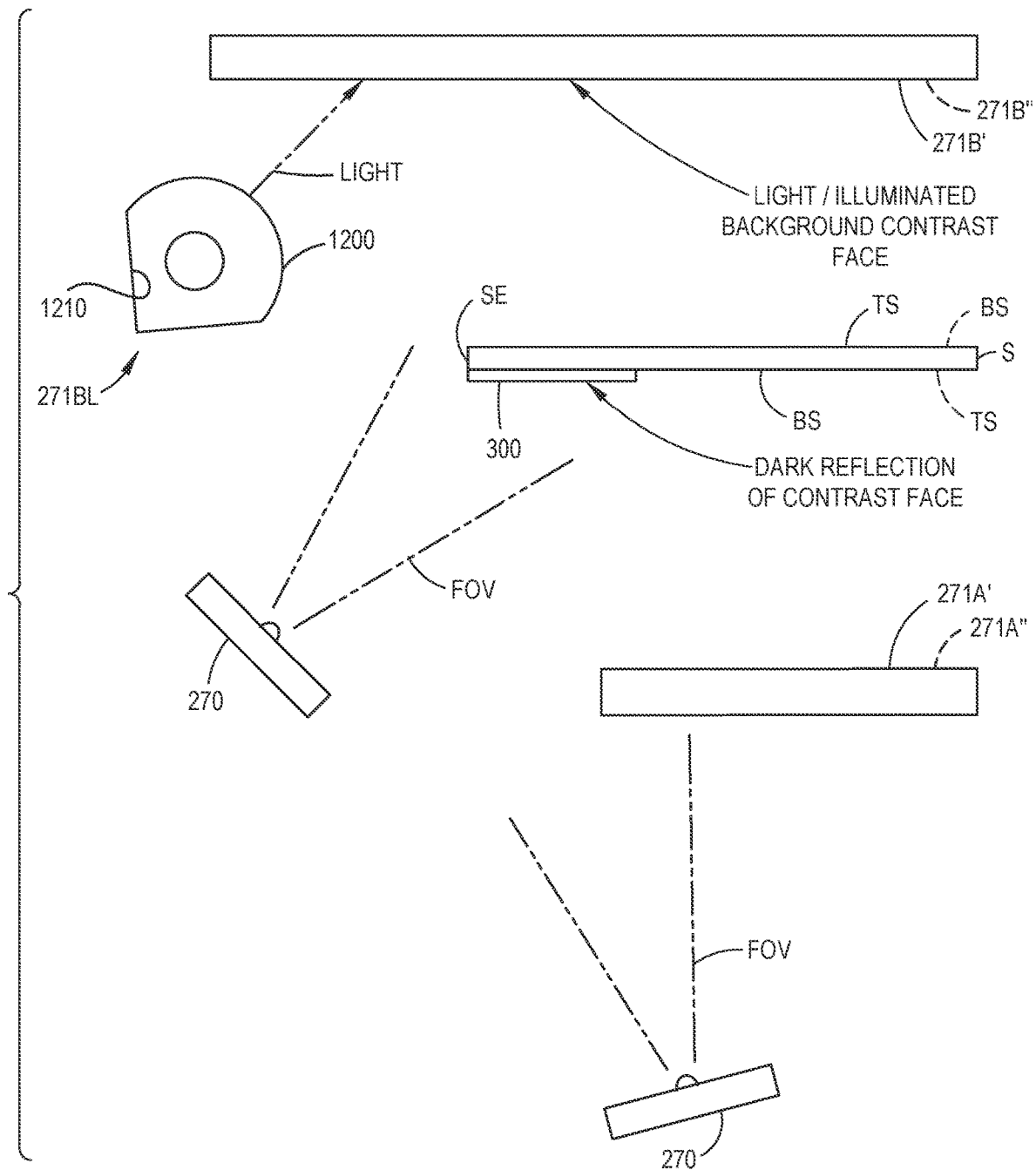
Figure 13D:
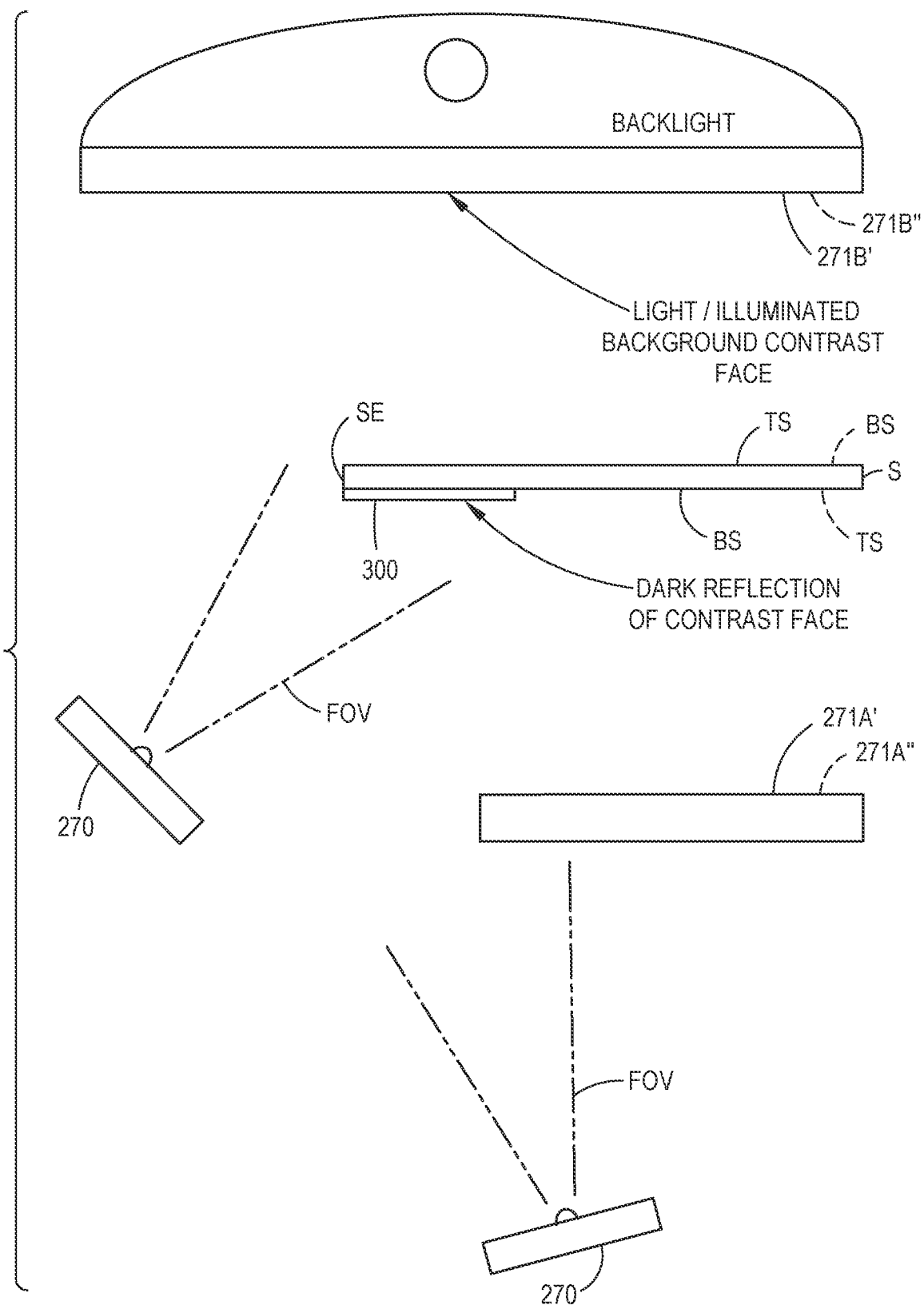

Referring to FIGS. 2A, 2B, and 3A-3C, in the aspect illustrated in FIGS. 2A and 2B the aligner 181 includes at least one illumination source 271AL, 271BL and a foreground controlled contrast surface or contrast face 271A mounted to the slide body 220. The at least one illumination source 271AL, 271BL may comprise, in one aspect, a backlit foreground contrast face (see FIGS. 2A, 12B, 13B—such as when illumination source 271AL is disposed behind foreground controlled contrast surface or contrast face 271A, 271A', 271A"), or a backlit background contrast face (see FIGS. 12D, 13D—such as when illumination source 271BL is disposed behind background controlled contrast surface or contrast face 271B, 271B', 271B"). The backlit contrast faces may be referred to as self-illuminating contrast faces. In other aspects the illumination source comprises a light projector/radiating light (e.g., see illumination source FIGS. 2L, 2N-2U, 12A, 12C, 13A, 13C where light is radiant or projected from the illumination source onto the contrast face).

In one aspect, the at least one illumination source 271AL, 271BL may include any suitable diffuser so that the light emitted from the at least one illumination source 271A1, 271BL is a diffuse light that is directed at least towards a respective contrast face in any suitable manner. For example, where the illumination source 271AL, 271BL backlights a contrast face, the contrast face diffuses the light from the illumination source 271AL, 271BL. Where the illumination source 271AL, 271BL is a projector/radiating light diffuser 1200 (FIGS. 12A, 12C, 13A, 13C) may be provided in the light path to diffuse the light. To direct the light towards at least the respective contrast face, the illumination source 271AL, 271BL may include any suitable reflector 1210 (FIGS. 12A-12D, 13A-13D) disposed so as to direct the light towards the respective contrast face. In one aspect, the diffuse light may be directed by the illumination source 271AL, 271BL towards the frontside surface TS or bottom surface BS of the substrate S where the light is reflected from the wafer surface towards a respective contrast face for illuminating the respective contrast face.

The one or more illumination source 271AL, 271B may have a sufficient intensity to overcome any ambient light surrounding the substrate S so as to optically blank background reflections or to substantially uniformly reflect the contrast face onto the substrate surface so as to generate the image contrast described herein. In one aspect, the illumination intensity overcoming the ambient light is achieved by setting an exposure time of the image sensor 270 or in any other suitable manner. The one or more illumination source 271AL, 271B may produce light in a light spectrum, the light spectrum being determined based on the ambient lighting and surface conditions surrounding the substrate S, so as to optically blank background reflections or to substantially uniformly reflect the contrast face onto the substrate surface so as to generate the image contrast described herein.

In one aspect, the illumination source 271AL, 271BL is connected (directly or indirectly) to the frame 130F and is configured so as to illuminate a contrast face reflected from a surface of the substrate S (see, e.g., FIGS. 2A, 2B, 12A, 12B, 13A, 13B), supported by the at least one substrate holder 200A, 200B, which surface delineates a peripheral edge SE of the substrate S, and the contrast face is disposed with respect to the image sensor 270 so that the reflected contrast face directed from the surface at the image sensor 270 optically blanks, at the peripheral edge SE of the substrate, background light reflection from the surface of the substrate viewed by the image sensor 270 (as described herein) coincident with linear traverse of the substrate S supported by the at least one substrate holder. Here, the peripheral edge SE of the substrate is defined in relief in image contrast, formed by and between the reflected contrast face and a lighted background, registered by the image sensor 270 so as to effect edge detection coincident with linear traverse of the wafer supported by the at least one end effector.

In another aspect, the at least one illumination source 271AL, 271BL is connected (e.g., directly or indirectly) to the frame 130F and is configured so as to illuminate a surface (e.g., such as bottom surface BS or frontside surface TS) of the substrate, supported by the at least one substrate holder 200A, 200B (which surface delineates a peripheral edge SE of the substrate S) and/or a contrast face (which contrast face is not reflected by the substrate S) (see, e.g., FIGS. 12C, 12D, 13C, 13D). The at least one illumination source 271AL, 271BL being disposed with respect to the image sensor 270 so that the surface directs reflected surface illumination, from the illumination source 271AL, 271BL, at the image sensor 270, and optically blanks, at the peripheral edge of the substrate S, background reflection light of a background 267, viewed by the image sensor 270 coincident with linear traverse of the substrate S supported by the at least one substrate holder 200A, 200B.

Referring to FIGS. 2A, 2B, 12A-12D, and 13A-13D, the foreground controlled contrast surface 271A, 271A', 271A" and a respective image sensor 270 are positioned relative to each other and the substrate S so that a reflection 300 of the foreground controlled contrast surface 271A, 271A', 271A", that is reflected by the bottom surface BS (or frontside surface TS) of the substrate S, is visible to the image sensor 270, where the peripheral edge SE of the substrate is defined in relief in image contrast, formed by and between wafer surface reflection and the optically blanked background, registered by the image sensor 270 so as to effect edge detection coincident with linear traverse of the substrate S supported by the at least one substrate holder 200A, 200B. For example, the reflection 300 of the foreground controlled contrast surface 271A extends along/adjacent to the peripheral edge SE of the substrate S so as to provide on the bottom surface BS (or frontside surface TS) of the substrate S, adjacent to and including the edge SE, an optically blank reflection/appearance (e.g., where optically blank is the rendering of the appearance/reflected light, within the sensor field of view, from background devoid of features registered by the image sensor—the reflective surface of the substrate is rendered a substantially single color with no other objects being reflected thereby but for the featureless foreground controlled contrast surface 271A).

In one aspect, the aligner 181 may also include a contrast face disposed in the background 267 (on an opposite side of the substrate from the foreground controlled contrast surface 271A), and arranged so as to optically blank (again, optically blank is the rendering of the appearance/reflected light, within the sensor field of view, from background devoid of features registered by the image sensor) the background reflected light viewed by the image sensor 270. For example, a contrasting background controlled contrast surface or face 271B, 271B', 271B", which in the aspect illustrated in FIGS. 2A and 2B, is an interior surface 130S of the transport chamber 130; however, in other aspects the contrasting background controlled contrast surface 271B may be any other surface mounted to or separate from the substrate transport 180 that is disposed at least partially above the substrate S in a field of view FOV of the image sensor 270 and that is configured to produce a substantially uniform image background that is devoid of features (i.e., blanked) and has a contrasting color relative to a color of the foreground controlled contrast surface 271A, 271A', 271A".

In one aspect (see, e.g., FIGS. 12A, 12B, 13A, 13B), the contrasting foreground controlled contrast surface or face 271A, 271A', 271A" forms at least in part a lighted reflection, disposed on an opposite side of the substrate from the background controlled contrast surface 271B, 271B', 271B" so that in an image of the substrate S (see image 399, 399' in FIGS. 3A and 4B) the background appears dark and the reflected foreground controlled contrast surface 271A, 271A', 271A" on the substrate S appears light in relation to the dark background. In another aspect (see, e.g., FIGS. 12C, 12D, 13C, 13D), the contrasting background controlled contrast surface or face 271B, 271B', 271B" forms at least in part a lighted background, disposed on an opposite side of the substrate from the foreground controlled contrast surface 271A, 271A', 271A" so that in an image of the substrate S (see image 399" in FIG. 5B) the background appears light and the reflected foreground controlled contrast surface 271A, 271A' on the substrate S appears dark in relation to the light background. As may be realized, the background controlled contrast surface or face 271B, 271B', 271B" may be oversized compared to the substrate S (e.g., the contrasting background controlled contrast surface or face 271B, 271B', 271B" has a size larger than the substrate S so that when viewed by the image sensor 270 the contrasting background controlled contrast surface or face 271B, 271B', 271B" extends beyond the peripheral edge SE of the substrate S so as form a blanked background of the image taken by the image sensor 270).

One or more of the foreground controlled contrast surface 271A, 271A' and the background controlled contrast surface 271B, 271B' is gray scale or is dark colored so as to form image contrast formed by and between a wafer surface reflection and the optically blanked background (e.g., formed by the background controlled contrast surface 271B, 271B'), registered by the optical edge detection sensor that defines (in the image 399, 399', 399") in relief the peripheral edge SE. Here, as an example, in an image 399 taken by the image sensor 270, the substrate S and its edge SE appear as a bright solid-colored surface and the area of the image 399 behind the substrate S appears as a dark contrasting background. As may be realized, other contrasting color combinations may be employed, such as a dark reflection on the bottom surface BS of the substrate and a bright colored background or any other color/brightness combination that provides for image contrast between the reflective bottom surface BS of the substrate S and the space 291 (e.g., the space above or behind the substrate S) on the opposite side (e.g., frontside surface TS) of the substrate S.

In one aspect, the image contrast noted above may be provided through illumination of one of the foreground controlled contrast surface 271A and the background controlled contrast surface 271B while the other of the foreground controlled contrast surface 271A and the background controlled contrast surface 271B is less illuminated (is less bright) or not illuminated at all. For example, the foreground controlled contrast surface 271A may be backlight (e.g., self-illuminating) by any suitable light source 271AL (e.g., such as by a light emitting diode or LED) while the background controlled contrast surface 271B is illuminated by ambient light from the light source 271AL that passes around the substrate S.

In one aspect, as can be seen in FIGS. 2A and 2B, the light source 271AL is closer to the bottom surface BS of the substrate S than to the background controlled contrast surface 271B. As may be realized, according to the Inverse-Square Law of Light the surface closer to the light source 271AL (i.e., the bottom BS of the substrate) will be subject to a higher light intensity than the background controlled contrast surface 271B (i.e., the light falls-off) so that the bottom BS of the substrate S appears brighter than the contrasting darker surface of the background controlled contrast surface 271B (see FIG. 3A). In other aspects, the image sensor 270 may include an aperture size and/or have a shutter speed (i.e., imaging time) configured to effect (in conjunction with or in lieu of the light source 271AL) image contrast between the reflection of the foreground controlled contrast surface 271A reflected by the bottom surface BS of the substrate S and the background controlled contrast surface 271B. In one aspect, where the Inverse-Square Law of Light, aperture size, and/or shutter speed are employed to generate the image contrast the background controlled surface contrast surface 271B may be omitted.

In still other aspects, the contrast between the between the reflection of the foreground controlled contrast surface 271A reflected by the bottom surface BS of the substrate S and the background controlled contrast surface 271B may be generated by different colored illuminators configured to backlight or otherwise illuminate (e.g., shine on) a respective one of the foreground controlled contrast surface 271A and the background controlled contrast surface 271B. For example the light source 271AL may have a warm color (e.g., such as red, yellow, or orange) that is projected onto the foreground controlled contrast surface 271A, while another light source 271BL has a cool color (e.g., such as blue, green or purple that is a contrasting color to the warm color) that is projected onto the background controlled contrast surface 271B (e.g., the foreground controlled contrast surface 271A appears red in the image 399 while the background controlled contrast surface 271B appears blue in the image 399). In other aspects, the light source 271AL may have a cool color and the illumination source 271BL may have a warm color. In other aspects, the illumination sources 271AL, 271BL may be same color but have different intensities (e.g., the light source 271A has a brighter intensity than the illumination source 271BL, or vice versa) that generate contrast between the respective foreground controlled contrast surface 271A and background controlled contrast surface 271B in the image 399. It is noted that the illumination of the foreground controlled contrast surface 271A and the background controlled contrast surface 271B does not have to be an even illumination as long as there is sufficient contrast in the image 399 between the reflective bottom surface BS of the substrate S and the background controlled contrast surface 271B so that the edge SE and notch 350 of the substrate S can be identified in the image 399.

In still other aspects, the contrast may be generated by respective colors of the foreground controlled contrast surface 271A and background controlled contrast surface 271B. for example, the foreground controlled contrast surface 271A may be a warm color or white while the background controlled contrast surface 271B is a cool color or black/grey shaded, or vice versa.

Figure 3A:
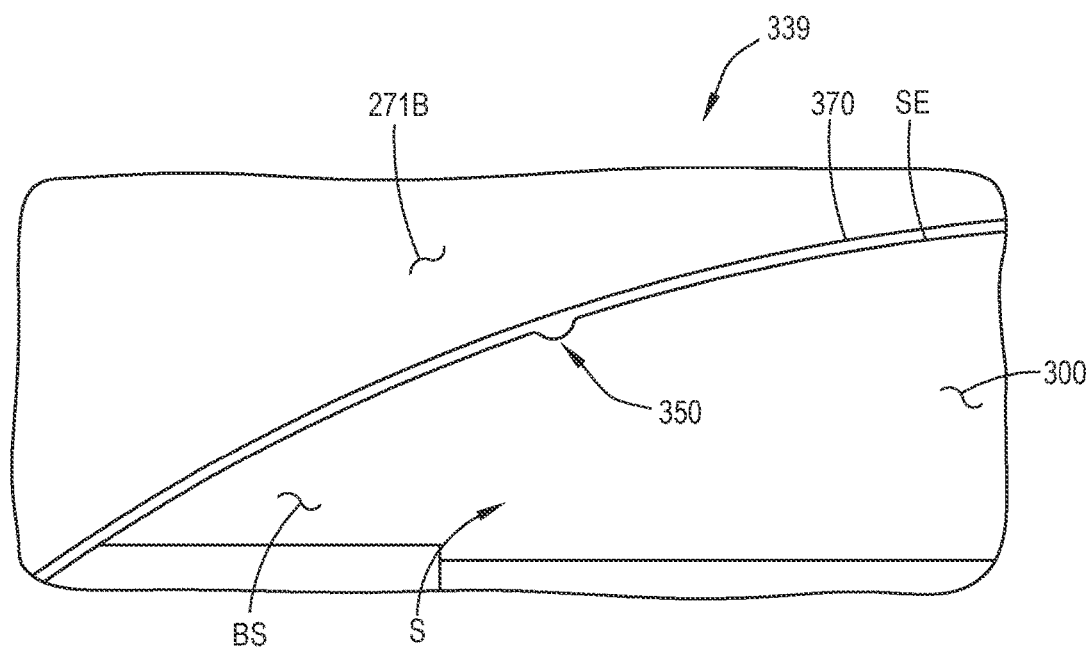
FIG. 3A is schematic illustration of a portion of a substrate as seen through an imager of the substrate transport of FIG. 2A in accordance with aspects of the present disclosure.

Still referring to FIG. 3A, the image contrast, generated in the manner described above, is such that the notch 350 may be identified in the image regardless of whether the notch 350 is filled with molding material 370 (see, e.g., FIG. 3A). For example, the reflection of the contrast surface 271 on the bottom surface BS of the substrate S effectively forms dark or light non-specular surface on the substrate S that is contrasted with a color of the molding material 370 so that the molded in pose determining feature (e.g., notch 350) of the substrate S is contrasted with the non-specular surface formed by the reflection of the contrast surface on the bottom surface BS of the substrate S. In one aspect, the non-specular surface formed on the substrate S by, e.g., the foreground controlled contrast surface 271A, 271A' may be light in color compared to a dark background formed by, e.g., the background controlled contrast surface 271B (see images 399, 399' in FIGS. 3A and 4B); while in other aspects, the non-specular surface formed on the substrate S by, e.g., the foreground controlled contrast surface 271A, 271A' may be dark in color compared to a light background formed by, e.g., the background controlled contrast surface 271B (see image 399" in FIG. 5B). For example, an outline of the molding material 370 extending beyond the edge SE of the substrate S is identified through a contrast in color/intensity between the molding material 370 and one or more of the background controlled contrast surface 271B and the reflection of the foreground controlled contrast surface 271B reflected in the bottom BS of the substrate S (such as in the back end of line process 160); the molding material 370 that fills the notch 350 is identified through a contrast in color/intensity between the molding material 370 and the reflection of the foreground controlled contrast surface 271B reflected in the bottom BS of the substrate S (such as in the back end of line process 160); and/or the notch 350 is identified through a contrast in color/intensity between the reflection of the foreground controlled contrast surface 271B reflected in the bottom BS of the substrate S and the background controlled contrast surface 271B (such as in the front end of line process 140).

Figure 2K:
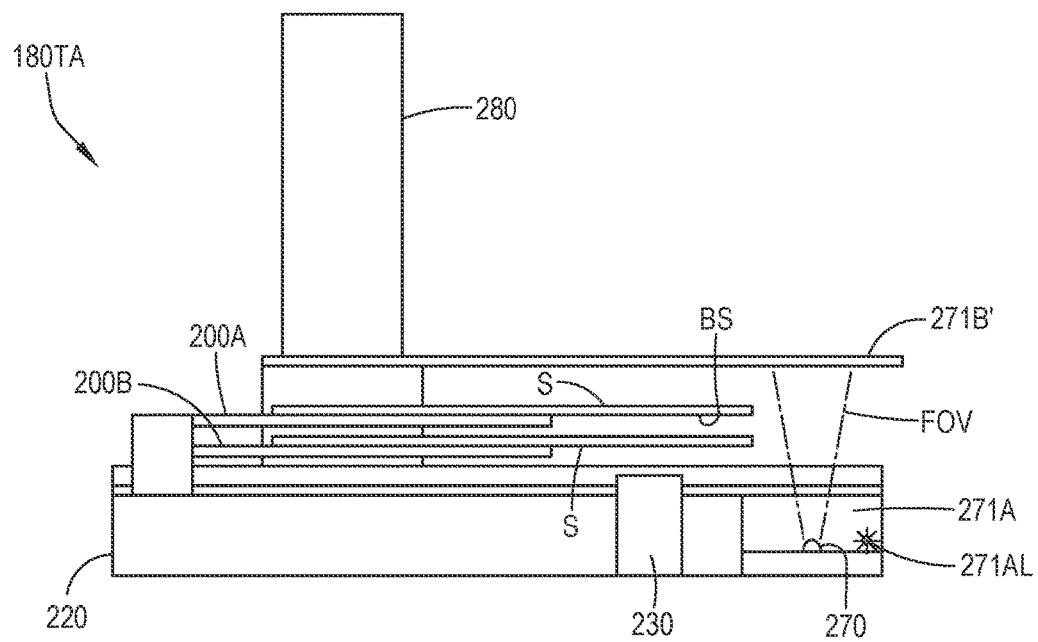
FIGS. 2K-2W are schematic illustrations of a portion of the substrate transport of FIGS. 1A-1C in accordance with aspects of the present disclosure.
Figure 2L:
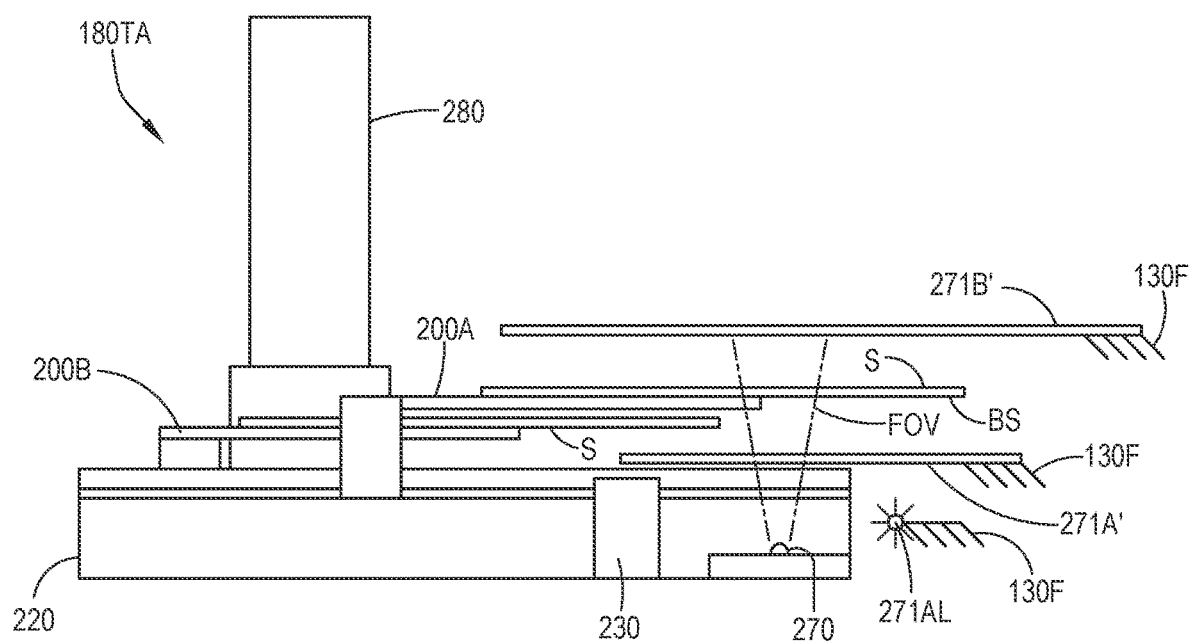
Figure 2M:
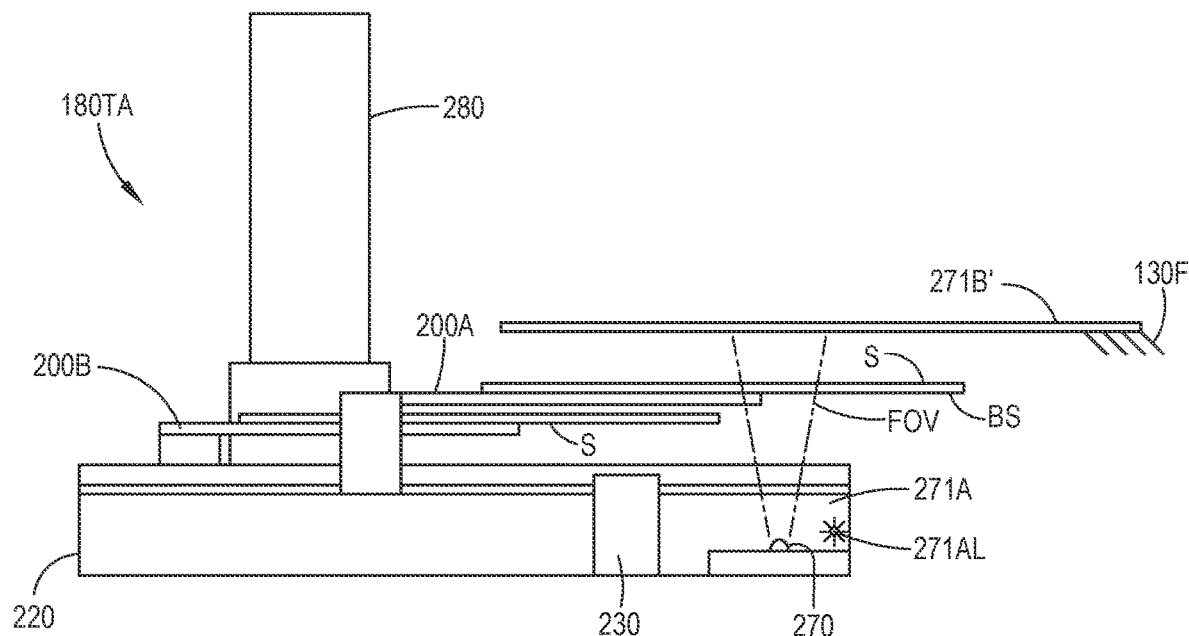
Figure 4A:
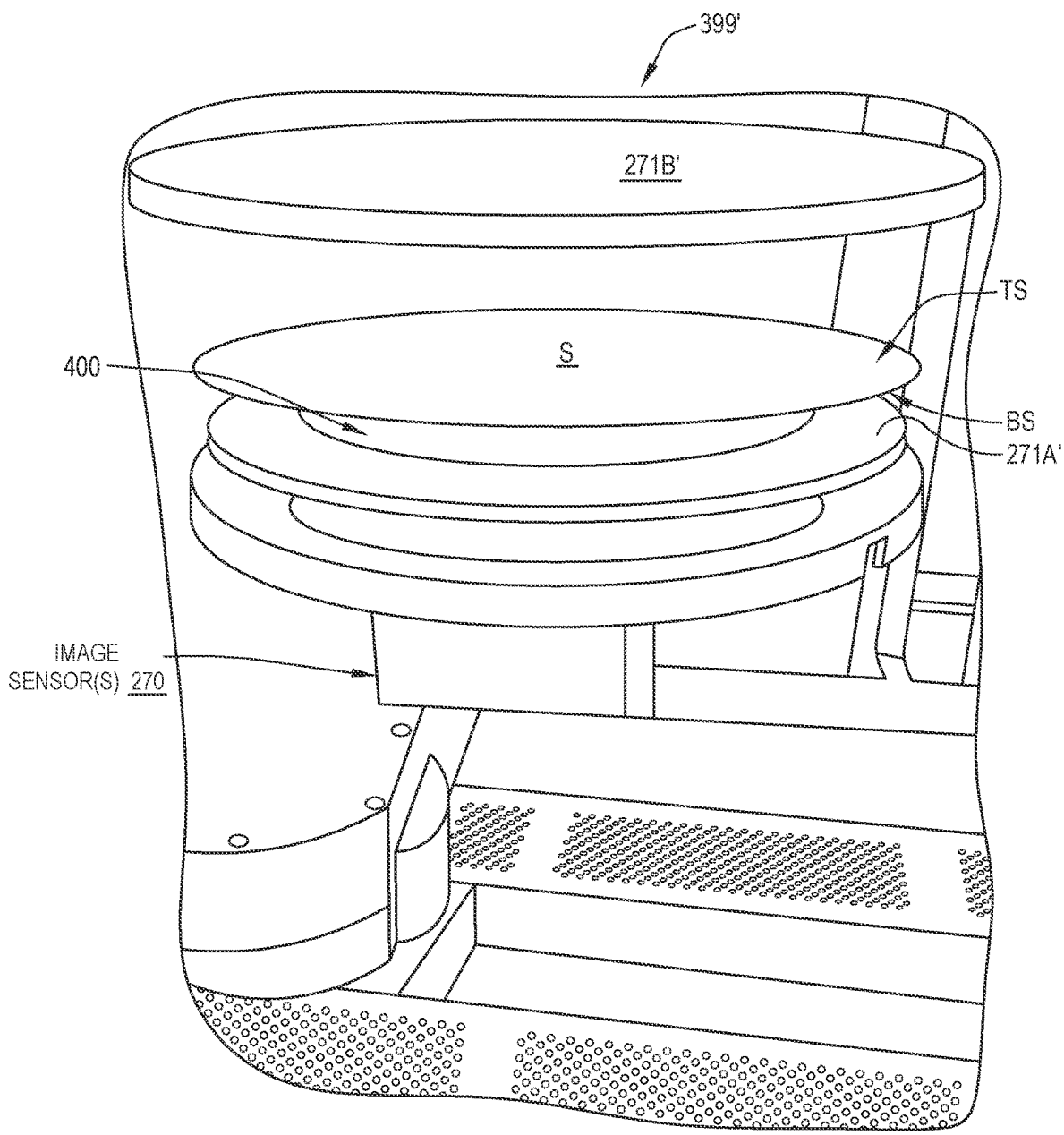
FIG. 4A is a schematic illustration of a portion of a substrate transport of FIGS. 1A and 1B incorporating aspects of the present disclosure.
Figure 4B:
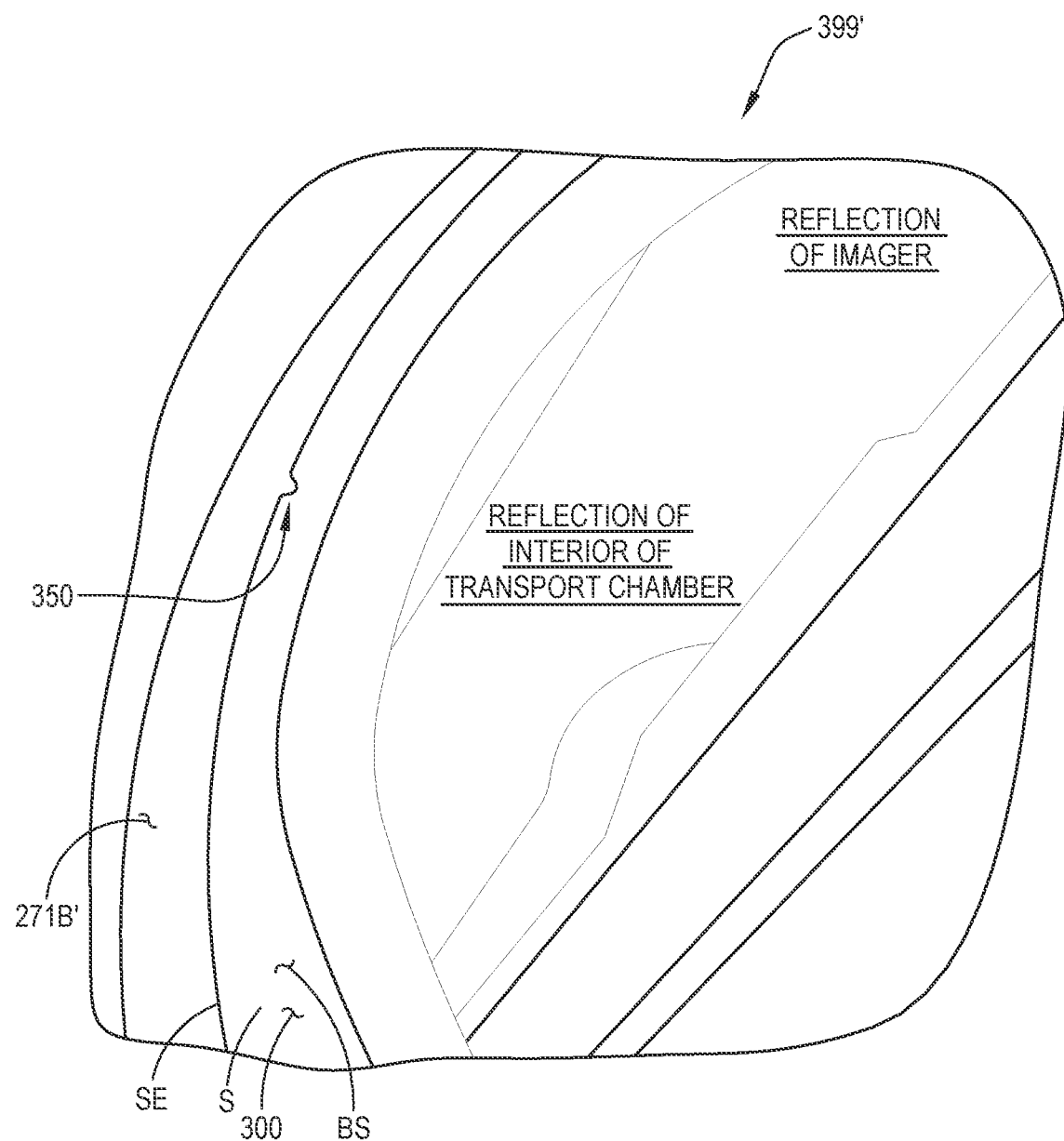
FIG. 4B is a schematic illustration of a portion of a substrate as seen through an imager of the substrate transport of FIG. 2A in accordance with aspects of the present disclosure.

Referring to FIGS. 2K, 4A and 4B, in one aspect, the substrate transport 180 is illustrated with both the foreground controlled contrast surface 271A, 271A' and the background controlled contrast surface 271B' mounted on the substrate transport 180. For example, the foreground controlled contrast surface 271A, 271A' and the background controlled contrast surface 271B' may be mounted to any suitable portion(s) of the substrate transport 180, such as the slide body 220 and/or the Z-drive column 280. In one aspect, both the foreground controlled contrast surface 271A, 271A' and the background controlled contrast surface 271B' are mounted to the slide body; while in other aspects, the foreground controlled contrast surface 271A, 271A' is mounted to the slide body and the background controlled contrast surface 271B' is mounted to (e.g., cantilevered from) the z-drive column 280. The foreground controlled contrast surface 271A, 271A' and the background controlled contrast surface 271B' are configured to provide contrast in an image 399' obtained by the one or more image sensors 270 in a manner substantially similar to that described above.

In one aspect (such as illustrated in FIGS. 4A and 4B), the foreground controlled contrast surface 271A' is illustrated as being a disk having a central aperture 400; but in other aspects the foreground controlled contrast surface 271A' may have any suitable shape and size. The foreground controlled contrast surface 271A' may be centered along the centerline CL of the substrate holders 200A, 200B so that a reflection of the foreground controlled contrast surface 271A' is provided on the substrate S as a center SC of the substrate S passes over or adjacent to a center of the central aperture 400. In other aspects the foreground controlled contrast surface 271A' may have any suitable spatial relationship relative to the substrate holders 200A, 200B so long as a respective portion of the foreground control surface 271A' is reflected by the substrate S, along and adjacent to the edge SE of the substrate S, to each respective image sensor 270. Here, the foreground controlled contrast surface 271A' may be common to each of the one or more image sensors 270 that are mounted to the slide body 220; while in other aspects, the foreground controlled contrast surface 271A' may be a segmented surface where each image sensor 270 images a respective segment of the segmented surface. In other aspects, the foreground controlled contrast surface 271A' may be substantially similar to foreground controlled contrast surface 271A described above. In one aspect, any suitable light source, similar to those described above, may be provided to backlight or otherwise illuminate one or more of the foreground controlled contrast surface 271A' and the background controlled contrast surface 271B'. It is noted that the substrate S is illustrated in FIGS. 4A and 4B as a standard (unmolded) substrate used in the front end of line process 140, but it should be understood that in other aspects the substrate may be a molded wafer used in the back end of line process 160.

The one or more image sensor 270 may be positioned so as to image the edge SE of the substrate S, and the reflection of the foreground controlled contrast surface 271A' thereon, through the central aperture 400 of the foreground controlled contrast surface 271A' (as shown in the image 399' in FIG. 4B); while in other aspects the one or more image sensor 270 may be positioned radially outward (e.g., not viewing the substrate S through the central aperture 400—see, e.g., FIGS. 13A-13D) of the foreground controlled contrast surface 271A' for imaging the edge SE of the substrate and the reflection of the foreground controlled contrast surface 271A' thereon.

The background controlled contrast surface 271B' in this aspect is illustrated as a disk that extends radially beyond the edge SE of the substrate so as to be in a field of view of the one or more image sensors 270; however, in other aspects, the background controlled contrast surface 271B' may have any suitable shape (segmented or continuous) and size so long as the background controlled contrast surface 271B' provides contrast to the reflection of the foreground controlled contrast surface 271A, 271A' on the bottom surface BS of the substrate S in the image 399, 399'.

Referring to FIGS. 2L-2R, other exemplary configurations of the imaging systems are illustrated where the field of view FOV of the image sensor 270 may be directed at a backside surface BS of the substrate S supported on the substrate holder 200A, 200B with the background formed by the contrast face disposed over the substrate S (e.g., on a frontside of the substrate, where the frontside is the side opposite the bottom), and/or at a frontside surface TS of the substrate S supported on the substrate holder 200A, 200B with the background formed by the contrast face disposed beneath the substrate S. For example, as will be described below, in one aspect, one or more of the contrast faces may be mounted to the transport arm so that the contrast face moves with the transport arm 180TA as a unit relative to the frame 130F. In one aspect, the contrast face forms a common background effecting edge detection of each substrate S of more than one substrate S simultaneously supported by the at least one substrate holder 200A, 200B. In one aspect, at least one contrast face is fixedly mounted to the frame 130F, and the contrast face effects the edge detection of the substrate S supported by the substrate holder 200A, 200B coincident with wafer linear traverse past the contrast face. In one aspect, the illumination source 271AL is mounted to the transport arm 180TA so that the illumination source 271AL moves with the transport arm as a unit relative to the frame 130F. In one aspect, the illumination source 271AL forms a common illumination effecting edge detection of each substrate S of more than one substrate S simultaneously supported by the at least one substrate holder 200A, 200B. In one aspect, the illumination source 271AL is fixedly mounted to the frame 130F, and the illumination source 271AL effects the edge detection of the substrate supported by the substrate holder 200A, 200B coincident with substrate linear traverse past the illumination source 271AL.

Figure 2N:
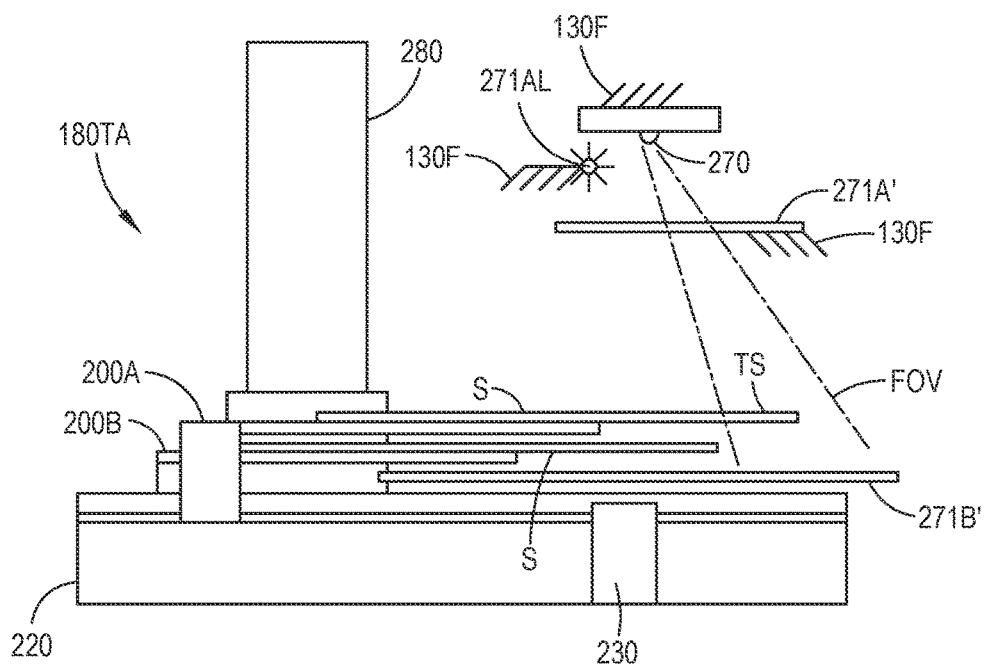
Figure 2O:
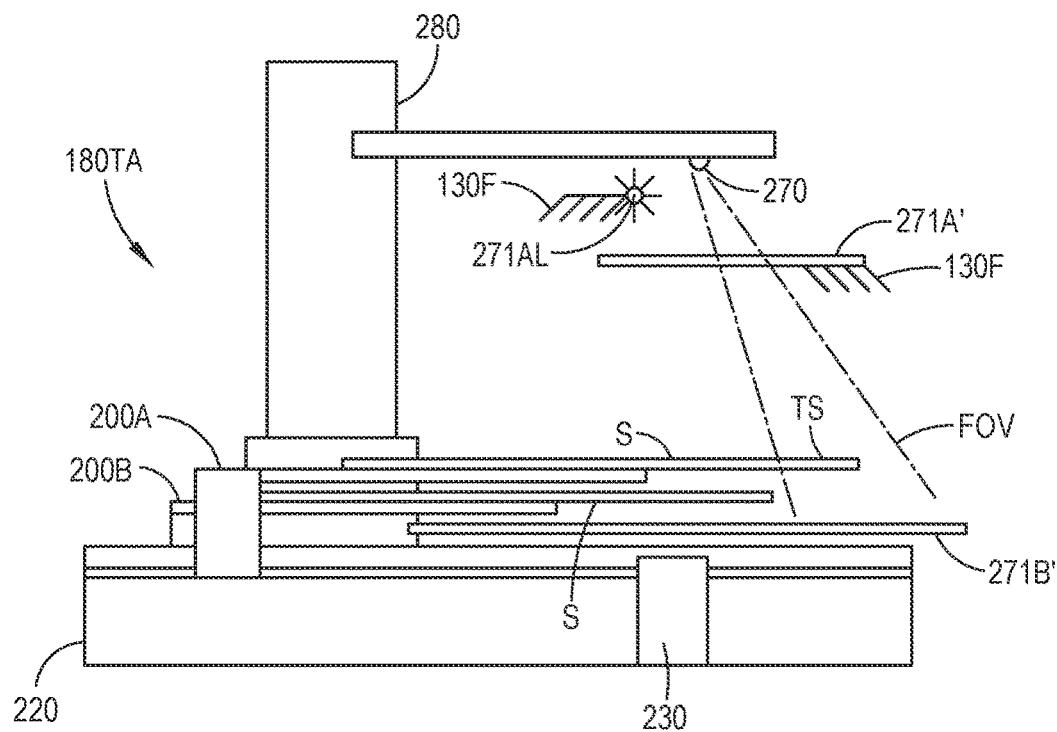
Figure 2P:
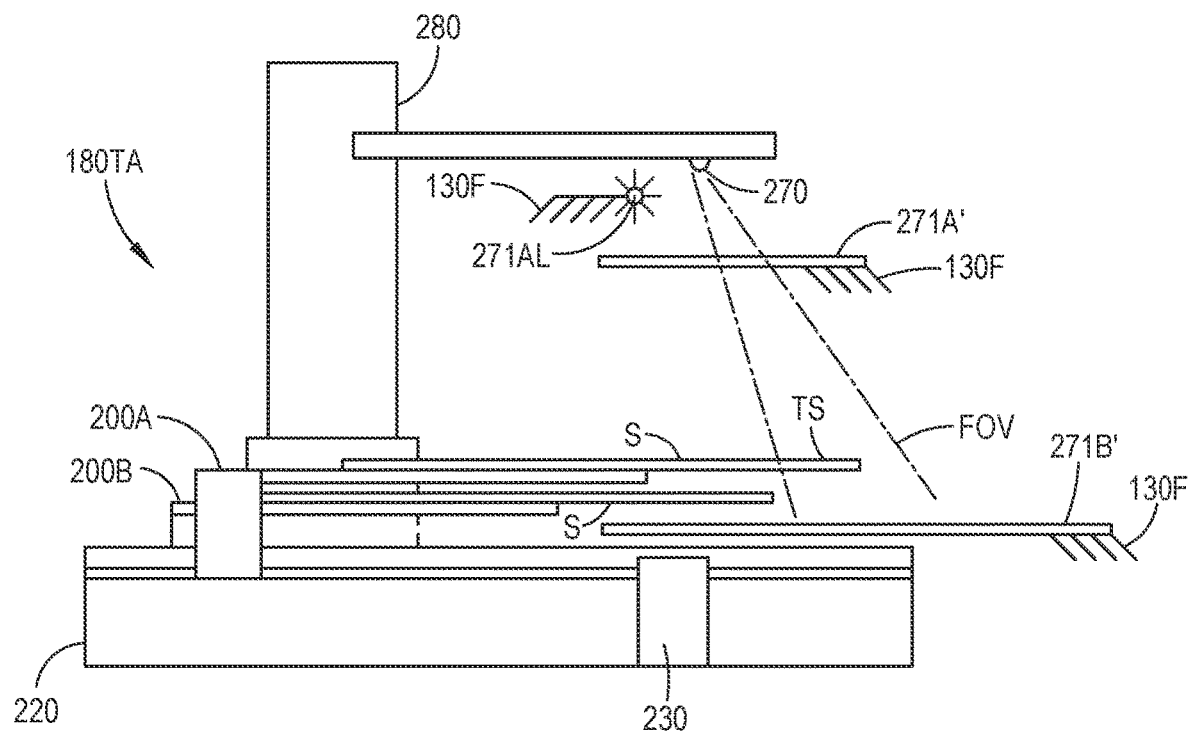
Figure 2Q:
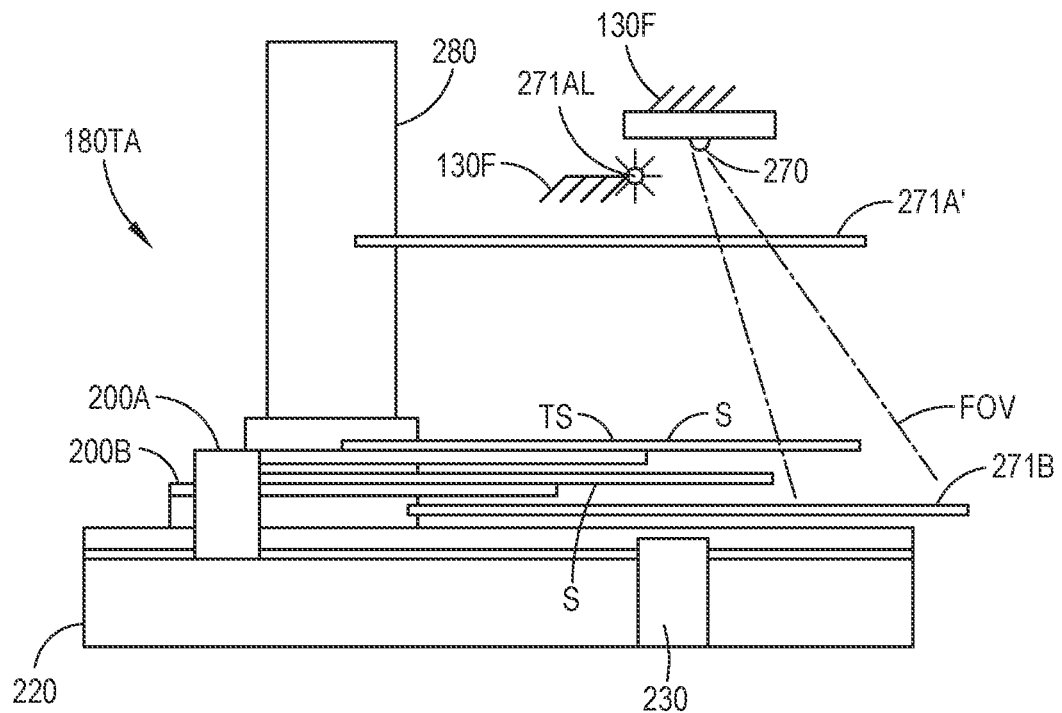
Figure 2R:
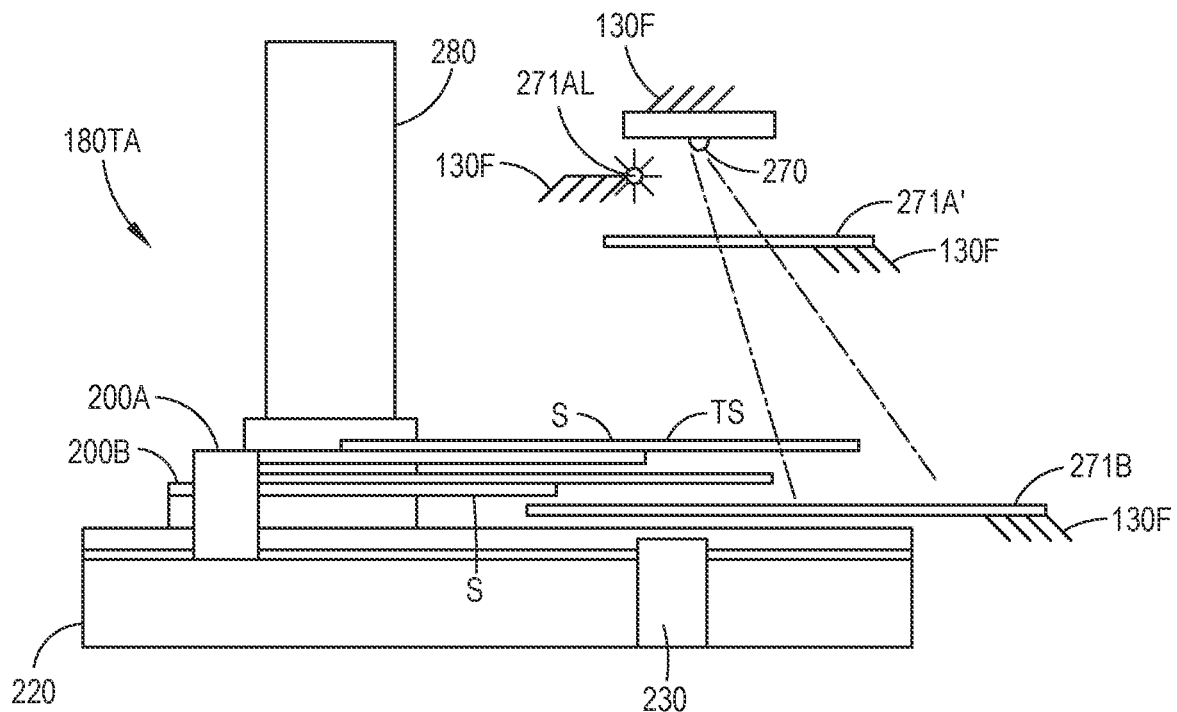
Figure 2S:
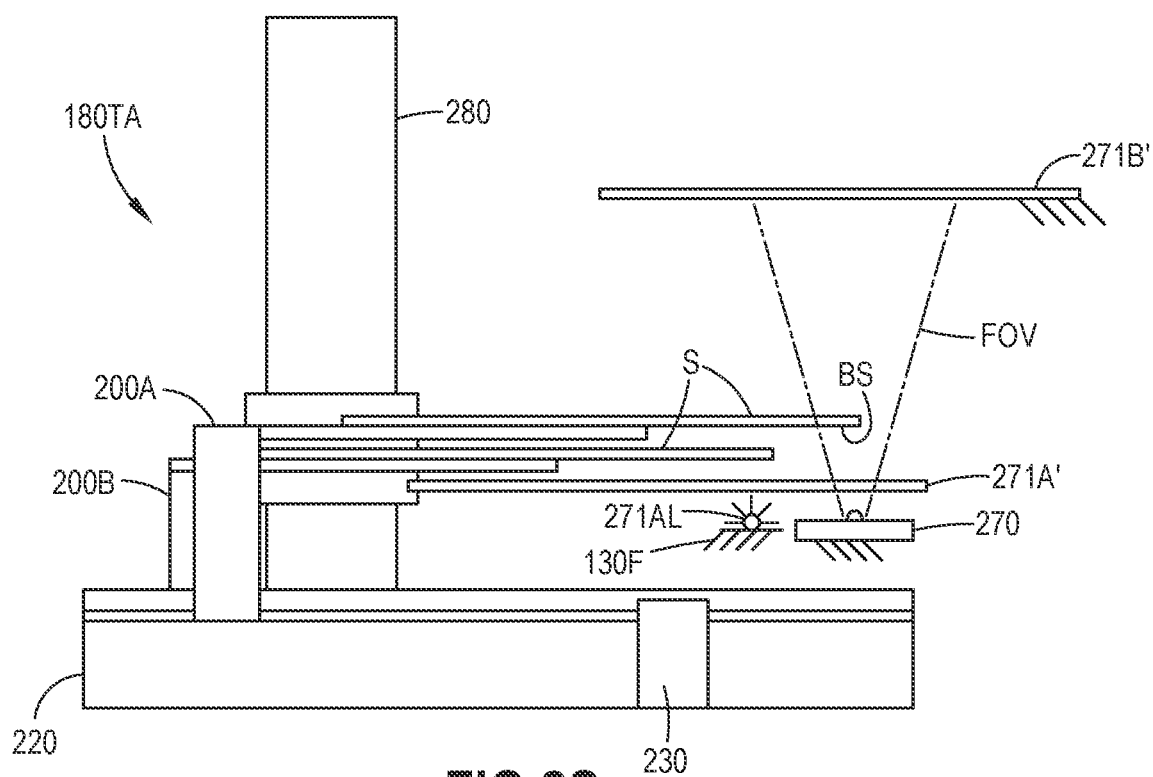
Figure 2T:
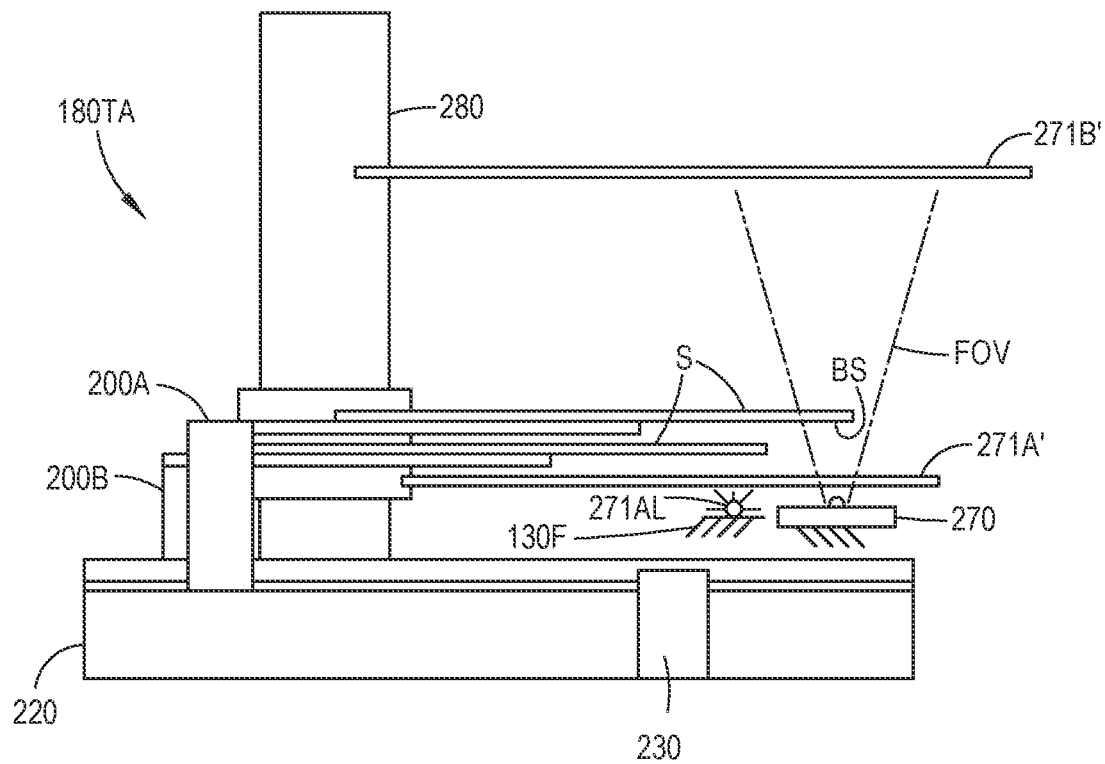
Figure 2U:
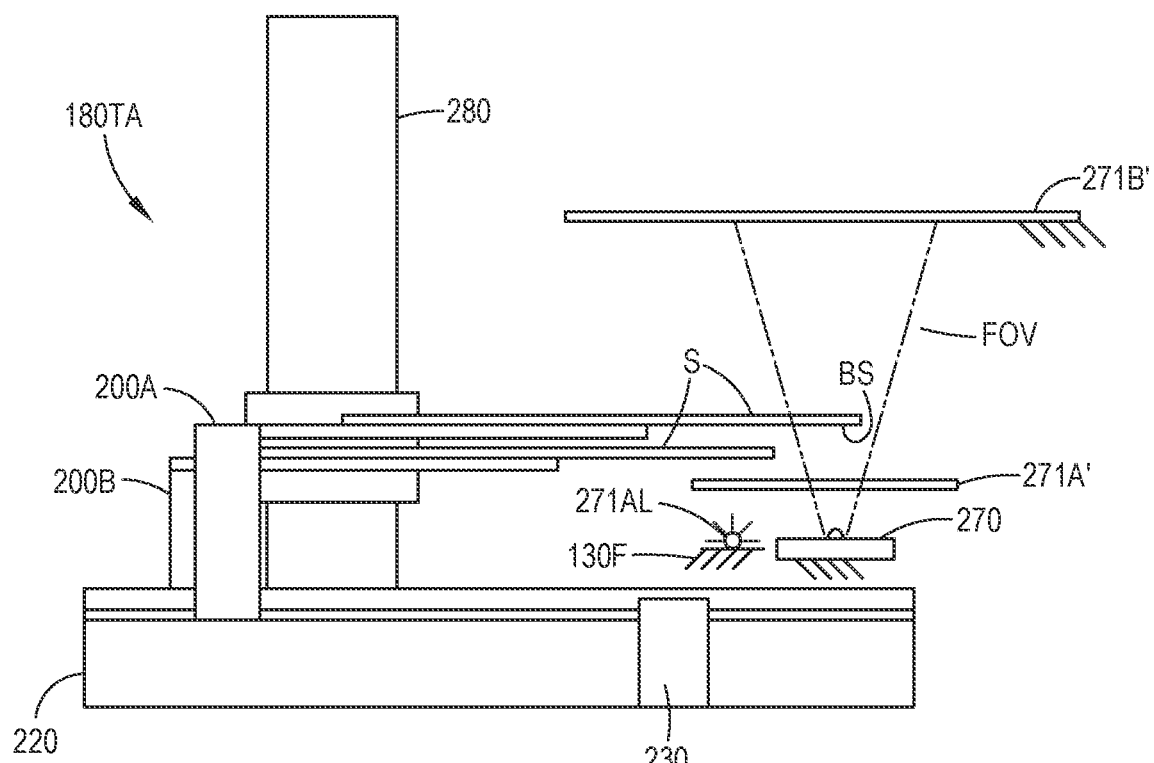
Figure 2V:
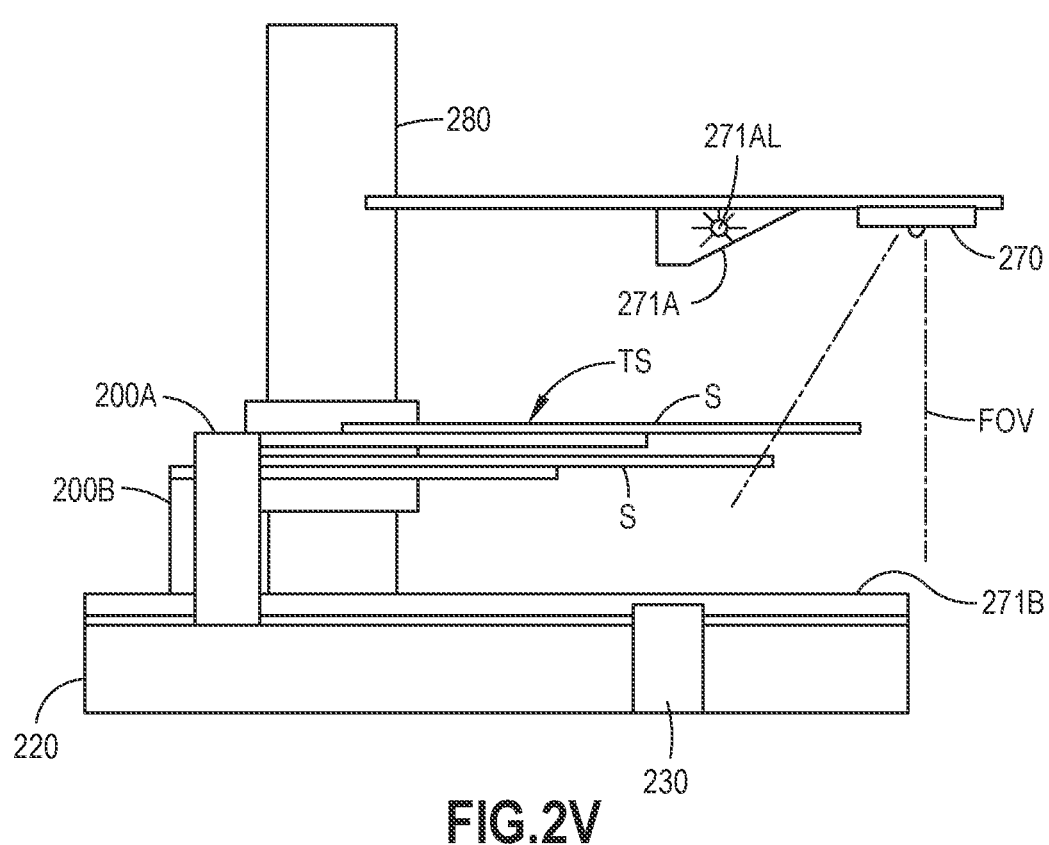
Figure 2W:
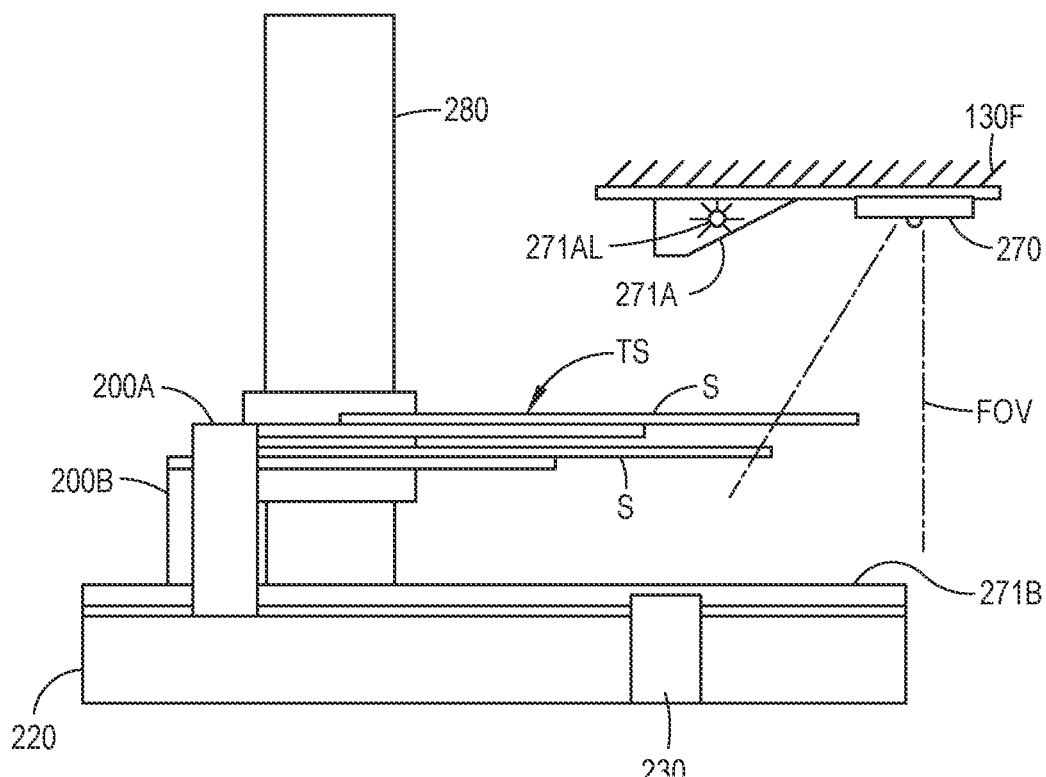
Figure 2X:
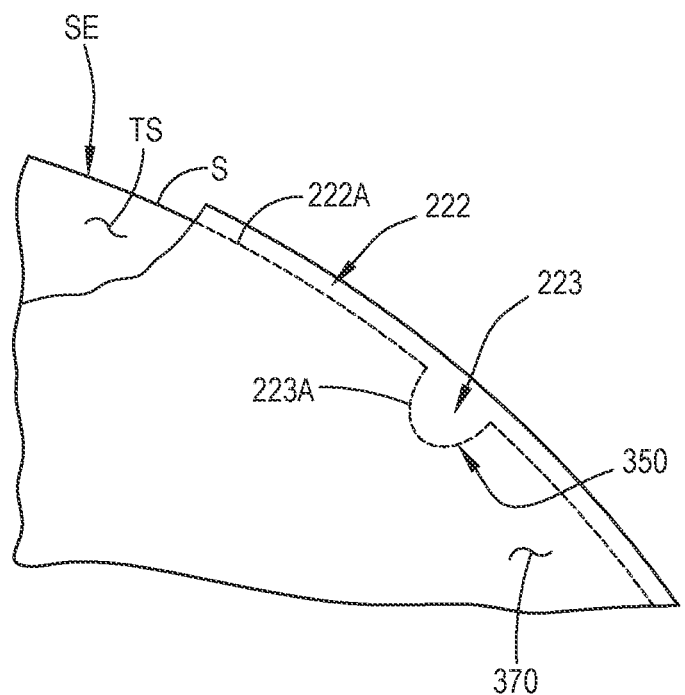
FIG. 2X is a schematic illustration of substrate feature artifacts in a molding material of a molded wafer that are detected in accordance with aspects of the present disclosure.

Referring to FIGS. 2N, 2Q, 2R, and 2W, in one aspect, the substrate transport 180 may be configured so that the image sensor 270 is fixed (so as to not move with the substrate transport 180) to the frame 130F and at least one contrast face is coupled to and moves with the transport arm 180TA. Here the image sensor 270 is fixedly mounted to the frame 130F and effects the edge detection of the substrate S supported by the substrate holder 200A, 200B coincident with substrate linear traverse through a field of view FOV of the image sensor 270. For example, FIG. 2N illustrates the image sensor 270 and the foreground controlled contrast surface 271A' being fixed to the frame 130F while the background controlled contrast surface 271B' is coupled to the transport arm 180TA (such as to the Z-drive column 280 or slide body 220) so as to move with the transport arm 180TA (in other aspects the foreground controlled contrast surface 271A' may be coupled to the transport arm 180TA such as shown in FIG. 2Q and the background controlled contrast surface 271B' may be fixed to the frame 130F such as shown in FIG. 2R). FIG. 2Q illustrates the image sensor 270 being fixed to the frame 130F while both the foreground controlled contrast surface 271A' and the background controlled contrast surface 271B' are coupled to the transport arm 180TA (such as to the Z-drive column 280 or slide body 220). FIG. 2R illustrates each of the image sensor 270, the foreground controlled contrast surface 271A', and the background controlled contrast surface 271B' being fixed to the frame 130F. FIG. 2W illustrates a configuration similar to that of FIG. 2A; however, in this aspect the image sensor 270 is disposed to image a frontside surface TS of the substrate rather than the bottom surface BS of the substrate. In FIG. 2W both the foreground controlled contrast surface 271A and the image sensor 270 are fixed to the frame 130F while the background controlled contrast surface 271B is fixed to the transport arm 180TA (in this case the background controlled contrast surface 271B may be formed by the slide body 220). As may be realized, imaging system shown in FIGS. 2N, 2Q, 2R, and 2W are configured for imaging the frontside surface TS of the substrates S; however, in other aspects the imaging system may be configured for imaging the backside surface BS of the substrates S, such as by reversing the order of the image sensor 270, the foreground controlled contrast surface 271A', and the background controlled contrast surface 271B' as illustrated in FIGS. 2S-2U, 12A-12D, and 13A-13D.

In other aspects, referring to FIGS. 2L, 2M, 2O, 2P, and 2V the image sensor 270 may be coupled to and move with the transport arm 180TA and at least one contrast face is fixed to the frame 130F, where the image sensor 270 is disposed for imaging the bottom surface BS of the substrates S (see FIGS. 2L and 2M) and/or the frontside surface TS of the substrates S (see FIGS. 2O and 2P). For example, FIG. 2L illustrates the image sensor 270 mounted to the slide body 220 while both the foreground controlled contrast surface 271A' and the background controlled contrast surface 271B' are fixed to the frame 130F. FIG. 2M illustrates the image sensor 270 and the foreground controlled contrast surface 271A mounted to the slide body 220 while the background controlled contrast surface 271B' is fixed to the frame 130F. FIG. 2O illustrates the image sensor 270 and the background controlled contrast surface 271B' mounted to the Z-drive column 280 (noting the background controlled contrast surface 271B' may be mounted to the slide body 220) while the foreground controlled contrast surface 271A' is fixed to the frame 130F. FIG. 2P illustrates the image sensor 270 mounted to the Z-drive column 280 while both the foreground controlled contrast surface 271A' and the background controlled contrast surface 271B' are fixed to the frame 130F. FIG. 2V illustrates a configuration similar to that of FIG. 2A; however, in this aspect the image sensor 270 is disposed to image a frontside surface TS of the substrate rather than the bottom surface BS of the substrate. In FIG. 2V both the foreground controlled contrast surface 271A and the image sensor 270 are fixed to the Z-drive column 280 while the background controlled contrast surface 271B is fixed to the slide body 220 (in this case the background controlled contrast surface 271B may be formed by the slide body 220). In one aspect, when mounted to the Z-drive column 280 the one or more of the image sensor 270, background controlled contrast surface 271B, 271B', 271B", and the foreground controlled contrast surface 271A, 271A', 271A" mounted to the Z-drive column may be disposed as a fixed height (i.e., does not move in the Z direction); while in other aspects, the one or more of the image sensor 270, background controlled contrast surface 271B, 271B', 271B", and the foreground controlled contrast surface 271A, 271A', 271A" mounted to the Z-drive column may be disposed on a movable carriage so as to move in unison with or independent of the substrate holders 200A, 200B in the Z direction.

As may be realized, the aspects of the present disclosure illustrated in FIGS. 2K-2W are exemplary and in other aspects may be combined with each other in any suitable manner. In still other aspects, the image sensor 270, the foreground controlled contrast surface 271A, 271A', 271A", and the background controlled contrast surface 271B, 271B', 271B" may have any suitable arrangement for imaging the substrates S in the manner described herein.

Referring to FIGS. 2N-2R, 2V, 2W, 2X, 12A-12D, and 13A-13D, the image sensor 270 located for imaging the frontside surface TS of the substrate S may, such as in the back end process 170 image the molding material 370 (see FIG. 2X) on the frontside surface TS of the substrate S. Here, the image contrast provided by the illumination source 271AL, 271BL, the foreground controlled contrast surface 271A, 271A', 271A", and the background controlled contrast surface 271B, 271B', 271B" may be such that artifacts 222, 223 of the substrate S are identified through the molding material 370. For example, in one aspect, the molding material 370 may include raised portions and/or depressed portions 222A that correspond with the peripheral edge SE of the substrate S, such as where the molding material transitions outward of the frontside surface TS of the substrate S forming an artifact 222 that follows a contour/shape of the peripheral edge SE. Similarly, the molding material 370 may include raised portions and/or depressed portions 223A that correspond with the notch 350 of the substrate S, such as where the molding material transitions outward of the frontside surface TS and into the notched area of the substrate S forming an artifact 223 that conforms to a contour/shape of the notch 350. The illumination of the substrate S (illumination of either the frontside surface TS or the backside surface BS directly or by reflection from a contrast face) by the illumination source 271AL, 271BL causes varying contrast (e.g., lines of shadow and brightness) that corresponds with the raised portions and/or depressed portions 222A, 223A where the image sensor 270 and controller 199 are configured to identify the varying contrast and the corresponding peripheral edge SE and/or notch 350.

In another aspect, the artifacts 222, 223 may be produced by a translucency of the molding material 370 where the portions of the molding material 370 not bonded to the frontside surface TS of the substrate S (such as the molding material 370 filling the notch 350 and the molding material 370 extending beyond the peripheral edge SE) appear lighter (e.g., such as when backlight by illumination source 271AL, 271BL) compared to the portions of the molding material 370 bonded to the frontside surface TS. The illumination of the substrate S (illumination of either the frontside surface TS or the backside surface BS directly or by reflection from a contrast face) by the illumination source 271AL, 271BL causes varying contrast (e.g., bright and dark portions of the translucent molding material 370 similar to the contrast between the molding material 370 and the substrate S shown in FIG. 3A) where the image sensor 270 and controller 199 are configured to identify the varying contrast and the corresponding peripheral edge SE and/or notch 350.

As noted above, the one or more image sensors 270 (and the imaging system) may be calibrated differently (e.g., calibrated in a reference frame of the substrate transport or calibrated in a global reference frame) depending on whether the one or more image sensors 270 are mounted to the transport arm 180TA or fixed to the frame 130F. Where, for example, the one or more image sensors 270 are mounted to the transport arm 180TA the one or more image sensors 270 (and the imaging system) may be calibrated to identify the one or more predetermined characteristics of the substrate S in a reference frame of the substrate transport 180, where any suitable controller 199 transforms the substrate S information (e.g., location of the notch, substrate offset, substrate centerline, etc., such as described with respect to FIG. 6A) as necessary into a global reference frame of the substrate processing apparatus 100, 150, 165 for placing (e.g., automatic substrate centering according to any suitable automatic substrate centering algorithm such as described below) substrates S at substrate holding locations of the substrate processing apparatus 100, 150, 165. Where, for example, the one or more image sensors 270 are fixed to the frame 130F the one or more image sensors 270 (and the imaging system) may be calibrated to identify the one or more predetermined characteristics of the substrate S in a global reference frame of the substrate processing apparatus 100, 150, 165, where any suitable controller 199 transforms the substrate S information (e.g., location of the notch, substrate offset, substrate centerline, etc., such as described with respect to FIG. 6A) as necessary into the substrate transport reference frame for placing (e.g., automatic substrate centering according to any suitable automatic substrate centering algorithm such as described below) substrates S at substrate holding locations of the substrate processing apparatus 100, 150, 165.

Figure 5A:
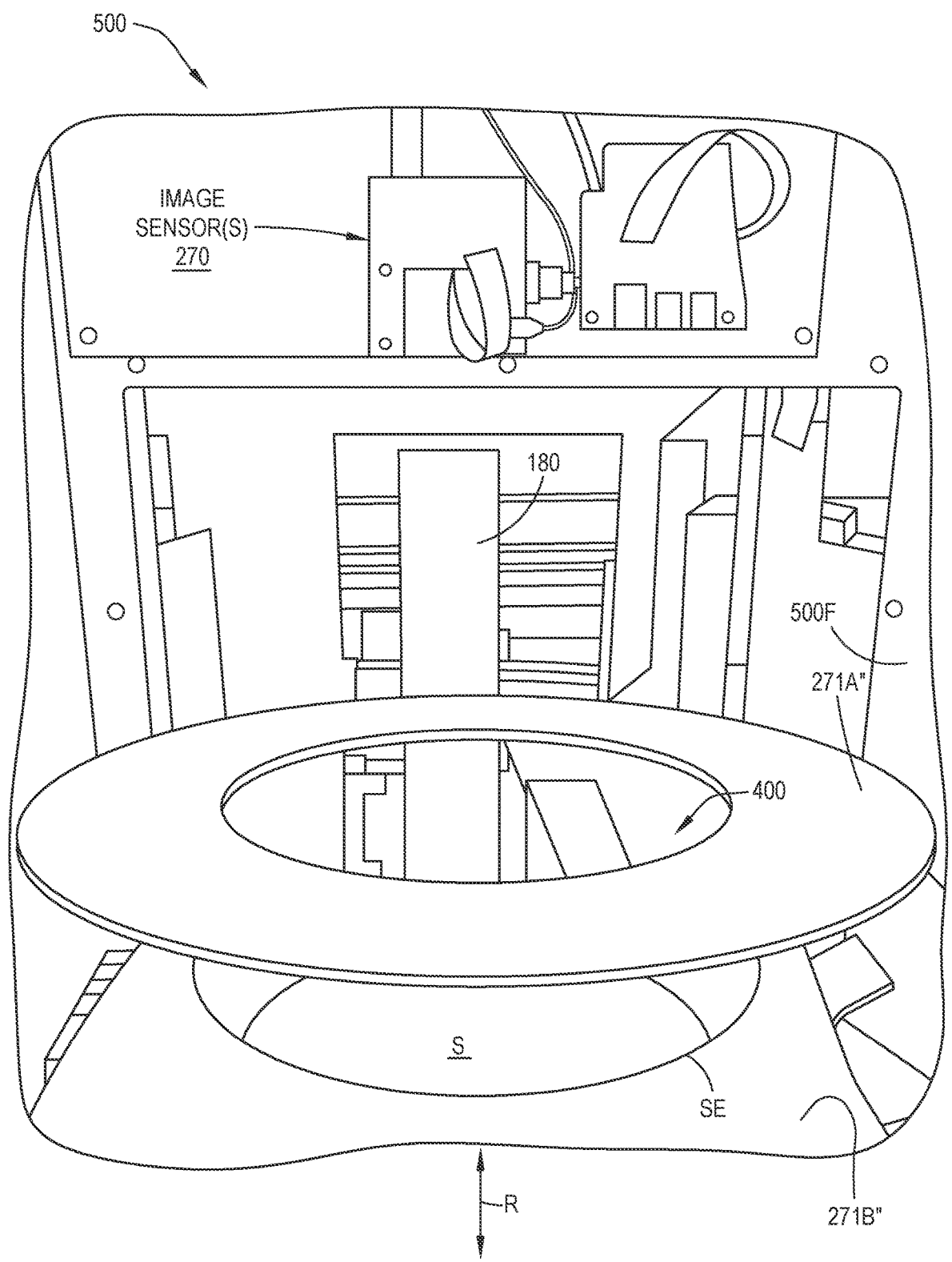
FIG. 5A is a schematic illustration of a portion of an aligner of FIGS. 1A and 1B incorporating aspects of the present disclosure.
Figure 5B:
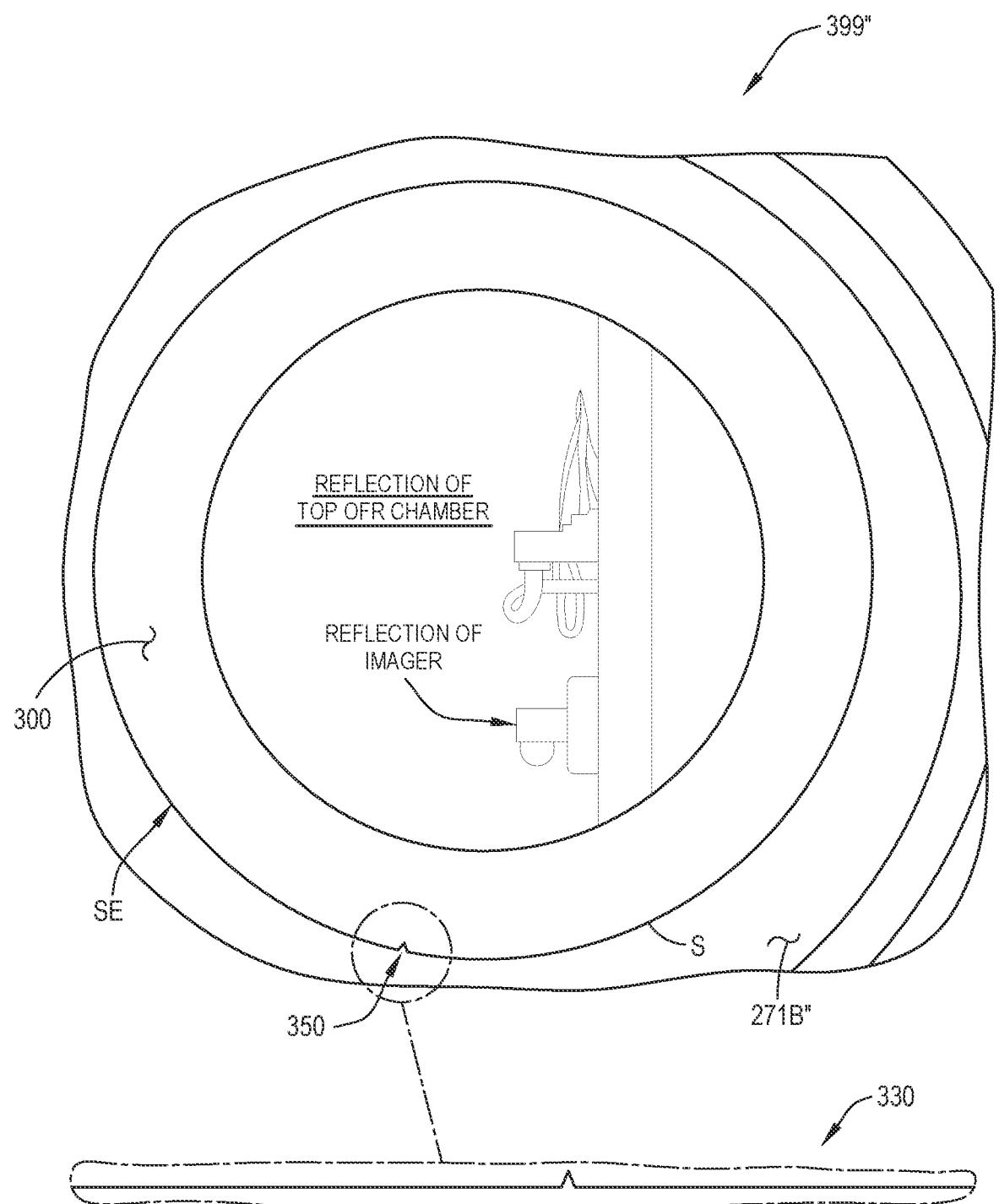
FIG. 5B is a schematic illustration of a portion of a substrate as seen through an imager of the aligner of FIG. 5A in accordance with aspects of the present disclosure.

Referring to FIGS. 5A and 5B, a substrate alignment station 500 is illustrated. The substrate alignment station 500 includes foreground controlled contrast surface 271A" and background controlled contrast surface 271B" mounted to a frame 500F of the substrate alignment station 500. The foreground controlled contrast surface 271A" and the background controlled contrast surface 271B" may be substantially similar to foreground controlled contrast surface 271A, 271A' and background controlled contrast surface 271B, 271B' described above and are configured to provide contrast in an image 399" obtained by the one or more image sensors 270 in a manner substantially similar to that described above. Here, the one or more image sensors 270 and the foreground controlled contrast surface 271A" are disposed above the substrate S and the background controlled contrast surface 271A" is disposed below the substrate S (i.e., the substrate alignment station 500 is configured to image a frontside surface TS of the substrate S in the front end of line process 140); but, in other aspects, the one or more image sensors 270 and the foreground controlled contrast surface 271A" are disposed below the substrate S and the background controlled contrast surface 271A" is disposed above the substrate S (i.e., the substrate alignment station 500 is configured to image a bottom BS of the substrate S in the back end of line process 160).

Referring to FIGS. 2A, 2B, 3A-3C, 4B, 5B, 6A-6B, and 7, the images 399, 399', 399" taken by the one or more image sensors 270 are analyzed by any suitable controller such as, e.g., controller 199. The controller 199 is programmed with any suitable image processing software configured to identify at least one or more of an angle β of the notch 350 and a center SC of the substrate S relative to a predetermined reference frame, such as relative to a center point 600 of a substrate holding location of the substrate holder 200A, 200B and/or a centerline 601 of the substrate holder 200A, 200B. For exemplary purposes, identification of the angle β and/or center SC of the substrate S includes transforming the image 399, 399', 399" into polar coordinate space 330 (see FIGS. 3C, 5B, and 6B), template matching (see FIG. 3B), and/or measuring an intensity along the edge SE of the substrate S to identify the notch 350.

Figure 3B:
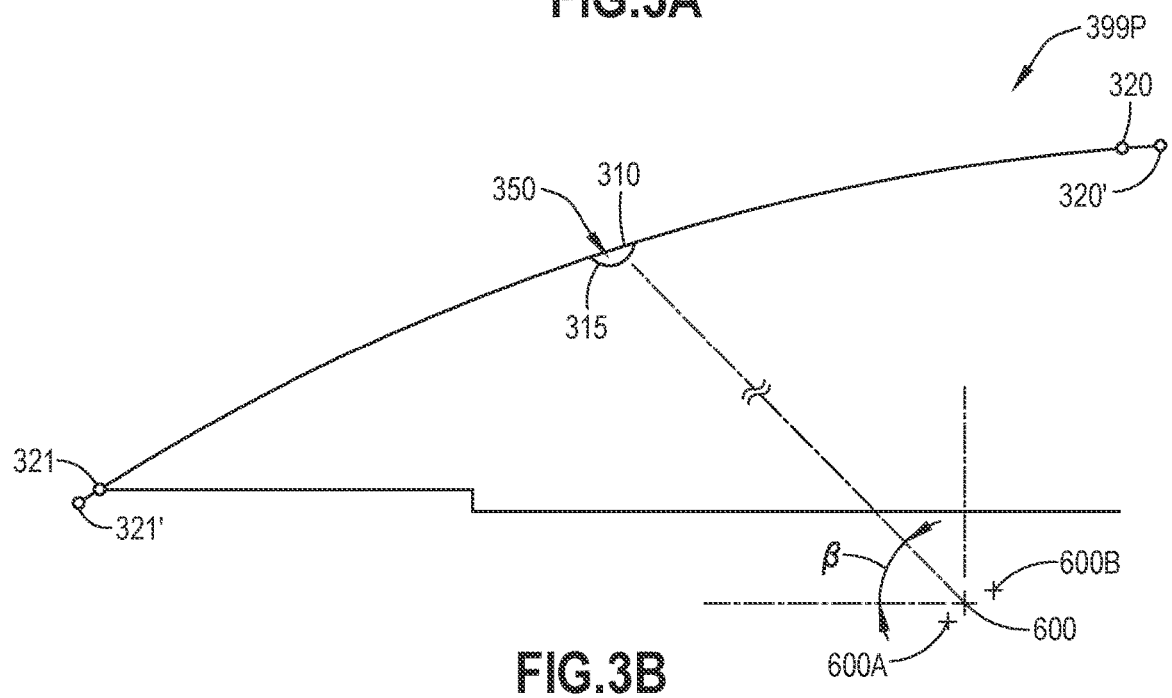
FIG. 3B is a schematic illustration of a processed image of the portion of the substrate shown in FIG. 3A in accordance with aspects of the present disclosure.
Figure 3C:
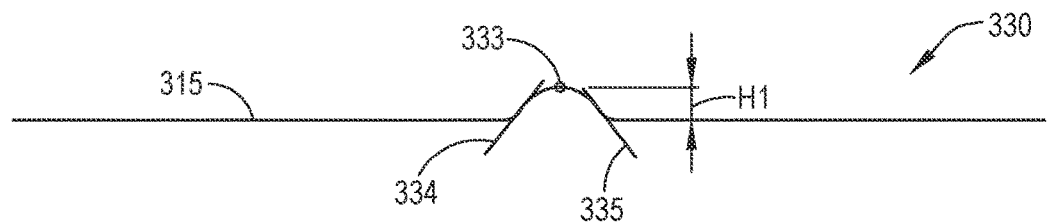
FIG. 3C is a schematic illustration of the processed image of FIG. 3B transformed into polar coordinate space in accordance with aspects of the present disclosure.

FIG. 3A illustrates an exemplary the image 399 (similar to images 399', 399") taken by the one or more image sensors 270. FIG. 3B illustrates a processed image 399P showing a template 310 of an edge (e.g., a projected substrate edge) a substrate based on a calibrated substrate radius (or diameter D) that is centered on, for example, the substrate holder 200A, 200B. The processed image 399P also illustrates an observed edge 315 of the substrate S, as obtained from the image 399, that is overlaid in the processed image 399P with the template 310. The controller 199 determines the points in the processed image 399P that belong to the observed edge 315 of the substrate S (FIG. 7, Block 700) and are not noise in the processed image 399P. To determine which points in the processed image 399P belong to the observed edge 315 of the substrate S, end points 320, 321 of curved defined by the observed edge 315 are determined. For explanatory purposes end point 320 will be referred to as the right boundary point and end point 321 will be referred to as the left boundary point.

To determine the location of the left and right boundary points 320, 321, the rightmost point 320' of the observed edge 315 and the leftmost point 321' of the observed edge 315 are used to calculate the center 600' of a circle using a radius that passes through both the rightmost point 320' the leftmost point 321'. The rightmost point 320' is held fixed along the observed edge 315 while the leftmost point 321' moves along the observed edge 315 towards the rightmost point 320' where the center 600A is calculated (e.g., using a radius that passes through both the fixed rightmost point 320' and each location of the moving leftmost point 321') for each move of the leftmost point 321'. The center points 600, 600A are compared and if the location of the center points 600, 600A relative to each other is outside a predetermined tolerance, then the points along the left side of the observed edge 315 are considered noise and are discarded until the center points 600, 600A become stable or converge on one another(i.e., the leftmost point 321' is moved towards the rightmost point 320' to a location along the observed edge 315 where the center points 600, 600A are within the predetermined tolerance from each other). The location of the leftmost point 321' at which the centers 600, 600A become stable (e.g., converge on one another) marks the leftmost boundary point 321 for a valid substrate edge in the processed image 399P.

The leftmost point 321' is held fixed along the observed edge 315 while the rightmost point 320' moves along the observed edge 315 towards the leftmost point 321' where the center 600B is calculated (e.g., using a radius that passes through both the fixed leftmost point 321' and each location of the moving rightmost point 320') for each move of the rightmost point 320'. The center points 600, 600B are compared and if the location of the center points 600, 600B relative to each other is outside the predetermined tolerance, then the points along the right side of the observed edge 315 are considered noise and are discarded until the center points 600, 600B become stable or converge on one another (i.e., the rightmost point 320' is moved towards the leftmost point 321' to a location along the observed edge 315 where the center points 600, 600B are within the predetermined tolerance from each other). The location of the rightmost point 320' at which the centers 600, 600B become stable marks the rightmost boundary point 320 for a valid substrate edge in the processed image 399P. In other aspects the boundary points 320, 321 may be determined in any suitable manner.

A substrate shift or offset XC, YC (FIG. 6A) is determined (FIG. 7, Block 710) by the controller 199 through a comparison between the detected substrate center 600 and a calibrated substrate holding location 660 of, e.g., the substrate holder 200A, 200B.

Figure 6A:
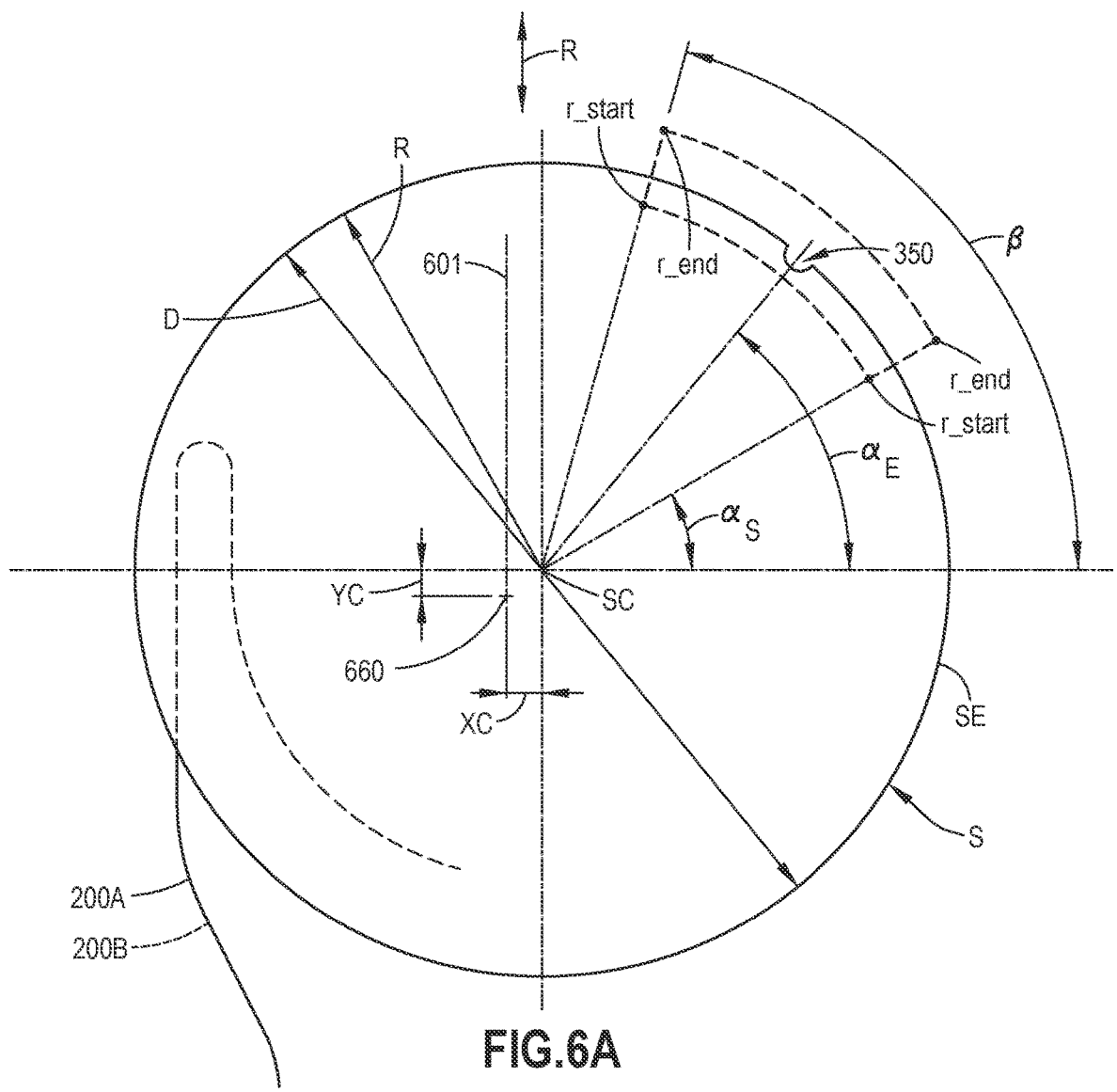
FIGS. 6A and 6B are respectively a schematic illustration of a substrate and a schematic illustration of a transformation of portion of the substrate into polar coordinate space in accordance with aspects of the present disclosure.
Figure 6B:
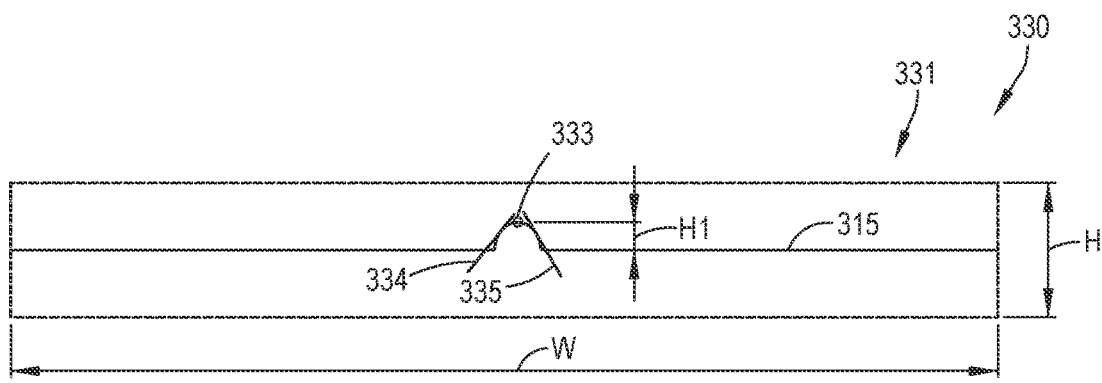
Figure 7:
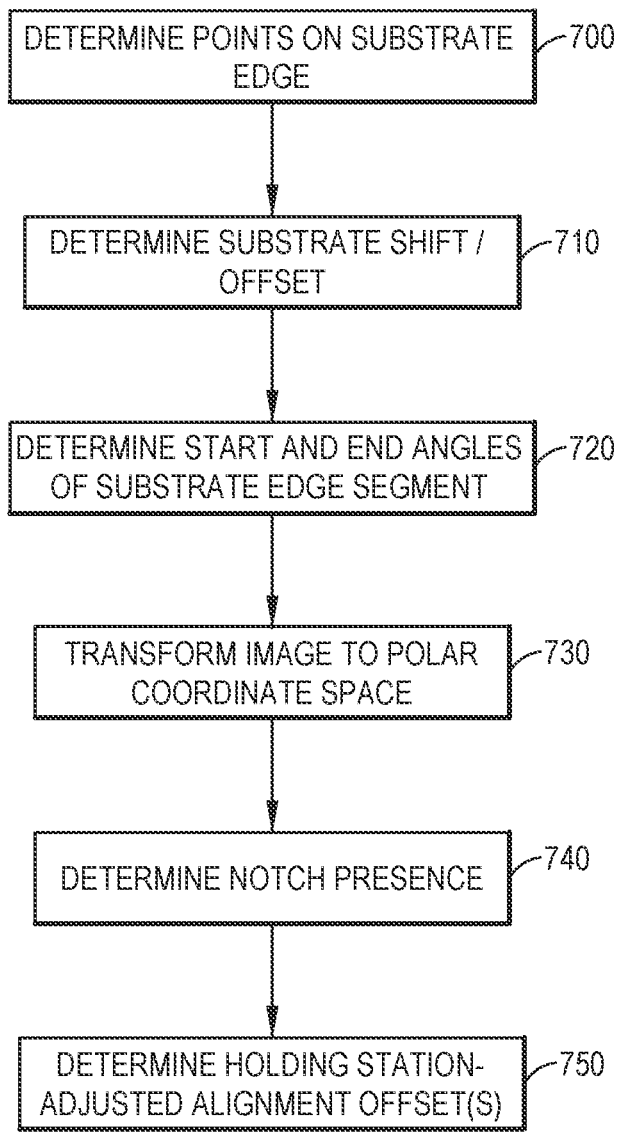
FIG. 7 is a flow diagram of a method in accordance with aspects of the present disclosure.

The start angle $\alpha_S$ and the end angle $\alpha_E$ of the arc segment formed by the observed edge 315 are determined (FIG. 7, Block 720) based on the rightmost boundary point 320 and the leftmost boundary point 321 (see FIGS. 3B and 6A) in any suitable manner. The processed image 399P is transformed into polar coordinate space 330 (FIG. 7, Block 730) in any suitable manner, such as by using a partial linear polar algorithm to translate the observed edge 315 to a substantially straight line. The partial linear polar algorithm is an extension of existing Cartesian-polar coordinate transformations, such as the "warpPolar" or "linearPolar" functions provided in the python™ programming language. By comparison, conventional Cartesian-polar coordinate transforms (such as the warpPolar and LinearPolar functions) map an input image to polar coordinates of a full 0-2π radian circle with a radius 0-$R_{max}$ (the radius being user defined), while the partial linear polar algorithm maps an input image to a subset of polar coordinates as shown in FIGS. 6A and 6B. In one aspect the transformation into polar coordinate space may be performed in a manner substantially similar to that described in U.S. Pat. No. 5,825,913 issued on Oct. 20, 1998 (entitled "System for Finding the Orientation of a Wafer), the disclosure of which is incorporated herein by reference in its entirety.

As an example, of the polar transformation, given the processed image 399P, which contains a portion of a circle (e.g., representing the edge SE of the substrate S), the start angle $\alpha_S$ and the end angle $\alpha_E$, the circle center point XC, YC, and the circle radius R map each (x', y') point in the processed image 399P to the corresponding (x, y) point in the polar space image 331, where:

$x'=r*\cos(\text{angle of point along observed edge 315})+XC$ and a width W of the polar space image 331 is determined by an input scale factor applied to the width of the angles $\alpha_S$, $\alpha_E$ provided as inputs, and $Y'=r*\sin(\text{angle of point along observed edge 315})+YC$ and a height H of the polar space image 331 is determined by an input scale factor applied to polar radius start and end points provided as inputs r_start and r_end.

The controller 199 may include any suitable detection algorithm for detecting/determining the presence of the notch 350 (FIG. 7, Block 740) in the polar space image 331 as well as the location of the notch 350. For exemplary purposes only, the controller 199 may analyze the polar space image 331 to determine the highest point 333, which is located at Xmax and Ymax. Starting from the highest point 333, the controller 199 is configured to measure a slope 334 of each point to the left of the highest point 333 up to, e.g., half the SEMI-standard notch width, stopping early if an end of the image is reached. If the measured slope 334 is outside of a predetermined range or tolerance from a function (e.g., equation) that describes a SEMI-standard notch shape, the controller 199 adds a value to an accumulated error variable. If the accumulated error variable is over an acceptable percentage of error points out of a total number of points observed, then the image does not contain a notch 350. The slopes of each measured point to the left of the highest point 333 are summed to determine how far (e.g., height H1) the highest point 333 is raised from the rest of the observed edge 315. If height H1 is not within a predetermined range or tolerance of a SEMI-standard notch depth, then the image does not contain a notch 350.

If it is determined from the analysis of the measured points on the left side of the highest point 333 that the image contains a notch 350, the points on the right side of the highest point 333 are analyzed to verify that a notch 350 indeed is present in the image. Starting from the highest point 333, the controller 199 is configured to measure a slope 335 of each point to the right of the highest point 333 up to, e.g., half the SEMI-standard notch width, stopping early if an end of the image is reached. If the measured slope 335 is outside of a predetermined range or tolerance from a function (e.g., equation) that describes a SEMI-standard notch shape, the controller 199 adds a value to an accumulated error variable. If the accumulated error variable is over an acceptable percentage of error points out of a total number of points observed, then the image does not contain the notch 350. The slopes of each measured point to the right of the highest point 333 are summed to determine how far (e.g., height H1) the highest point 333 is raised from the rest of the observed edge 315. If height H1 is not within a predetermined range or tolerance of a SEMI-standard notch depth, then the image does not contain a notch 350. If it is confirmed that the notch 350 exists based on the analysis of the measured points on the right side of the highest point 333, the angle β (see FIG. 6A) of the notch 350 in the processed image 399P with the following formula $$\beta=((X\max/W)*(\alpha_S-\alpha_E))+\alpha_S$$

The final station-adjusted alignment offsets are determined (FIG. 7, Block 750) in any suitable manner based on the wafer shift XC, YC, the measured notch angle β, and a desired notch angle. One suitable example of final station-adjusted alignment offset determination can be found in U.S. Pat. No. 7,925,378 issued on Apr. 12, 2011; U.S. Pat. No. 10,134,623 issued on Nov. 20, 2018; and U.S. patent application Ser. No. 16/257,595 filed on Jan. 25, 2019 (entitled "Automatic Wafer Centering Method and Apparatus"), the disclosures of which are incorporated herein by reference in their entireties.

Figure 8:
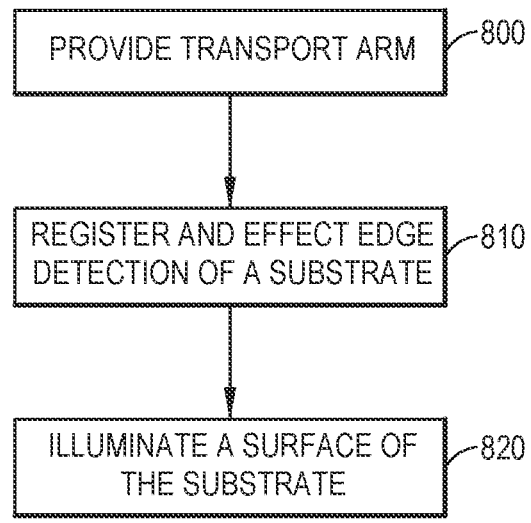
FIG. 8 is a flow diagram of a method in accordance with aspects of the present disclosure.

Referring to, for example, FIGS. 2A-2U and 8, a method for detecting a peripheral edge SE of a substrate S will be described. A transport arm 180TA is provided (FIG. 8, Block 800) and is movably mounted to the frame 130F. The transport arm 180TA has at least one substrate holder 200A, 200B movably mounted to the transport arm 180TA so that the at least one substrate holder 200A, 200B traverses linearly relative to the frame 130F. An image sensor 270 coupled to the transport arm 180TA registers and effects edge detection of a substrate S (FIG. 8, Block 810) supported by the at least one substrate holder 200A, 200B. An illumination source 271AL illuminates a surface of the substrate S, supported by the at least one substrate holder 200A, 200B, which surface delineates the peripheral edge SE of the substrate S. The illumination source 271AL is disposed with respect to the image sensor 270 so that the surface directs reflected surface illumination, from the illumination source 271AL, at the image sensor 270, and optically blanks, at the peripheral edge SE of the substrate S, background reflection light of a background, viewed by the image sensor coincident with linear traverse of the substrate S supported by the at least one substrate holder 200A, 200B. The peripheral edge SE of the substrate S is defined in relief in image contrast, formed by and between substrate surface reflection and the optically blanked background, registered by the image sensor 270 so as to effect edge detection coincident with linear traverse of the substrate supported by the at least one substrate holder 200A, 200B.

Figure 9:
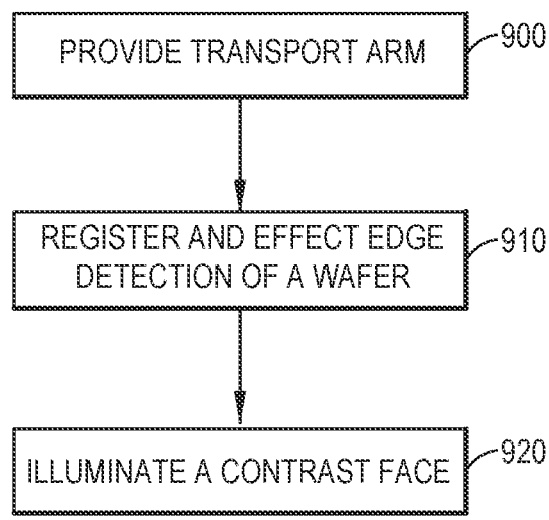
FIG. 9 is a flow diagram of a method in accordance with aspects of the present disclosure.

Referring to, for example, FIGS. 2A-2U and 9, a method for detecting a peripheral edge SE of a substrate S will be described. A transport arm 180TA is provided (FIG. 9, Block 900) and is movably mounted to the frame 130F. The transport arm 180TA has at least one substrate holder 200A, 200B movably mounted to the transport arm 180TA so that the at least one substrate holder 200A, 200B traverses linearly relative to the frame 130F. An image sensor 270 coupled to the transport arm 180TA registers and effects edge detection of a substrate S (FIG. 9, Block 910) supported by the at least one substrate holder 200A, 200B. An illumination source 271AL illuminates a contrast face (FIG. 9, Block 920) reflected from a surface of the substrate S, supported by the at least one substrate holder 200A, 200B, which surface delineates the peripheral edge SE of the substrate S. The contrast face is disposed with respect to the image sensor 270 so that the reflected contrast face directed from the surface at the image sensor 270 optically blanks, at the peripheral edge SE of the substrate S, background light reflection from the surface of the substrate S viewed by the image sensor 270 coincident with linear traverse of the substrate S supported by the at least one substrate holder 200A, 200B. The peripheral edge SE of the substrate S is defined in relief in image contrast, formed by and between the reflected contrast face and a lighted background, registered by the image sensor 270 so as to effect edge detection coincident with linear traverse of the substrate S supported by the at least one substrate holder 200A, 200B.

Figure 14:
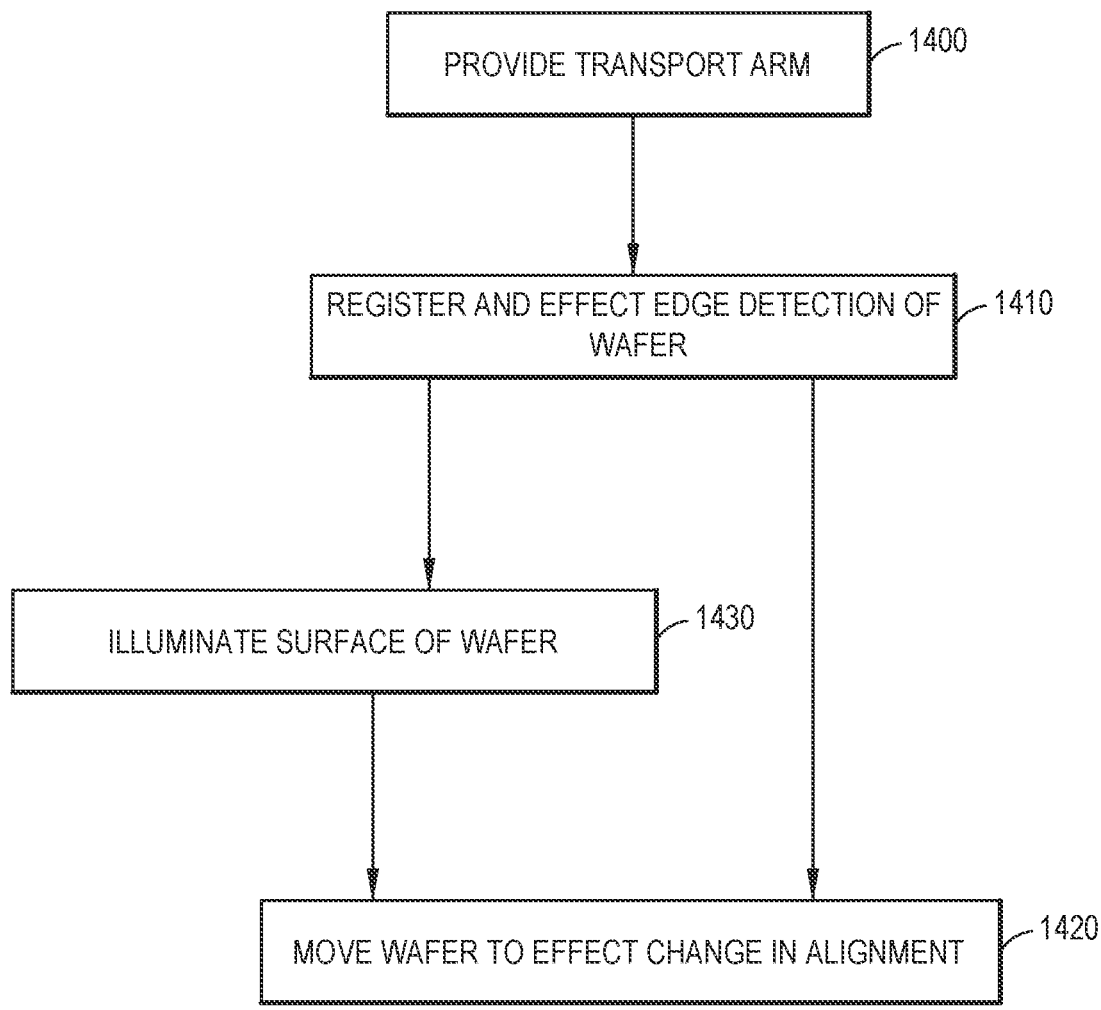
FIG. 14 is a flow diagram of a method(s) in accordance with aspects of the present disclosure.

Referring to FIGS. 2A-2U and 14, a method for aligning (e.g., on-the-fly alignment) a wafer S is provided. The method includes providing a transport arm 180TA (FIG. 14, Block 1400) movably mounted to the frame 130F. The transport arm 180TA has at least one end effector 200A, 200B movably mounted to the transport arm 180TA so that the at least one end effector 200A, 200B traverses linearly relative to the frame 130F. The method includes registering and effecting, with an optical edge detection sensor 270 coupled to the transport arm 180TA, edge detection of a wafer S (FIG. 14, Block 1410) supported by the at least one end effector 200A, 200B with the wafer S in a first position with respect to a predetermined reference location (such as any suitable substrate holding station, where the first position may be a misaligned position relative to the substrate holding station). The wafer S is moved, at least in part with the transport arm 180TA, so as to effect a change in alignment of the wafer S (FIG. 14, Block 1420) with respect to the predetermined reference location from the first (misaligned) position to a second position based on edge detection data from the optical edge detection sensor 270 (where the second position is a position of the wafer S aligned with the, e.g., substrate holding station so as to place the wafer S at the substrate holdings station in a predetermined position and orientation at the substrate holding station). Here, the edge detection data is generated by illuminating (as described herein), with an illumination source 271AL, 271BL connected to the frame 130F, a surface of the wafer (FIG. 14, Block 1430), supported by the at least one end effector 200A, 200B, which surface delineates a peripheral edge SE of the wafer S, the illumination source 271AL, 271BL being disposed with respect to the optical edge detection sensor 270 so that the surface directs reflected surface illumination, from the illumination source 271AL, 271BL, at or towards the optical edge detection sensor 270, and optically blanks, at the peripheral edge SE of the wafer S, background reflection light of a background, viewed by the optical edge detection sensor 270 coincident with linear traverse of the wafer S supported by the at least one end effector 200A, 200B. The peripheral edge SE of the wafer S is defined in relief in image contrast (as described herein), formed by and between wafer surface reflection and the optically blanked background, registered by the optical edge detection sensor 270 so as to effect edge detection coincident with linear traverse of the wafer S supported by the at least one end effector 200A, 200B.

Still referring to FIGS. 2A-2U and 14, a method for aligning (e.g., on-the-fly alignment) a wafer S is provided. The method includes providing a transport arm 180TA (FIG. 14, Block 1400) movably mounted to the frame 130F and having at least one end effector 200A, 200B movably mounted to the transport arm 180TA so that the at least one end effector 200A, 200B traverses linearly relative to the frame 130F. The method also includes registering and effecting, with an optical edge detection sensor 270 coupled to the transport arm 180TA, edge detection of a wafer S (FIG. 14, Block 1410) supported by the at least one end effector 200A, 200B, wherein edge detection data from the optical edge detection sensor 270 is determinative of wafer alignment data communicated to the transport arm 180TA (such as by controller 199 or any other suitable controller). A surface of the wafer S is illuminated (FIG. 14, Block 1430), with an illumination source 271AL, 271BL connected to the frame 130F, the wafer S being supported by the at least one end effector 200A, 200B, which surface delineates a peripheral edge SE of the wafer S. The illumination source 271AL, 271BL being disposed with respect to the optical edge detection sensor 270 so that the surface directs reflected surface illumination, from the illumination source 271AL, 271BL, at or towards the optical edge detection sensor 270, and optically blanks, at the peripheral edge SE of the wafer S, background reflection light of a background, viewed by the optical edge detection sensor 270 coincident with linear traverse of the wafer S supported by the at least one end effector 200A, 200B. The peripheral edge SE of the wafer S is defined in relief in image contrast (as described herein) , formed by and between wafer surface reflection and the optically blanked background, registered by the optical edge detection sensor 270 so as to effect edge detection coincident with linear traverse of the wafer S supported by the at least one end effector 200A, 200B.

Figure 10A:
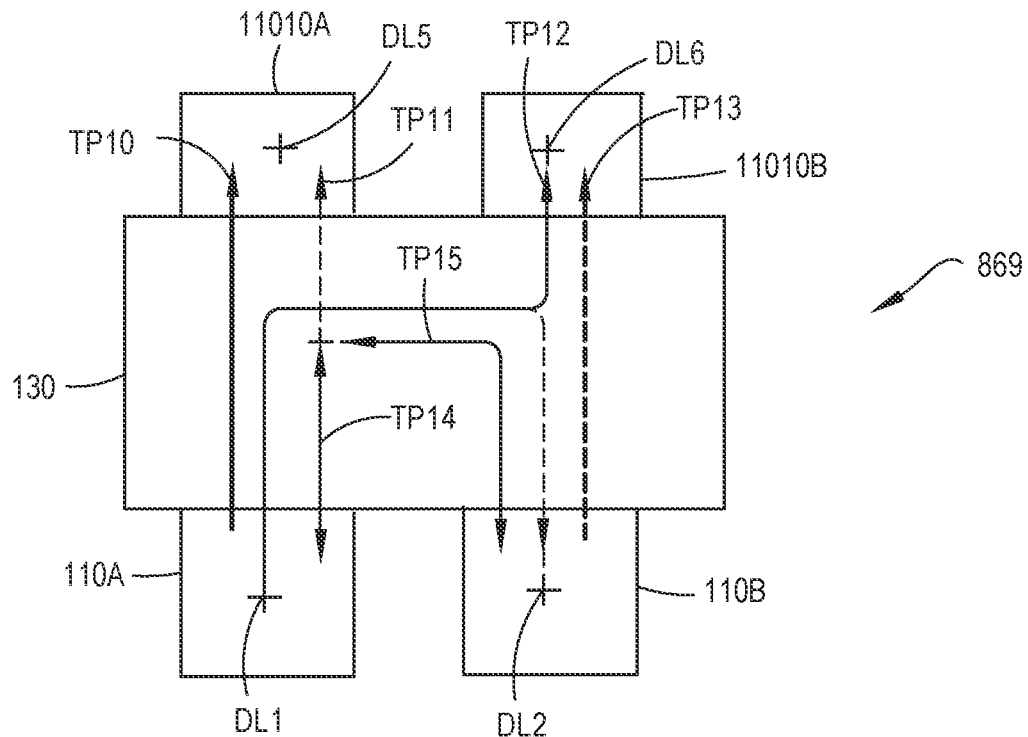
FIG. 10A is a schematic illustration of an exemplary processing system in accordance with aspects of the present disclosure.
Figure 10B:
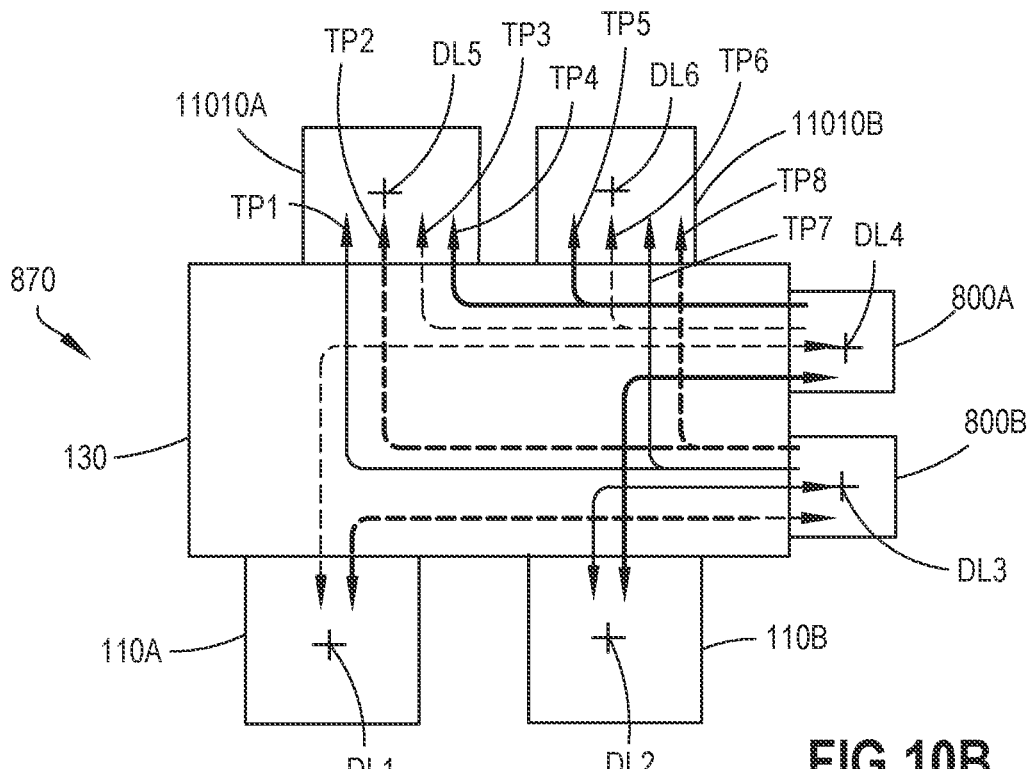
FIG. 10B is a schematic illustration of an exemplary conventional processing system.

Referring to FIGS. 2A-2U, 10A and 10B, as may be realized, an advantage for on-the-fly alignment as described herein relates to a significantly reduced time that each substrate S spends in, for example, a transfer chamber 130 (such as an EFEM or other suitable transfer chamber) while being sorted, aligned and/or identified. This time reduction is related to the higher throughput rate achievable with the on-the-fly alignment as described herein and/or a significant reduction in the time a given substrate spends away from the protective envelope provided by the substrate carrier 110. This advantage is especially evident for the common sort recipe that provides for the alignment and/or optical character recognition (OCR) read of all wafers in a given substrate carrier 110. For example, referring to FIG. 10B conventional systems 870 generally rely on dual fixed aligners 800A, 800B to achieve high overall throughput rates but this architecture results in more substrate travel distance, robotic motion, and elapsed time spent by each substrate in the minienvironment. For example, FIG. 10B illustrates conventional exemplary transfer paths for a transfer of substrates within a transfer chamber 130 for sorting, aligning and/or identification of the wafers. The substrate transfer paths TP1-TP8 are from a predetermined datum location DL1, DL2 within one of the substrate carriers 110A, 110B to a predetermined datum location DL3, DL4 in one of the fixed aligners 800A, 800B and then to a predetermined datum location DL5, DL6 in one of the load locks 11010A, 11010B or back to the predetermined datum location DL1, DL2 within one of the substrate carriers 110A, 110B. In comparison, referring to FIG. 10A, wafer transport paths TP10-TP13, of a system 869 (substantially similar to the substrate processing apparatus 100, 150, 165 described above—see FIGS. 1A-1C) are illustrated in accordance with aspects of the present disclosure, for a transfer of substrates within a transfer chamber 130 for sorting, aligning and/or identification of the substrates S. As can be seen in FIG. 10A any one of the transfer paths TP1O-TP15 is shorter in length than any one of the conventional transfer paths TP1-TP8 shown in FIG. 10B. As may be realized, the transfer paths TP14, TP15 where the substrates S are sorted and placed back in the substrate carrier from which they were picked or an adjacent substrate carrier at an adjacent load port are the shortest paths and are significantly shorter than corresponding paths illustrated in FIG. 10B from the substrate carriers 110A, 110B to one of the aligners 800A, 800B and then back to one of the substrate carriers 110A, 110B. For example, when sorting according to paths TP14, TP15 in FIG. 10A the substrate holders 200A, 200B sequentially pick substrates S (so that the substrates S are shuffled) from a common substrate carrier, such as substrate carrier 110A or substrate carrier 110B. As each substrate S is sequentially picked, during retraction of each substrate S from the substrate carrier 110A, 110B each substrate A passes by the image sensor 270 to detect the peripheral edges SE of the substrates S as described above. The substrates S are shuffled on the substrate transport 180 so that each substrate is sequentially aligned. The aligned substrates are placed in a predetermined sorted order into one or more of the substrate carriers 110A, 110B.

Referring to FIG. 11, the time the substrate(s) spend in the transfer chamber 130 is shorter within the system 869 than with the conventional system 870 using the twin fixed aligners 800A, 800B. For example, the table illustrated in FIG. 11 illustrates transfer operations, each having a specified transfer time, with respect to the conventional transfer/alignment system 870 of FIG. 10B (e.g. the "Conventional Transfer Times"). The table in FIG. 11 also illustrates the transfer operations, each having a specified transfer time, with respect to the transfer/alignment system 869 of FIG. 10A in accordance with the aspects of the present disclosure. As can be seen in the table the conventional transfer/alignment system 870 and the system 869 both include time associated with picking one or more substrates S from a substrate carrier 110A, 110B and time associated with placing one or more substrates S at a load lock 11010A, 11010B however, this is where the similarities in transfer time end. For example, rather than substantially directly transfer a substrate from a substrate carrier 110A, 110B to a substrate holding location (where the substrate holding location is one or more of a substrate carrier at the load port from which the substrate was taken, a different substrate carrier at an adjacent load port and a load lock) as is done within the system 869, the conventional system includes additional transfer time for transferring the substrate(s) to and from the predetermined datum location DL3, DL4 of one of the fixed aligners 800A, 800B. In addition, the conventional system 870 includes idle transfer time in which the substrate S is located within the aligner 800A, 800B and being aligned. This "alignment time" is substantially eliminated in the system 869 because the substrate(s) is/are aligned during transfer, while the substrate(s) are located on the substrate holder(s) 200A, 200B of the substrate transport 180, between predetermined datum location DL1, DL2 and predetermined datum location DL5, DL6 (where the substrates are transferred to a load lock) and predetermined datum location DL1, DL2 (where the substrates are returned to the substrate carrier(s) such as during sorting). In addition, even if the wafers are aligned in the system 869 with the substrate transport holding the slide body 220 stationary (such as in front of a load lock 11010A, 11010B the time to transfer a substrate from a substrate holder 200A, 200B to the rotary chuck 260 (see FIG. 2I) is significantly less than the time to transfer a substrate from a conventional substrate holder to the fixed aligner 800A, 800B due to, for example, a shorter travel distance in the Z direction. For example, for performing substrate alignment and identification in accordance with the aspects of the present disclosure the rotary chuck 260 is moved from a fully lowered datum position CD (FIG. 2I) by a small amount Z1 in the Z direction (e.g. about 20 mm or less) and the substrate holder 200A, 200B is only partially extended in the R direction for transferring a substrate S between a substrate holder 200A, 200B and the rotary chuck 260. In contrast, a substrate transport without the on-the-fly alignment of the aspects of the present disclosure needs to impose much greater Z travel to transfer the substrate S from, for example, a predetermined wafer transfer plane the transport chamber 130 to a level of the wafer support surface of the fixed aligner 800A, 800B and must extend the substrate holder fully in the R direction while aligning, for example, a datum of the substrate holder with a datum DL3, DL4 of the aligner 800A, 800B through additional movement in one or more of the X, Y and θ axes.

As may be realized, the decreased wafer transfer times of the system 869 in accordance with the aspects of the present disclosure allows for a decreased elapsed time in which the door of the substrate carrier 110 is open. This reduced "carrier door open" time reduces, for example, contamination within the substrate carrier 110 from the atmospheric environment as well as provides increased inert gas protection for the inside of the substrate carrier 110 and the substrates S located therein. As may be realized, the reduced "carrier door open" time minimizes environmental changes and contamination within the substrate carrier 110 and also reduces inert gas restoration times (and the amount of inert gas needed for restoration) within the substrate carrier 110. Conversely, the environmental disturbance of the transport chamber 130 is also reduced. As can be seen from the above, the aspects of the present disclosure described herein not only provide for higher wafer throughput but also improved cleanliness and reduced environmental exposure of the substrates S.

In accordance with one or more aspects of the present disclosure a semiconductor wafer transport apparatus comprises:
 a frame;
 a transport arm movably mounted to the frame and having
  at least one end effector movably mounted to the transport arm so that the at least one end effector traverses linearly relative to the frame;

an optical edge detection sensor, coupled to the transport arm and configured so as to register and effect edge detection of a wafer supported by the at least one end effector; and an illumination source connected to the frame configured so as to illuminate a surface of the wafer, supported by the at least one end effector, which surface delineates a peripheral edge of the wafer, the illumination source being disposed with respect to the optical edge detection sensor so that the surface directs reflected surface illumination, from the illumination source, at or towards the optical edge detection sensor, and optically blanks, at the peripheral edge of the wafer, background reflection light of a background, viewed by the optical edge detection sensor coincident with linear traverse of the wafer supported by the at least one end effector;

wherein the peripheral edge of the wafer is defined in relief in image contrast, formed by and between wafer surface reflection and the optically blanked background, registered by the optical edge detection sensor so as to effect edge detection coincident with linear traverse of the wafer supported by the at least one end effector.

In accordance with one or more aspects of the present disclosure the end effector linearly traverses with the transport arm as a unit in a first direction, relative to the frame.

In accordance with one or more aspects of the present disclosure the end effector traverses linearly, relative to the transport arm, in a second direction.

In accordance with one or more aspects of the present disclosure the optical edge detection sensor is configured so that the edge detection of each wafer is effected by and coincident with the traverse in the second direction of each end effector of the at least one end effector on the transport arm.

In accordance with one or more aspects of the present disclosure the optical edge detection sensor is mounted to the transport arm so that the optical edge detection sensor moves with the transport arm as a unit relative to the frame.

In accordance with one or more aspects of the present disclosure the optical edge detection sensor is mounted to the transport arm so as to move with the transport arm as a unit relative to the frame, the optical edge detection sensor being a common sensor effecting edge detection of each wafer of more than one wafer simultaneously supported by the at least one end effector.

In accordance with one or more aspects of the present disclosure the optical edge detection sensor is fixedly mounted to the frame, and the optical edge detection sensor effects the edge detection of the wafer supported by the end effector coincident with wafer linear traverse through a field of view of the optical edge detection sensor.

In accordance with one or more aspects of the present disclosure the optical edge detection sensor is disposed so that a field of view of the optical edge detection sensor is directed at backside surface of the wafer supported by the end effector, and the background is over the wafer.

In accordance with one or more aspects of the present disclosure the optical edge detection sensor is disposed so that a field of view of the optical edge detection sensor is directed at frontside surface of the wafer supported by the end effector, and the background is beneath the wafer.

In accordance with one or more aspects of the present disclosure the semiconductor wafer transport apparatus further comprising a contrast face disposed in the background, and arranged so as to optically blank the background reflected light viewed by the optical edge detection sensor.

In accordance with one or more aspects of the present disclosure the contrast face is gray scale or is dark colored so as to form image contrast formed by and between the wafer surface reflection and the optically blanked background, registered by the optical edge detection sensor that defines in relief the peripheral edge.

In accordance with one or more aspects of the present disclosure the contrast face is mounted to the transport arm so that the contrast face moves with the transport arm as a unit relative to the frame.

In accordance with one or more aspects of the present disclosure the contrast face is mounted to the transport arm so as to move with the transport arm as a unit relative to the frame, the contrast face forming a common background effecting edge detection of each wafer of more than one wafer simultaneously supported by the at least one end effector.

In accordance with one or more aspects of the present disclosure the contrast face is fixedly mounted to the frame, and the contrast face effects the edge detection of the wafer supported by the end effector coincident with wafer linear traverse past the contrast face.

In accordance with one or more aspects of the present disclosure the illumination source comprises a backlit foreground contrast face.

In accordance with one or more aspects of the present disclosure the illumination source comprises a foreground contrast face and a light projector.

In accordance with one or more aspects of the present disclosure the illumination source is mounted to the transport arm so that the illumination source moves with the transport arm as a unit relative to the frame.

In accordance with one or more aspects of the present disclosure the illumination source is mounted to the transport arm so as to move with the transport arm as a unit relative to the frame, the illumination source forming a common illumination effecting edge detection of each wafer of more than one wafer simultaneously supported by the at least one end effector.

In accordance with one or more aspects of the present disclosure the illumination source is fixedly mounted to the frame, and the illumination source effects the edge detection of the wafer supported by the end effector coincident with wafer linear traverse past the illumination source.

In accordance with one or more aspects of the present disclosure a semiconductor wafer transport apparatus comprises:

a frame;

a transport arm movably mounted to the frame and having at least one end effector movably mounted to the transport arm so that the at least one end effector traverses linearly relative to the frame;

an optical edge detection sensor, coupled to the transport arm and configured so as to register and effect edge detection of a wafer supported by the at least one end effector; and an illumination source connected to the frame configured so as to illuminate a contrast face reflected from a surface of the wafer, supported by the at least one end effector, which surface delineates a peripheral edge of the wafer, the contrast face being disposed with respect to the optical edge detection sensor so that the reflected contrast face directed from the surface at or towards the optical edge detection sensor optically blanks, at the peripheral edge of the wafer, background light reflection from the surface of the wafer viewed by the optical edge detection sensor coincident with linear traverse of the wafer supported by the at least one end effector;

wherein the peripheral edge of the wafer is defined in relief in image contrast, formed by and between the reflected contrast face and a lighted background, registered by the optical edge detection sensor so as to effect edge detection coincident with linear traverse of the wafer supported by the at least one end effector.

In accordance with one or more aspects of the present disclosure the end effector linearly traverses with the transport arm as a unit in a first direction, relative to the frame.

In accordance with one or more aspects of the present disclosure the end effector traverses linearly, relative to the transport arm, in a second direction.

In accordance with one or more aspects of the present disclosure the optical edge detection sensor is configured so that the edge detection of each wafer is effected by and coincident with the traverse in the second direction of each end effector of the at least one end effector on the transport arm.

In accordance with one or more aspects of the present disclosure the optical edge detection sensor is mounted to the transport arm so that the optical edge detection sensor moves with the transport arm as a unit relative to the frame.

In accordance with one or more aspects of the present disclosure the optical edge detection sensor is mounted to the transport arm so as to move with the transport arm as a unit relative to the frame, the optical edge detection sensor being a common sensor effecting edge detection of each wafer of more than one wafer simultaneously supported by the at least one end effector.

In accordance with one or more aspects of the present disclosure the optical edge detection sensor is fixedly mounted to the frame, and the optical edge detection sensor effects the edge detection of the wafer supported by the end effector coincident with wafer linear traverse through a field of view of the optical edge detection sensor.

In accordance with one or more aspects of the present disclosure the optical edge detection sensor is disposed so that a field of view of the optical edge detection sensor is directed at backside surface of the wafer supported by the end effector, and the contrast face is beneath the wafer.

In accordance with one or more aspects of the present disclosure the optical edge detection sensor is disposed so that a field of view of the optical edge detection sensor is directed at frontside surface of the wafer supported by the end effector, and the contrast face is over the wafer.

In accordance with one or more aspects of the present disclosure the semiconductor wafer transport apparatus further comprises a background contrast face, forming at least in part the lighted background, disposed on an opposite side of the wafer from the contrast face.

In accordance with one or more aspects of the present disclosure the contrast face is gray scale or is dark colored so as to form image contrast formed by and between the reflected contrast face and the lighted background, registered by the optical edge detection sensor that defines in relief the peripheral edge.

In accordance with one or more aspects of the present disclosure the contrast face is mounted to the transport arm so that the contrast face moves with the transport arm as a unit relative to the frame.

In accordance with one or more aspects of the present disclosure the contrast face is fixedly mounted to the frame, and the contrast face effects the edge detection of the wafer supported by the end effector coincident with wafer linear traverse past the contrast face.

In accordance with one or more aspects of the present disclosure the illumination source is configured to backlight the contrast face.

In accordance with one or more aspects of the present disclosure the illumination source is mounted to the transport arm so that the illumination source moves with the transport arm as a unit relative to the frame.

In accordance with one or more aspects of the present disclosure the illumination source is mounted to the transport arm so as to move with the transport arm as a unit relative to the frame, the illumination source forming a common illumination effecting edge detection of each wafer of more than one wafer simultaneously supported by the at least one end effector.

In accordance with one or more aspects of the present disclosure the illumination source is fixedly mounted to the frame, and the illumination source effects the edge detection of the wafer supported by the end effector coincident with wafer linear traverse past the illumination source.

In accordance with one or more aspects of the present disclosure a method for detecting an edge of a wafer comprises:

providing a transport arm movably mounted to a frame and having at least one end effector movably mounted to the transport arm so that the at least one end effector traverses linearly relative to the frame;

registering and effecting, with an optical edge detection sensor coupled to the transport arm, edge detection of a wafer supported by the at least one end effector; and illuminating, with an illumination source connected to the frame, a surface of the wafer, supported by the at least one end effector, which surface delineates a peripheral edge of the wafer, the illumination source being disposed with respect to the optical edge detection sensor so that the surface directs reflected surface illumination, from the illumination source, at or towards the optical edge detection sensor, and optically blanks, at the peripheral edge of the wafer, background reflection light of a background, viewed by the optical edge detection sensor coincident with linear traverse of the wafer supported by the at least one end effector;

wherein the peripheral edge of the wafer is defined in relief in image contrast, formed by and between wafer surface reflection and the optically blanked background, registered by the optical edge detection sensor so as to effect edge detection coincident with linear traverse of the wafer supported by the at least one end effector.

In accordance with one or more aspects of the present disclosure the end effector linearly traverses with the transport arm as a unit in a first direction, relative to the frame.

In accordance with one or more aspects of the present disclosure the end effector traverses linearly, relative to the transport arm, in a second direction.

In accordance with one or more aspects of the present disclosure the edge detection of each wafer is effected by and coincident with the traverse in the second direction of each end effector of the at least one end effector on the transport arm.

In accordance with one or more aspects of the present disclosure the optical edge detection sensor is mounted to the transport arm so that the optical edge detection sensor moves with the transport arm as a unit relative to the frame.

In accordance with one or more aspects of the present disclosure the optical edge detection sensor is mounted to the transport arm so as to move with the transport arm as a unit relative to the frame, the optical edge detection sensor being a common sensor effecting edge detection of each wafer of more than one wafer simultaneously supported by the at least one end effector.

In accordance with one or more aspects of the present disclosure the optical edge detection sensor is fixedly mounted to the frame, and the optical edge detection sensor effects the edge detection of the wafer supported by the end effector coincident with wafer linear traverse through a field of view of the optical edge detection sensor.

In accordance with one or more aspects of the present disclosure the optical edge detection sensor is disposed so that a field of view of the optical edge detection sensor is directed at backside surface of the wafer supported by the end effector, and the background is over the wafer.

In accordance with one or more aspects of the present disclosure the optical edge detection sensor is disposed so that a field of view of the optical edge detection sensor is directed at frontside surface of the wafer supported by the end effector, and the background is beneath the wafer.

In accordance with one or more aspects of the present disclosure a contrast face disposed in the background, and arranged so as to optically blank the background viewed by the optical edge detection sensor.

In accordance with one or more aspects of the present disclosure the contrast face is gray scale or is dark colored so as to form image contrast formed by and between the wafer surface reflection and the optically blanked background, registered by the optical edge detection sensor that defines in relief the peripheral edge.

In accordance with one or more aspects of the present disclosure the contrast face is mounted to the transport arm so that the contrast face moves with the transport arm as a unit relative to the frame.

In accordance with one or more aspects of the present disclosure the contrast face is mounted to the transport arm so as to move with the transport arm as a unit relative to the frame, the contrast face forming a common background effecting edge detection of each wafer of more than one wafer simultaneously supported by the at least one end effector.

In accordance with one or more aspects of the present disclosure the contrast face is fixedly mounted to the frame, and the contrast face effects the edge detection of the wafer supported by the end effector coincident with wafer linear traverse past the contrast face.

In accordance with one or more aspects of the present disclosure the illumination source comprises a backlit foreground contrast face.

In accordance with one or more aspects of the present disclosure the illumination source comprises a foreground contrast face and a light projector.

In accordance with one or more aspects of the present disclosure the illumination source is mounted to the transport arm so that the illumination source moves with the transport arm as a unit relative to the frame.

In accordance with one or more aspects of the present disclosure the illumination source is mounted to the transport arm so as to move with the transport arm as a unit relative to the frame, the illumination source forming a common illumination effecting edge detection of each wafer of more than one wafer simultaneously supported by the at least one end effector.

In accordance with one or more aspects of the present disclosure the illumination source is fixedly mounted to the frame, and the illumination source effects the edge detection of the wafer supported by the end effector coincident with wafer linear traverse past the illumination source.

In accordance with one or more aspects of the present disclosure a method for detecting an edge of a wafer comprises:
  providing a transport arm movably mounted to a frame and having at least one end effector movably mounted to the transport arm so that the at least one end effector traverses linearly relative to the frame;
  registering and effecting, with an optical edge detection sensor coupled to the transport arm, edge detection of a wafer supported by the at least one end effector; and
  illuminating, with an illumination source connected to the frame, a contrast face reflected from a surface of the wafer, supported by the at least one end effector, which surface delineates a peripheral edge of the wafer, the contrast face being disposed with respect to the optical edge detection sensor so that the reflected contrast face directed from the surface at or towards the optical edge detection sensor optically blanks, at the peripheral edge of the wafer, background light reflection from the surface of the wafer viewed by the optical edge detection sensor coincident with linear traverse of the wafer supported by the at least one end effector;
  wherein the peripheral edge of the wafer is defined in relief in image contrast, formed by and between the reflected contrast face and a lighted background, registered by the optical edge detection sensor so as to effect edge detection coincident with linear traverse of the wafer supported by the at least one end effector.

In accordance with one or more aspects of the present disclosure the end effector linearly traverses with the transport arm as a unit in a first direction, relative to the frame.

In accordance with one or more aspects of the present disclosure the end effector traverses linearly, relative to the transport arm, in a second direction.

In accordance with one or more aspects of the present disclosure the optical edge detection sensor is configured so that the edge detection of each wafer is effected by and coincident with the traverse in the second direction of each end effector of the at least one end effector on the transport arm.

In accordance with one or more aspects of the present disclosure the optical edge detection sensor is mounted to the transport arm so that the optical edge detection sensor moves with the transport arm as a unit relative to the frame.

In accordance with one or more aspects of the present disclosure the optical edge detection sensor is mounted to the transport arm so as to move with the transport arm as a unit relative to the frame, the optical edge detection sensor being a common sensor effecting edge detection of each wafer of more than one wafer simultaneously supported by the at least one end effector.

In accordance with one or more aspects of the present disclosure the optical edge detection sensor is fixedly mounted to the frame, and the optical edge detection sensor effects the edge detection of the wafer supported by the end effector coincident with wafer linear traverse through a field of view of the optical edge detection sensor.

In accordance with one or more aspects of the present disclosure the optical edge detection sensor is disposed so that a field of view of the optical edge detection sensor is directed at backside surface of the wafer supported by the end effector, and the contrast face is beneath the wafer.

In accordance with one or more aspects of the present disclosure the optical edge detection sensor is disposed so that a field of view of the optical edge detection sensor is directed at frontside surface of the wafer supported by the end effector, and the contrast face is over the wafer.

In accordance with one or more aspects of the present disclosure a background contrast face, forming at least in part the lighted background, disposed on an opposite side of the wafer from the contrast face.

In accordance with one or more aspects of the present disclosure the contrast face is gray scale or is dark colored so as to form image contrast formed by and between the reflected contrast face and the lighted background, registered by the optical edge detection sensor that defines in relief the peripheral edge.

In accordance with one or more aspects of the present disclosure the contrast face is mounted to the transport arm so that the contrast face moves with the transport arm as a unit relative to the frame.

In accordance with one or more aspects of the present disclosure the contrast face is fixedly mounted to the frame, and the contrast face effects the edge detection of the wafer supported by the end effector coincident with wafer linear traverse past the contrast face.

In accordance with one or more aspects of the present disclosure the illumination source is configured to backlight the contrast face.

In accordance with one or more aspects of the present disclosure the illumination source is mounted to the transport arm so that the illumination source moves with the transport arm as a unit relative to the frame.

In accordance with one or more aspects of the present disclosure the illumination source is mounted to the transport arm so as to move with the transport arm as a unit relative to the frame, the illumination source forming a common illumination effecting edge detection of each wafer of more than one wafer simultaneously supported by the at least one end effector.

In accordance with one or more aspects of the present disclosure the illumination source is fixedly mounted to the frame, and the illumination source effects the edge detection of the wafer supported by the end effector coincident with wafer linear traverse past the illumination source.

In accordance with one or more aspects of the present disclosure a method for aligning a wafer is provided. The method comprises:
  providing a transport arm movably mounted to a frame and having at least one end effector movably mounted to the transport arm so that the at least one end effector traverses linearly relative to the frame;
  registering and effecting, with an optical edge detection sensor coupled to the transport arm, edge detection of a wafer supported by the at least one end effector with the wafer in a first position with respect to a predetermined reference location; and
  moving the wafer, at least in part with the transport arm, so as to effect a change in alignment of the wafer with respect to the predetermined reference location from the first position to a second position based on edge detection data from the optical edge detection sensor;
  wherein:
  the edge detection data is generated by illuminating, with an illumination source connected to the frame, a surface of the wafer, supported by the at least one end effector, which surface delineates a peripheral edge of the wafer, the illumination source being disposed with respect to the optical edge detection sensor so that the surface directs reflected surface illumination, from the illumination source, at or towards the optical edge detection sensor, and optically blanks, at the peripheral edge of the wafer, background reflection light of a background, viewed by the optical edge detection sensor coincident with linear traverse of the wafer supported by the at least one end effector; and
  the peripheral edge of the wafer is defined in relief in image contrast, formed by and between wafer surface reflection and the optically blanked background, registered by the optical edge detection sensor so as to effect edge detection coincident with linear traverse of the wafer supported by the at least one end effector.

In accordance with one or more aspects of the present disclosure the end effector linearly traverses with the transport arm as a unit in a first direction, relative to the frame.

In accordance with one or more aspects of the present disclosure the end effector traverses linearly, relative to the transport arm, in a second direction.

In accordance with one or more aspects of the present disclosure the edge detection of each wafer is effected by and coincident with the traverse in the second direction of each end effector of the at least one end effector on the transport arm.

In accordance with one or more aspects of the present disclosure the optical edge detection sensor is mounted to the transport arm so that the optical edge detection sensor moves with the transport arm as a unit relative to the frame.

In accordance with one or more aspects of the present disclosure the optical edge detection sensor is mounted to the transport arm so as to move with the transport arm as a unit relative to the frame, the optical edge detection sensor being a common sensor effecting edge detection of each wafer of more than one wafer simultaneously supported by the at least one end effector.

In accordance with one or more aspects of the present disclosure the optical edge detection sensor is fixedly mounted to the frame, and the optical edge detection sensor effects the edge detection of the wafer supported by the end effector coincident with wafer linear traverse through a field of view of the optical edge detection sensor.

In accordance with one or more aspects of the present disclosure the optical edge detection sensor is disposed so that a field of view of the optical edge detection sensor is directed at backside surface of the wafer supported by the end effector, and the background is over the wafer.

In accordance with one or more aspects of the present disclosure the optical edge detection sensor is disposed so that a field of view of the optical edge detection sensor is directed at frontside surface of the wafer supported by the end effector, and the background is beneath the wafer.

In accordance with one or more aspects of the present disclosure a contrast face disposed in the background, and arranged so as to optically blank the background viewed by the optical edge detection sensor.

In accordance with one or more aspects of the present disclosure the contrast face is gray scale or is dark colored so as to form image contrast formed by and between the wafer surface reflection and the optically blanked background, registered by the optical edge detection sensor that defines in relief the peripheral edge.

In accordance with one or more aspects of the present disclosure the contrast face is mounted to the transport arm so that the contrast face moves with the transport arm as a unit relative to the frame.

In accordance with one or more aspects of the present disclosure the contrast face is mounted to the transport arm so as to move with the transport arm as a unit relative to the frame, the contrast face forming a common background effecting edge detection of each wafer of more than one wafer simultaneously supported by the at least one end effector.

In accordance with one or more aspects of the present disclosure the contrast face is fixedly mounted to the frame, and the contrast face effects the edge detection of the wafer supported by the end effector coincident with wafer linear traverse past the contrast face.

In accordance with one or more aspects of the present disclosure the illumination source comprises a backlit foreground contrast face.

In accordance with one or more aspects of the present disclosure the illumination source comprises a foreground contrast face and a light projector.

In accordance with one or more aspects of the present disclosure the illumination source is mounted to the transport arm so that the illumination source moves with the transport arm as a unit relative to the frame.

In accordance with one or more aspects of the present disclosure the illumination source is mounted to the transport arm so as to move with the transport arm as a unit relative to the frame, the illumination source forming a common illumination effecting edge detection of each wafer of more than one wafer simultaneously supported by the at least one end effector.

In accordance with one or more aspects of the present disclosure the illumination source is fixedly mounted to the frame, and the illumination source effects the edge detection of the wafer supported by the end effector coincident with wafer linear traverse past the illumination source.

In accordance with one or more aspects of the present disclosure a method for aligning a wafer is provided. The method comprises:
  providing a transport arm movably mounted to a frame and having at least one end effector movably mounted to the transport arm so that the at least one end effector traverses linearly relative to the frame;
  registering and effecting, with an optical edge detection sensor coupled to the transport arm, edge detection of a wafer supported by the at least one end effector, wherein edge detection data from the optical edge detection sensor is determinative of wafer alignment data communicated to the transport arm; and
  illuminating, with an illumination source connected to the frame, a surface of the wafer, supported by the at least one end effector, which surface delineates a peripheral edge of the wafer, the illumination source being disposed with respect to the optical edge detection sensor so that the surface directs reflected surface illumination, from the illumination source, at or towards the optical edge detection sensor, and optically blanks, at the peripheral edge of the wafer, background reflection light of a background, viewed by the optical edge detection sensor coincident with linear traverse of the wafer supported by the at least one end effector;
  wherein the peripheral edge of the wafer is defined in relief in image contrast, formed by and between wafer surface reflection and the optically blanked background, registered by the optical edge detection sensor so as to effect edge detection coincident with linear traverse of the wafer supported by the at least one end effector.

In accordance with one or more aspects of the present disclosure the end effector linearly traverses with the transport arm as a unit in a first direction, relative to the frame.

In accordance with one or more aspects of the present disclosure the end effector traverses linearly, relative to the transport arm, in a second direction.

In accordance with one or more aspects of the present disclosure the edge detection of each wafer is effected by and coincident with the traverse in the second direction of each end effector of the at least one end effector on the transport arm.

In accordance with one or more aspects of the present disclosure the optical edge detection sensor is mounted to the transport arm so that the optical edge detection sensor moves with the transport arm as a unit relative to the frame.

In accordance with one or more aspects of the present disclosure the optical edge detection sensor is mounted to the transport arm so as to move with the transport arm as a unit relative to the frame, the optical edge detection sensor being a common sensor effecting edge detection of each wafer of more than one wafer simultaneously supported by the at least one end effector.

In accordance with one or more aspects of the present disclosure the optical edge detection sensor is fixedly mounted to the frame, and the optical edge detection sensor effects the edge detection of the wafer supported by the end effector coincident with wafer linear traverse through a field of view of the optical edge detection sensor.

In accordance with one or more aspects of the present disclosure the optical edge detection sensor is disposed so that a field of view of the optical edge detection sensor is directed at backside surface of the wafer supported by the end effector, and the background is over the wafer.

In accordance with one or more aspects of the present disclosure the optical edge detection sensor is disposed so that a field of view of the optical edge detection sensor is directed at frontside surface of the wafer supported by the end effector, and the background is beneath the wafer.

In accordance with one or more aspects of the present disclosure a contrast face disposed in the background, and arranged so as to optically blank the background viewed by the optical edge detection sensor.

In accordance with one or more aspects of the present disclosure the contrast face is gray scale or is dark colored so as to form image contrast formed by and between the wafer surface reflection and the optically blanked background, registered by the optical edge detection sensor that defines in relief the peripheral edge.

In accordance with one or more aspects of the present disclosure the contrast face is mounted to the transport arm so that the contrast face moves with the transport arm as a unit relative to the frame.

In accordance with one or more aspects of the present disclosure the contrast face is mounted to the transport arm so as to move with the transport arm as a unit relative to the frame, the contrast face forming a common background effecting edge detection of each wafer of more than one wafer simultaneously supported by the at least one end effector.

In accordance with one or more aspects of the present disclosure the contrast face is fixedly mounted to the frame, and the contrast face effects the edge detection of the wafer supported by the end effector coincident with wafer linear traverse past the contrast face.

In accordance with one or more aspects of the present disclosure the illumination source comprises a backlit foreground contrast face.

In accordance with one or more aspects of the present disclosure the illumination source comprises a foreground contrast face and a light projector.

In accordance with one or more aspects of the present disclosure the illumination source is mounted to the transport arm so that the illumination source moves with the transport arm as a unit relative to the frame.

In accordance with one or more aspects of the present disclosure the illumination source is mounted to the transport arm so as to move with the transport arm as a unit relative to the frame, the illumination source forming a common illumination effecting edge detection of each wafer of more than one wafer simultaneously supported by the at least one end effector.

In accordance with one or more aspects of the present disclosure the illumination source is fixedly mounted to the frame, and the illumination source effects the edge detection of the wafer supported by the end effector coincident with wafer linear traverse past the illumination source.

It should be understood that the foregoing description is only illustrative of the aspects of the present disclosure. Various alternatives and modifications can be devised by those skilled in the art without departing from the aspects of the present disclosure. Accordingly, the aspects of the present disclosure are intended to embrace all such alternatives, modifications and variances that fall within the scope of any claims appended hereto. Further, the mere fact that different features are recited in mutually different dependent or independent claims does not indicate that a combination of these features cannot be advantageously used, such a combination remaining within the scope of the aspects of the present disclosure.

What is claimed is:

1. A semiconductor wafer transport apparatus comprising:
a frame;
a transport arm movably mounted to the frame and having at least one end effector movably mounted to the transport arm so that the at least one end effector traverses relative to the frame;
an optical edge detection sensor, connected to the frame and communicably coupled to a static wafer aligner station on the frame, the optical edge detection sensor configured so as to register and effect edge detection of a wafer supported by the at least one end effector; and
an illumination source connected to the frame configured so as to illuminate a surface of the wafer, supported by the at least one end effector, which surface delineates a peripheral edge of the wafer, the illumination source being disposed with respect to the optical edge detection sensor so that the surface directs reflected surface illumination, from the illumination source, toward the optical edge detection sensor, and optically obscures, at the peripheral edge of the wafer, background reflection light of a background, viewed by the optical edge detection sensor coincident with traverse, to the static wafer aligner station, of the wafer supported by the at least one end effector;
wherein the peripheral edge of the wafer is defined in relief in image contrast, formed by and between wafer surface reflection and the optically obscured background, registered by the optical edge detection sensor so as to effect edge detection coincident with traverse of the wafer supported by the at least one end effector.

2. The semiconductor wafer transport apparatus of claim 1, whrein the at least one end effector traverses linearly relative to the frame.

3. The semiconductor wafer transport apparatus of claim 1, wherein the at least one end effector traverses an arcuate traverse relative to the frame.

4. The semiconductor wafer transport apparatus of claim 1, wherein the end effector traverses with the transport arm as a unit in a first direction, relative to the frame.

5. The semiconductor wafer transport apparatus of claim 4, wherein the end effector traverses, relative to the transport arm, in a second direction.

6. The semiconductor wafer transport apparatus of claim 5, wherein the optical edge detection sensor is configures so that the edge detection of each wafer is effected by and coincident with the traverse in the second direction of each end effector of the at least one end effector on the transort arm.

7. The semiconductor wafer transport apparatus of claim 1, wherein the optical edge detection sensor is mounted to the transport arm so that the optical edge detection sensor moves with the transport arm as a unit relative to the frame.

8. The semiconductor wafer transport apparatus of claim 1, wherein the optical edge detection sensor is mounted to the transport arm so as to move with the transport arm as a unit relative to the frame, the optical edge detection sensor being a common sensor effecting edge detection of each wafer of more than one wafer simultaneously supported by the at least one end effector.

9. The semiconductor wafer transport apparatus of claim 1, wherein the optical edge detection sensor is fixedly mounted to the frame, and the optical edge detection sensor effects the edge detection of the wafer supported by the end effector coincident with wafer traverse through a field of view of the optical edge detection sensor.

10. The semiconductor wafer transport apparatus of claim 1, wherein the optical edge detection sensor is disposed so that a field of view of the optical edge detection sensor is directed at backside surface of the wafer supported by the end effector, and the background is over the wafer.

11. The semiconductor wafer transport apparatus of claim 1, wherein the optical edge detection sensor is disposed so that a field of view of the optical edge detection sensor is directed at frontside surface of the wafer supported by the end effector, and the background is beneath the wafer.

12. The semiconductor wafer transport apparatus of claim 1, further comprising a contrast face disposed in the background, and arranged so as to optically obscure the background reflected light viewed by the optical edge detection sensor.

13. The semiconductor wafer transport apparatus of claim 12, wherein the contrast face is gray scale or is dark colored so as to form image contrast formed by and between the wafer surface reflection and the optically obscured background, registered by the optical edge detection sensor that defines in relief the peripheral edge.

14. The semiconductor wafer transport apparatus of claim 12, wherein the contrast face is mounted to the transport arm so that the contrast face moves with the transport arm as a unit relative to the frame.

15. The semiconductor wafer transport apparatus of claim 12, wherein the contrast face is mounted to the transport arm so as to move with the transport arm as a unit relative to the frame, the contrast face forming a common background effecting edge detection of each wafer of more than one wafer simultaneously supported by the at least one end effector.

16. The semiconductor wafer transport apparatus of claim 12, wherein the contrast face is fixedly mounted to the frame, and the contrast face effects the edge detection of the wafer supported by the end effector coincident with wafer traverse past the contrast face.

17. The semiconductor wafer transport apparatus of claim 1, wherein the illumination source comprises a backlit foreground contrast face.

18. The semiconductor wafer transport apparatus of claim 1, wherein the illumination source comprises a foreground contrast face and a light projector.

19. The semiconductor wafer transport apparatus of claim 1, wherein the illumination source is mounted to the transport arm so that the illumination source moves with the transport arm as a unit relative to the frame.

20. The semiconductor wafer transport apparatus of claim 1, wherein the illumination source is mounted to the transport arm so as to move with the transport arm as a until realtive to the frame, the illumination source forming a common illumination effecting edge detection of each wafer of more than one wafer simultaneously supported by the at least one end effector.

21. The semiconductor wafer transport apparatus of claim 1, wherein the illumination source is fixedly mounted to the frame, and the illumination source effects the edge detection of the wafer supported by the end effector coincident with wafer traverse past the illumination source.

22. A semiconductor wafer transport apparatus comprising:
a frame;
a transport arm movably mounted to the frame and having at least one end effector movably mounted to the transport arm so that the at least one end effector traverses relative to the frame;
an optical edge detection sensor, connected to the frame and communicably coupled to a static wafer aligner station on the frame, the optical edge detection sensor configured so as to register and effect edge detection of a wafer supported by the at least one end effector; and
an illumination source connected to the frame configured so as to illuminate a contrast face reflected from a surface of the wafer, supported by the at least one end effector, which surface delineates a peripheral edge of the wafer, the contrast face being disposed with respect to the optical edge detection sensor so that the reflected contrast face directed from the surface towards the optical edge detection sensor optically obscures, at the peripheral edge of the wafer, background light reflection from the surface of the wafer viewd by the optical edge detection sensor coincident with traverse to the static wafer aligner station, of the wafer supported by the at least one end effector;
wherein the peripheral edge of the wafer is defined in relief in image contrast, formed by and between the reflected contrast face and a lighted background, registered by the optical edge detection sensor so as to effect edge detection coincident with traverse of the wafer supported by the at least one end effector.

23. The semiconductor wafer transport apparatus of claim 22, wherein the at least one end effector traverses linearly relative to the frame.

24. The semiconductor wafer transport apparatus of claim 22, wherein the at least one end effector traverses an arcuate traverse relative to the frame.

25. The semiconductor wafer transport apparatus of claim 22, wherein the end effector traverses with the transport arm as a unit in a first direction, relative to the frame.

26. The semiconductor wafer transport apparatus of claim 25, wherein the end effector traverses, relative to the transport arm, in a second direction.

27. The semiconductor wafer transport apparatus of claim 26, wherein the optical edge detection sensor is configures so that the edge detection of each wafer is effected by and coincident with the traverse in the second direction of each end effector of the at least one end effector on the transport arm.

28. The semiconductor wafer transport apparatus of claim 22, wherein the optical edge detection sensor is mounted to the transport arm so that the optical edge detection sensor moves with the transport arm as a unit relative to the frame.

29. The semiconductor wafer transport apparatus of claim 22, wherein the optical edge detection sensor is mounted to the transport arm so as to move with the transport arm as a unit relative to the frame, the optical edge detection sensor being a common sensor effecting edge detection of each wafer of more than one wafer simultaneously supported by the at least one end effector.

30. The semiconductor wafer transport apparatus of claim 22, wherein the optical edge detection sensor is fixedly mounted to the frame, and the optical edge detection sensor effects the edge detection of the wafer supported by the end effector coincident with wafer traverse through a field of view of the optical edge detection sensor.

31. The semiconductor wafer transport apparatus of claim 22, wherein the optical edge detection sensor is disposed so that a field of view of the optical edge detection sensor is directed at backside surface of the wafer supported by the end effector, and the contrast face is beneath the wafer.

32. The semiconductor wafer transport apparatus of claim 22, wherein the optical edge detection sensor is disposed so that a field of view of the optical edge detection sensor is directed at frontside surface of the wafer supported by the end effector, and the contrast face is over the wafer.

33. The semiconductor wafer transport apparatus of claim 22, further comprising a background contrast face, forming at least in part the lighted background, disposed on an opposie side of the wafer from the contrast face.

34. The semiconductor wafer transport apparatus of claim 33, wherein the contrast face is gray scale or is dark colored so as to form image contrast formed by and between the reflected contrast face and the lighted background, registered by the optical edge detection sensor that defined in relief the peripheral edge.

35. The semiconductor wafer transport apparatus of claim 22, wherein the contrast face is mounted to the transport arm so that the contrast face moves with the transport arm as as unit relative to the frame.

36. The semiconductor wafer transport apparatus of claim 22, wherein the contrast face is fixedly mounted to the frame, and the contrast face effects the edge detection of the wafer supported by the end effector coincident with wafer traverse past the contrast face.

37. The semiconductor wafer transport apparatus of claim 22, wherein the illumination source is configured to backlight the contract face.

38. The semiconductor wafer transport apparatus of claim 22, wherein the illumination source is mounted to the transport arm so that the illumination source moves with the transport arm as a unit relative to the frame.

39. The semiconductor wafer transport apparatus of claim 22, wherein the illumination source is mounted to the transport arm so as to move with the transport arm as a unti relative to the frame, the illumination source forming a common illumination effecting edge detection of each wafer of more than one wafer simultaneously supported by the at least one end effector.

40. The semiconductor wafer transport apparatus of claim 22, wherein the illumination source is fixedly mounted to the frame, and the illumination source effects the edge detection of the wafer supported by the end effector coincident with wafer traverse past the illumination source.

\* \* \* \* \*